United States Patent
Lue

(10) Patent No.: US 9,391,084 B2
(45) Date of Patent: Jul. 12, 2016

(54) BANDGAP-ENGINEERED MEMORY WITH MULTIPLE CHARGE TRAPPING LAYERS STORING CHARGE

(71) Applicant: Macronix International Co., Ltd., Hsinchu (TW)

(72) Inventor: Hang-Ting Lue, Hsinchu (TW)

(73) Assignee: MACRONIX INTERNATIONAL CO., LTD., Hsinchu (TW)

( * ) Notice: Subject to any disclaimer, the term of this patent is extended or adjusted under 35 U.S.C. 154(b) by 75 days.

(21) Appl. No.: 14/309,622

(22) Filed: Jun. 19, 2014

(65) Prior Publication Data

US 2015/0371998 A1    Dec. 24, 2015

(51) Int. Cl.
| | |
|---|---|
| G11C 16/04 | (2006.01) |
| H01L 27/115 | (2006.01) |
| H01L 29/792 | (2006.01) |
| G11C 16/10 | (2006.01) |

(52) U.S. Cl.
CPC ........ *H01L 27/11563* (2013.01); *H01L 29/792* (2013.01); *G11C 16/10* (2013.01)

(58) Field of Classification Search
CPC ....... G11C 16/10; G11C 16/12; H01L 27/115
USPC ........... 365/185.28, 185.29, 185.26; 257/324, 257/E21.18, E29.309
See application file for complete search history.

(56) References Cited

U.S. PATENT DOCUMENTS

| | | |
|---|---|---|
| 5,286,994 A | 2/1994 | Ozawa et al. |
| 5,844,270 A | 12/1998 | Kim et al. |
| 5,981,404 A | 11/1999 | Sheng et al. |
| 6,040,995 A | 3/2000 | Reisinger et al. |
| 6,137,718 A | 10/2000 | Reisinger |
| 6,445,030 B1 | 9/2002 | Wu et al. |
| 6,469,343 B1 | 10/2002 | Miura et al. |
| 6,839,278 B1 | 1/2005 | Lee et al. |
| 6,885,060 B2 | 4/2005 | Nomoto et al. |

(Continued)

FOREIGN PATENT DOCUMENTS

| | | |
|---|---|---|
| JP | 582795 | 4/1993 |
| JP | 10-247692 A | 9/1998 |

(Continued)

OTHER PUBLICATIONS

G Pacchioni, et al., Physical Review B, vol. 64, pp. 155201-1-155201-7, "Electronic Structure of the Paramagnetic Boron Oxygen Hole Center in B-DopedSiO.sub.2", 2001.

(Continued)

*Primary Examiner* — Connie Yoha
(74) *Attorney, Agent, or Firm* — Haynes Beffel & Wolfeld LLP

(57) ABSTRACT

A memory cell includes a gate, a channel material having a channel surface and a channel valence band edge, and a dielectric stack between the gate and the channel surface. The dielectric stack comprises a multi-layer tunneling structure on the channel surface, a first charge storage nitride layer on the multi-layer tunneling structure, a first blocking oxide layer on the first charge storage nitride layer, a second charge storage nitride layer on the first blocking dielectric layer, and a second blocking oxide layer on the second charge storage nitride layer. The multi-layer tunneling structure includes a first tunneling oxide layer, a first tunneling nitride layer on the first tunneling oxide layer, and a second tunneling oxide layer on the first tunneling nitride layer.

20 Claims, 58 Drawing Sheets

(56) References Cited

U.S. PATENT DOCUMENTS

| | | | |
|---|---|---|---|
| 6,912,163 B2 | 6/2005 | Zheng et al. | |
| 7,075,828 B2 | 7/2006 | Lue et al. | |
| 7,164,603 B2 | 1/2007 | Shih et al. | |
| 7,184,316 B2 | 2/2007 | Cho et al. | |
| 7,310,267 B2 | 12/2007 | Youn | |
| 7,592,666 B2 | 9/2009 | Noguchi et al. | |
| 7,675,783 B2 | 3/2010 | Park et al. | |
| 7,903,469 B2 | 3/2011 | Iwai et al. | |
| 7,965,555 B2 | 6/2011 | Namiki et al. | |
| 7,995,388 B1 | 8/2011 | Winter et al. | |
| 8,149,624 B1 | 4/2012 | Hung et al. | |
| 8,169,835 B2 | 5/2012 | Liao et al. | |
| 8,526,235 B2 | 9/2013 | Hung et al. | |
| 2003/0042558 A1 | 3/2003 | Noguchi et al. | |
| 2003/0232507 A1 | 12/2003 | Chen | |
| 2006/0198189 A1 | 9/2006 | Lue et al. | |
| 2006/0261401 A1 | 11/2006 | Bhattacharyya | |
| 2006/0281260 A1 | 12/2006 | Lue | |
| 2007/0268753 A1 | 11/2007 | Lue et al. | |
| 2009/0050953 A1* | 2/2009 | Wang | H01L 21/28282 257/324 |
| 2009/0059676 A1 | 3/2009 | Lai et al. | |
| 2009/0273018 A1* | 11/2009 | Cho | H01L 21/28282 257/324 |
| 2013/0175599 A1* | 7/2013 | Yang | H01L 22/14 257/324 |
| 2014/0284696 A1* | 9/2014 | Levy | C23C 16/0272 257/324 |

FOREIGN PATENT DOCUMENTS

| | | |
|---|---|---|
| JP | 11008325 | 1/1999 |
| JP | 1140682 | 2/1999 |
| JP | 2002009181 A | 1/2002 |
| JP | 2003078043 A | 3/2003 |

OTHER PUBLICATIONS

Guo, Xin, "Tunneling Leakage Current in Oxynitride: Dependence on Oxygen/Nitrogen Content," IEEE Electron Device Lett. vol. 19, No. 6, Jun. 1998, 3 pages.

Lue, Hang-Ting et al., "Understanding barrier engineered charge-trapping NAND flash devices with and without high-K dielectric," 2009 IEEE International Reliability Physics Symposium, Apr. 26-30, 2009, pp. 874-882.

Lue, Hang-Ting, et al., "A Transient Analysis Method to Characterize the Trap Vertical Location in Nitride-Trapping Devices," IEEE Electron Device Lett. vol. 25, No. 12, Dec. 2004, 3 pages.

Lue, Hang-Ting, et al., "BE-SONOS: A Bandgap Engineered SONOS with Excellent Performance and Reliability," IEEE IEDM Technical Digest Dec. 5-7, 2005, 4 pages.

Mirsch, S, et al., "Properties of Silicon Nitride and Silicon Oxynitride Films Prepared by Reactive Sputtering," phys. stat sol. (a) 26, 579-584, Sep. 1974.

Shin, Yoocheol et al., "A Novel NAND-type MONOS Memory using 63nm Process Technology for Multi-Gigabit Flash EEPROMs," IEEE Dec. 5, 2005, 4 pages.

Shin, Yoocheol, et al., "High Reliable SONOS-type NAND Flash Memory Cell with Al2O3 for Top Oxide," IEEE IEDM Feb. 16-20, 2003, 2 pages.

Wang, Szu-Wang, et al., "Reliability and Processing Effects of Bandgap Engineered SONOS (BE-SONOS) Flash Memory," 2007 IEEE 45th Annual Physics Symp, Apr. 15-19, 2007, 6 pages.

* cited by examiner

BANDGAP-ENGINEERED MEMORY WITH MULTIPLE CHARGE TRAPPING LAYERS STORING CHARGE

BACKGROUND

1. Field

The present technology relates to flash memory technology, and more particularly to charge trapping memory technology adaptable for high speed erase and program operations that is less susceptible to erase saturation despite high magnitude gate voltages.

2. Description of Related Art

Charge trapping memory is a class of non-volatile integrated circuit memory technology which stores data by employing dielectric charge trapping material to store charge. According to the early designs referred to as SONOS devices, the source, drain and channel are formed in a silicon channel material (S), the tunnel dielectric layer is formed of silicon oxide (O), the charge storage layer is formed of silicon nitride (N), the blocking dielectric layer is formed a silicon oxide (O), and the gate comprises polysilicon (S).

FIG. 1 shows a charge trapping memory cell which consists of a field effect transistor (FET) structure having a source 11 and drain 12 separated by a channel 10, and a gate 18 separated from the channel by a stack of dielectric material including a multi-layer tunnel dielectric structure 13-15, the charge storage layer 16, and a blocking dielectric layer 17.

The SONOS device is programmed by electron tunneling using one of a number of well-known biasing technologies, and erased by hole tunneling or electron de-trapping. In order to achieve practical operational speeds for the erase operation, the tunneling dielectric layer must be quite thin (less than 30 Å). However at that thickness, the endurance and charge retention characteristics of the memory cell are poor relative to traditional floating gate technology. Also, with relatively thick tunneling dielectric layers, the electric field required for the erase operation also cause electron injection from the gate through the blocking dielectric layer. Erase generally requires a high electric field magnitude of greater than about 15 MV/cm. This electron injection causes an erase saturation condition in which the charge level in the charge trapping device converges on an equilibrium level. See, U.S. Pat. No. 7,075,828, entitled "Operation Scheme with Charge Balancing Erase for Charge Trapping Non-Volatile Memory", invented by Lue et al.

On one hand, technology has been investigated to improve the performance of the tunneling dielectric layer for erase at lower electric fields. In FIG. 1, the tunneling dielectric layer includes the 3 layer bandgap engineered structure 13-15 including layers of silicon oxide, silicon nitride, and silicon oxide.

FIG. 3 is a graph of flat band voltage versus erase time for the memory cell of FIG. 1. The BE-SONOS memory cell has a p polysilicon gate. Simulation of an erase operation with a −14 V gate voltage results in curve 310. Experimental data from an erase operation with a −14 V gate voltage results in plot points 311. Simulation of an erase operation with a −15 V gate voltage results in curve 320. Experimental data from an erase operation with a −15 V gate voltage results in plot points 321. Simulation of an erase operation with a −16 V gate voltage results in curve 330. Experimental data from an erase operation with a −16 V gate voltage results in plot points 331. Simulation of an erase operation with a −17 V gate voltage results in curve 340. Experimental data from an erase operation with a −17 V gate voltage results in plot points 341. Simulation of an erase operation with a −18 V gate voltage results in curve 350. Experimental data from an erase operation with a −18 V gate voltage results in plot points 351.

The curves and plot points for the lower magnitude gate voltages show an overly slow erase. The curves and plot points for the higher magnitude gate voltages are faster, but undergo erase saturation within 1 second or less. As more electrons are injected and stored in the first trapping layer (N2), the top oxide (O3) has a large electric field that induces a high gate injection.

On the other hand, technology has been investigated to improve the ability of the blocking dielectric layer to reduce electron injection from the gate for the high electric fields needed for erase. Prior art technologies have emphasized the advantages of high-K dielectrics like aluminum oxide. The higher dielectric constant can improve performance by enhancing the program and erase speed, improving the memory window in threshold voltage for the cells, and reducing the operating voltage during program and erase by reducing the effective oxide thickness EOT. However, it can be difficult to manufacture high-K materials like aluminum oxide with high quality. Therefore, the use of high-K materials for the blocking dielectric comes with the trade-off of lower reliability and lower data retention. For example, high-K materials easily generate shallow traps (or dipole relaxation) that causes a fast initial charge loss, leading to threshold voltage offsets in program verify values.

In FIG. 2, the blocking dielectric includes a high-K dielectric layer 17B and a silicon oxide layer 17A. FIG. 4 is a graph of flat band voltage versus erase time for a variation of the memory cell of FIG. 2 omitting silicon oxide layer 17A. In the curves and plot points, an erase operation is performed with a gate voltage of −18 V with N2 charge storage nitride layer 16 and high-K blocking dielectric layer 17B—having respective thicknesses 70 Å and 150 Å. The various curves and plot points are shown for different combinations of O1/N1/O2—oxide tunneling layer 13, nitride tunneling layer 14, oxide tunneling layer 15. An erase operation with O1/N1/O2 of 15 Å/20 Å/30 Å results in simulated curve 410 and experimental data plot points 411. An erase operation with O1/N1/O2 of 18 Å/20 Å/30 Å results in simulated curve 420 and experimental data plot points 421. An erase operation with O1/N1/O2 of 20 Å/20 Å/30 Å results in simulated curve 430 and experimental data plot points 431. Again, the curves and plot points for the lower magnitude gate voltages show an overly slow erase. Again, the curves and plot points for the higher magnitude gate voltages are faster, but undergo erase saturation within 1 second or less.

FIG. 5 is a graph of flat band voltage versus erase time for the memory cell of FIG. 2. In the curves and plot points, an erase operation is performed with a gate voltage of −15 V with O1/N1/O2/N2—oxide tunneling layer 13, nitride tunneling layer 14, oxide tunneling layer 15, charge storage nitride layer 16—having respective thicknesses 13 Å, 20 Å, 25 Å, and 50 Å. The various curves and plot points are shown for different combinations of O3 oxide blocking layer 17A, and high-K blocking dielectric layer 17B. An erase operation with O3/Al$_2$O$_3$ of 40 Å/60 Å results in simulated curve 510 and experimental data plot points 511 having respective thicknesses 70 Å and 150 Å. An erase operation with O3/Al$_2$O$_3$ of 50 Å/60 Å results in simulated curve 520 and experimental data plot points 521. Again, the curves and plot points for the lower magnitude gate voltages show an overly slow erase.

The high-K material such as Al$_2$O$_3$ or HfO$_2$ thin films on top of O3 can help to reduce the E field of top dielectric, since higher-K results in smaller electric field in O3, which in turn reduces the erase saturation. However, the introduction of high-K material can result in significant reliability degradation such as worse retention, and vulnerability to some fast initial retention drift. For example, high-K materials have relaxation effects of delays in the dielectric constant, varying from the linear steady state dielectric constant.

An alternative to high-K material to overcome erase saturation is to introduce a curvature into the memory cell. For example, a nanowire cell has a central body; concentric rings with increasing diameters including a tunnel oxide ring, a silicon nitride ring, and a blocking oxide ring; and a surrounding gate. However, a sufficiently small curvature to enhance the electric field tends to cause program and read disturb effects.

BE-SONOS technology has been proven to provide excellent performance, overcoming many of the erase speed, endurance and charge retention issues of prior art SONOS type memory. However, the problem of the erase saturation continues to limit operational parameters of the device. Furthermore, as the device sizes shrink, it is expected that erase saturation problems will intensify.

Accordingly, is desirable to provide a new memory technology which is readily manufactured with high quality, and overcomes the erase saturation issues of prior art technologies.

SUMMARY

One aspect of the technology is a charge trapping memory comprising an array of memory cells. Respective memory cells in the array include a gate, a channel material having a channel surface, a dielectric stack between the gate and the channel surface, and a control circuit.

The dielectric stack comprises a multi-layer tunneling structure on the channel surface, a first charge storage nitride layer on the multi-layer tunneling structure, a first blocking oxide layer on the first charge storage nitride layer, a second charge storage nitride layer on the first blocking dielectric layer, and a second blocking oxide layer on the second charge storage nitride layer.

The multi-layer tunneling structure includes a first tunneling oxide layer, a first tunneling nitride layer on the first tunneling oxide layer, and a second tunneling oxide layer on the first tunneling nitride layer.

The control circuit applies a selected one of a plurality of bias arrangements, including a program bias arrangement and an erase bias arrangement. The program bias arrangement programs data by moving electrons from the channel surface, through the multi-layer tunneling structure including the first tunneling nitride layer, to the first charge storage nitride layer. The erase bias arrangement erases data by moving holes from the channel surface to the first charge storage nitride layer, and using stored electrons in the second charge storage nitride layer to block additional electrons from moving into the first charge storage nitride layer.

In another aspect of the technology, the multi-layer tunneling structure includes at least a first tunneling dielectric layer having a tunneling valence band edge.

The control circuit applies a selected one of a plurality of bias arrangements. In the erase bias arrangement at least part of the tunneling valence band edge of the first tunneling dielectric layer has a larger band energy than the channel valence band edge at the channel surface. Without bias applied to the memory, the tunneling valence band edge of the first tunneling dielectric layer has a lower band energy than the channel valence band edge at the channel surface.

Yet another aspect of the technology is a memory comprising an array of memory cells. Respective memory cells in the array include a gate, a channel material having a channel surface, and a dielectric stack between the gate and the channel surface. The dielectric stack comprises a multi-layer tunneling structure on the channel surface including at least a first tunneling dielectric layer having a tunneling valence band edge, a first charge storage dielectric layer on the multi-layer tunneling structure, a first blocking dielectric layer on the first charge storage dielectric layer, a second charge storage dielectric layer on the first blocking dielectric layer, and a second blocking dielectric layer on the second charge storage dielectric layer.

Yet another aspect of the technology is a method of operating memory, comprising:

applying a program bias arrangement that programs data by moving electrons from a channel surface of a channel material of a memory cell through a first tunneling nitride of the memory cell to a first charge storage nitride layer of the memory cell; and applying an erase bias arrangement that erases data by moving holes from the channel surface of the channel material of the memory cell through the first tunneling nitride of the memory cell to the first charge storage nitride layer of the memory cell, and that increases an electron density in a second charge storage nitride layer of the memory cell to block additional electrons from moving into the first charge storage nitride layer.

In one embodiment of the technology, the erase bias arrangement applied by the control circuit increases electron density in the second charge storage nitride layer.

In one embodiment of the technology, the memory does not undergo erase saturation in response to the control circuit applying the erase bias arrangement with a gate voltage in a range between 20 to 24 volts in magnitude to the memory with programmed data.

In various embodiments of the technology, the first tunneling nitride layer has a thickness of 20 angstroms or less, the second charge storage nitride layer has a thickness of at least 35 angstroms, and the first charge storage nitride layer has a thickness greater than the second charge storage nitride layer.

In various embodiments of the technology, the gate includes polysilicon, such as polyslicon doped n or polyslicon doped p.

Other aspects and advantages of the present technology can be seen on review of the drawings, the detailed description in the claims which follow.

DETAILED DESCRIPTION

A detailed description of embodiments of the present technology is provided with reference to the Figures.

Figure 6:
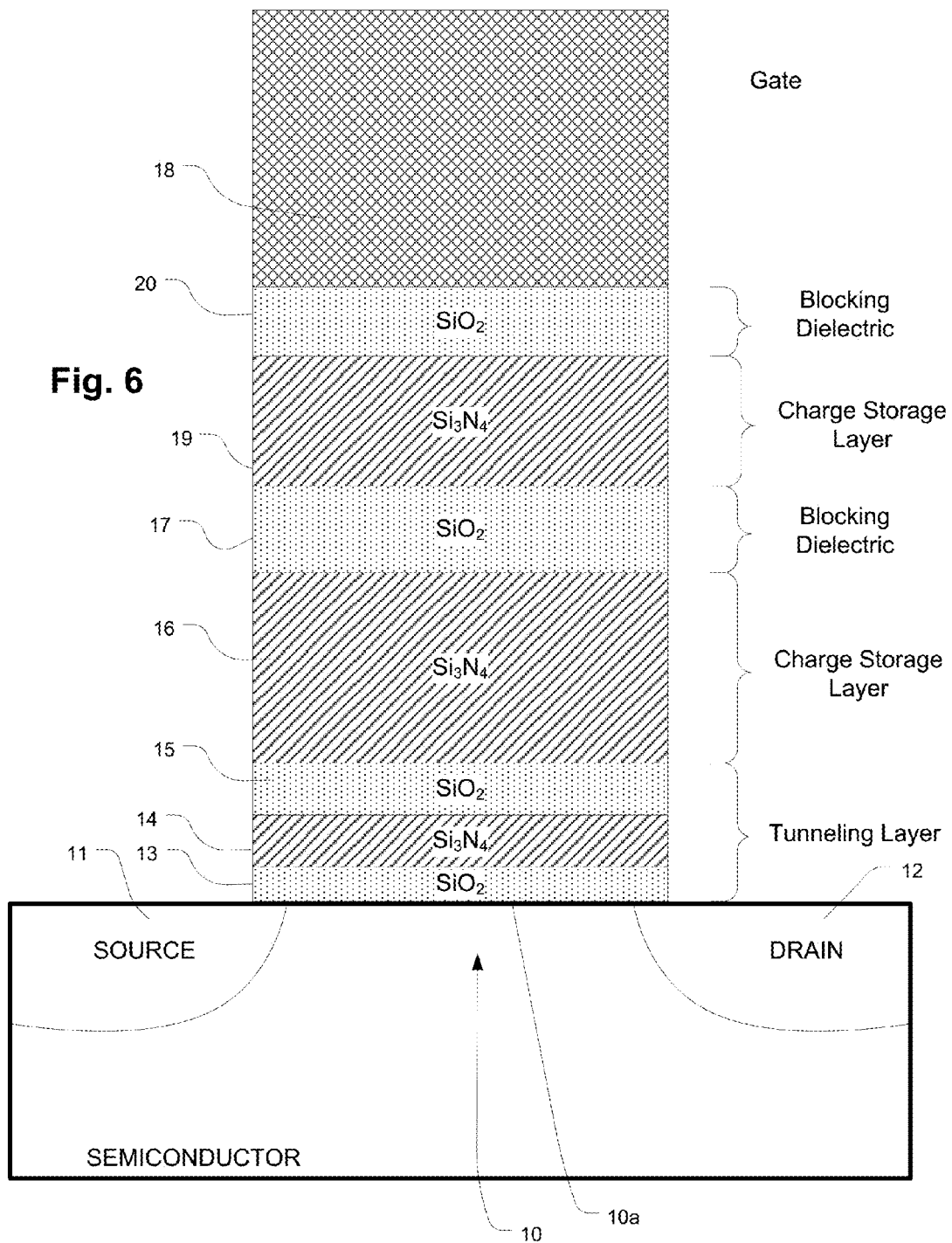
FIG. 6 is a simplified diagram of a BE-SONOS memory cell modified to include multiple nitride layers storing charge as well as the nitride layer in the multi-layer tunneling structure.

FIG. 6 is a simplified diagram of a BE-SONOS memory cell modified to include multiple nitride layers storing charge as well as the nitride layer in the multi-layer tunneling structure.

The memory cell includes a channel 10 in a channel material, and a source 11 and a drain 12 adjacent to the channel 10. A gate 18 in this embodiment comprises p polysilicon. N polysilicon may also be used. Other embodiments employ metals, metal compounds or combinations of metals and metal compounds for the gate 18, such as platinum, tantalum nitride, metal silicides, aluminum or other metal or metal compound gate materials. Such materials are typically deposited using sputtering and physical vapor deposition technologies, and can be patterned using reactive ion etching.

The dielectric tunneling layer comprises a composite of materials, includes multiple layers, including a first tunneling layer 13 of silicon oxide, a tunneling layer 14 of silicon nitride, and a second tunneling layer 15 of silicon oxide.

The first tunneling layer 13 of silicon dioxide on the surface 10a of the channel 10 is formed for example using in-situ steam generation ISSG with optional nitridation by either a post deposition NO anneal or by addition of NO to the ambient during deposition. The thickness of the first layer 13 of silicon dioxide is less than 20 Å, and preferably 7-15 Å. The first tunneling layer 13 can be engineered with alternatives such as nitrided oxide for improved endurance, and/or fluorine treatments for improved interface state quality.

The tunneling layer of silicon nitride 14, also referred to as a tunneling nitride layer, of silicon nitride lies on the first layer 13 of silicon oxide formed for example using low-pressure chemical vapor deposition LPCVD, using for example dichlorosilane DCS and $NH_3$ precursors at 680 degrees C. In alternative processes, the tunneling nitride layer comprises silicon oxynitride, made using a similar process with an $N_2O$ precursor. The thickness of the layer 14 of silicon nitride is less than 30 Å, and preferably 10-30 Å, including for example 20 Å. Because of its thinness, layer 14 is poor at storing charge.

Layer 14 provides a low-hole barrier height to facilitate hole injection for –FN erasing. However, layer 14 has a low trapping efficiency. Various materials for layer 14, along with their valence band offsets with silicon are: $SiO_2$ 4.4 eV, $Si_3N_4$ 1.8 eV, $Ta_2O_5$ 3.0 eV, $BaTiO_3$ 2.3 eV, $BaZrO_3$ 3.4 eV, $ZrO_2$ 3.3 eV, $HfO_2$ 3.4 eV, $Al_2O_3$ 4.9 eV, $Y_2O_3$ 3.6 eV, $ZrSiO_4$ 3.4 eV. $Si_3N_4$ has the lowest hole barrier height with 1.8 eV, although other materials are possible.

The second tunneling layer 15 of silicon dioxide lies on the tunneling layer 14 of silicon nitride and is formed for example using LPCVD high temperature oxide HTO deposition. The thickness of the second tunneling layer 15 of silicon dioxide is less than 45 Å, and preferably 15-45 Å, for example 30 Å. The second tunneling layer 15 provides sufficient barrier thickness to block charge loss for improved charge retention. The second tunneling layer 15 blocks direct tunneling leakage. Other low leakage oxides such as $Al_2O_3$ are possible.

A first charge storage layer 16 in this embodiment comprises silicon nitride having a thickness greater than 45 Å, and preferably 45-80 Å, including for example about 55 Å in this embodiment formed for example using LPCVD. Other charge trapping materials and structures may be employed, including for example silicon oxynitride ($Si_xO_yN_z$), silicon-rich nitride, silicon-rich oxide, trapping layers including embedded nano-particles and so on. A variety of charge trapping materials is described in the above referenced U.S. Patent Application Publication No. 2006/0261401 A1, entitled "Novel Low Power Non-Volatile Memory and Gate Stack", by Bhattacharyya, published 23 Nov. 2006. High charge trapping efficiency alternatives are oxynitride, silicon-rich nitride, embedded nanoparticles, and $HfO_2$.

A first blocking layer 17 of silicon dioxide lies on the first charge storage layer 16 and is formed for example using LPCVD high temperature oxide HTO deposition. The thickness of the first blocking layer 17 of silicon dioxide is less than 70 Å, including for example a range of 35-70 Å, including for example 50 Å. The first blocking layer 17 provides sufficient barrier thickness to block charge mixing and charge transport between the charge storage layers 16 and 19. Other low leakage oxides such as $Al_2O_3$ are possible.

A second charge storage layer 19 in this embodiment comprises silicon nitride having a thickness greater than 30 Å, including for example a range of 30-60 Å, including for example about 40 Å in this embodiment formed for example using LPCVD. Other embodiments are similar to the first charge trapping layer. The second charge storage layer 19 traps electrons during –FN erasing to stop gate electron injection, allowing continuous erase of first charge storage layer 16 by channel hole injection. High charge trapping efficiency alternatives are oxynitride, silicon-rich nitride, embedded nanoparticles, and $HfO_2$.

A second blocking layer 20 of silicon dioxide lies on the second charge storage layer 19 and is formed for example using LPCVD high temperature oxide HTO deposition. The thickness of the second blocking layer 20 of silicon dioxide is less than 60 Å, including for example a range of 30-60 Å, including for example 35 Å.

The gate 18 comprises a material selected to provide sufficient electron barrier height for the blocking dielectric layer. Materials that may be used for the gate 18 include N poly silicon, P poly silicon, Ti, TiN, Ta, TaN, Ru, Pt, Ir, $RuO_2$, $IrO_2$, W, WN, and others. P polysilicon has the advantage of ready manufacturability and process integration, and because the work function of P polysilicon is higher than that of N polysilicon.

In one embodiment, only two nitride layers exist in addition to the tunneling nitride layer. In FIG. 6, the only two nitride layers in addition to the tunneling nitride layer are the two charge storage layers.

Figure 7:
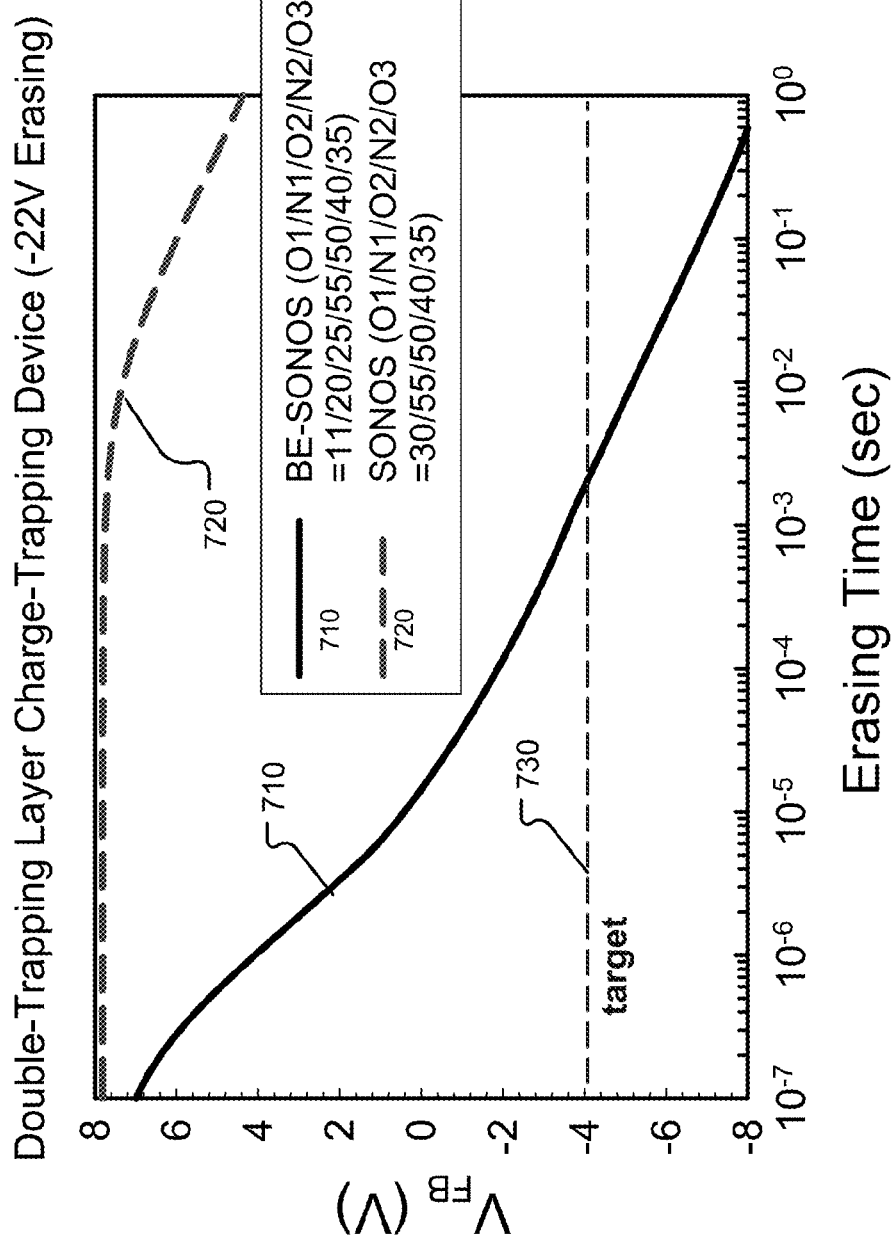
FIG. 7 is a graph of flat band voltage versus erase time for the memory cell of FIG. 6, and for a memory cell with multiple nitride layers storing charge and without a bandgap-engineered tunneling layer.

FIG. 7 is a graph of flat band voltage versus erase time for the memory cell of FIG. 6, and for a memory cell with multiple nitride layers storing charge and without a bandgap-engineered tunneling layer.

An erase operation with a −22 V gate voltage on a BE-SONOS memory cell modified to include multiple charge storage nitride layers, with layer thicknesses O1/N1/O2/N2/O3/N3/O4 of 11 Å/20 Å/25 Å/55 Å/50 Å/40 Å/35 Å results in simulated curve 710. An erase operation with a −22 V gate voltage on a SONOS memory cell modified to include multiple charge storage nitride layers, without a bandgap-engineered tunneling layer, and with layer thicknesses O1/N1/O2/N2/O3 of 30 Å/55 Å/50 Å/40 Å/35 Å results in simulated curve 720. Curve 710 reaches the target voltage 730 of −4 V in about 2 milliseconds. However, curve 720 even after 1 second has reaches only about 4 V. The differences between the curves show that, an erase operation is slow without a multi-layer tunneling structure.

Figure 8:
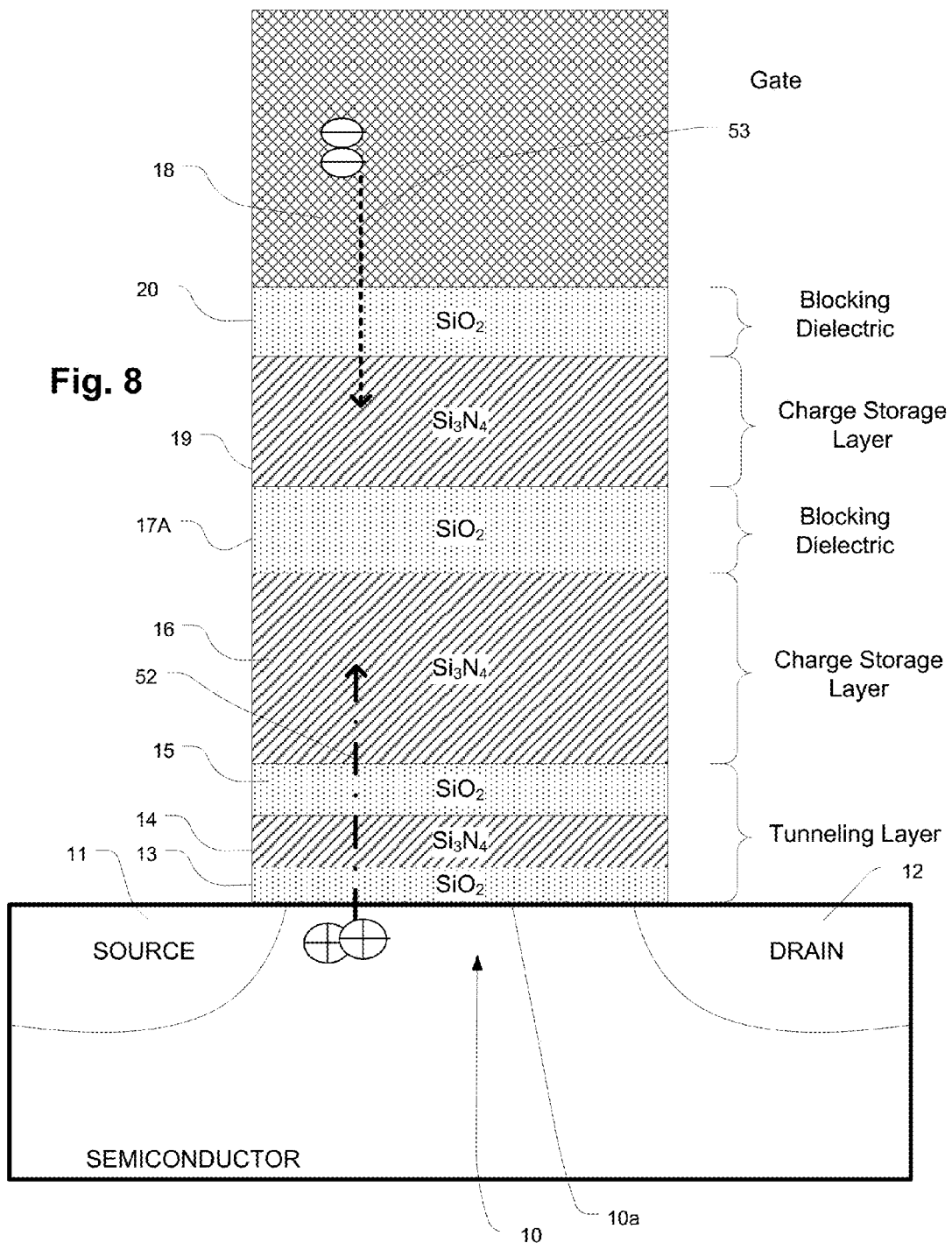
FIG. 8 is a simplified diagram of the modified BE-SONOS memory cell of FIG. 6, showing an erase operation to reduce charge stored in the first nitride layer storing charge, with hole tunneling from the channel into the first nitride layer storing charge, and electron injection from the gate into the second nitride layer storing charge.

FIG. 8 is a simplified diagram of the modified BE-SONOS memory cell of FIG. 6, showing an erase operation to reduce charge stored in the first nitride layer storing charge, with hole tunneling from the channel into the first nitride layer storing charge, and electron injection from the gate into the second nitride layer storing charge.

Electron injection occurs from the gate 18 through the upper blocking dielectric 20 and into upper charge storage layer 19. Hole tunneling occurs from the channel material 10 through tunneling layer 13-15 and into lower charge storage layer 16.

Figure 9:
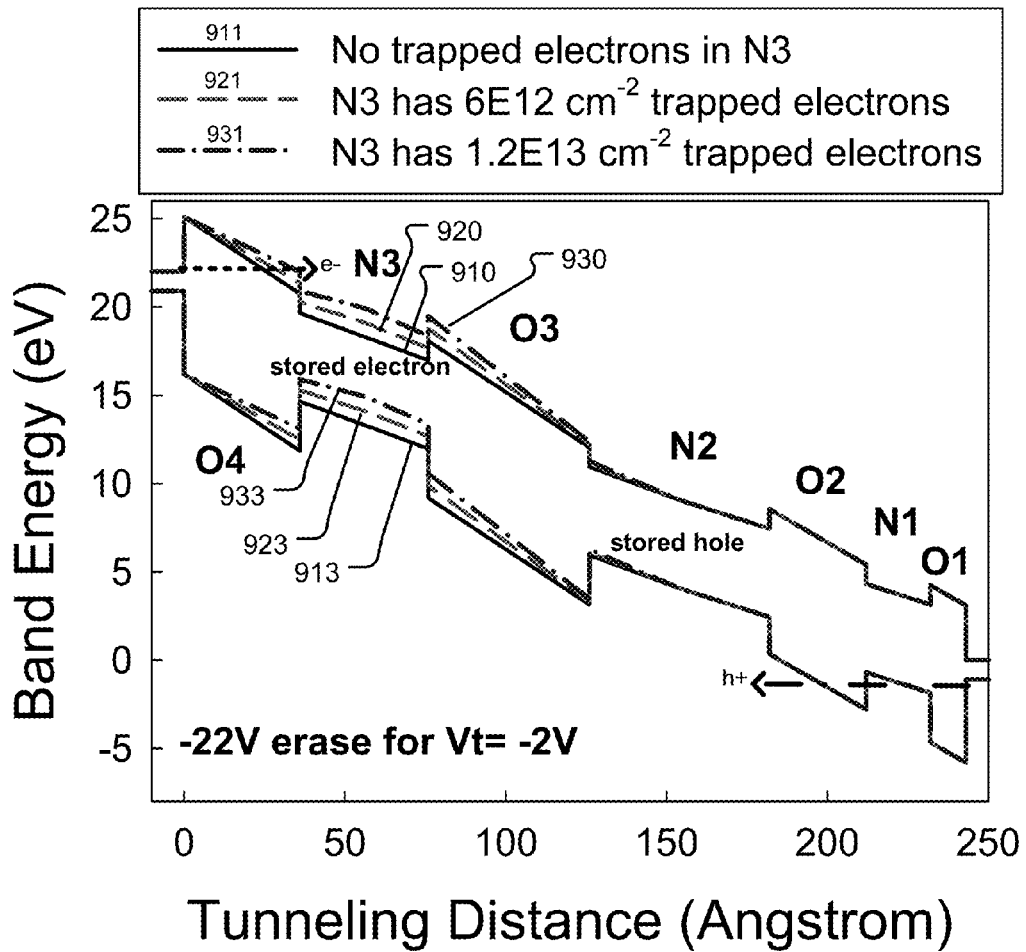
FIG. 9 is a band diagram of the modified BE-SONOS memory cell of FIG. 8, showing how the band diagram changes with electron density in the second nitride layer storing charge.

FIG. 9 is a band diagram of the modified BE-SONOS memory cell of FIG. 8, showing how the band diagram changes with electron density in the second nitride layer storing charge.

Curves 910 and 913 show respectively the conduction and valence band edges of second nitride charge storage layer 19 with no trapped electrons in N3, second nitride charge storage layer 19. Curves 920 and 923 show respectively the conduction and valence band edges of second nitride charge storage layer 19 with trapped electron density $6 \times 10^{12}$ cm$^{-2}$ in N3, second nitride charge storage layer 19. Curves 930 and 933 show respectively the conduction and valence band edges of second nitride charge storage layer 19 with trapped electron density $1.2 \times 10^{13}$ cm$^{-2}$ in N3, second nitride charge storage layer 19.

As trapped electron density in N3 increases, the conduction band edge of N3 increases in magnitude. The conduction band edge of proximate portions of O4 and O3 also increase in magnitude. This conduction band edge shift decreases the slope of the conduction band edge in O4, indicating a decrease electric magnitude in the O4, which suppresses erase saturation.

Hole injection through the tunneling layer O1/N1/O2 is assisted by the band edge offset of N1. Hole injection through the tunneling layer is further discussed in connection with FIGS. 26 and 27.

Figure 10:
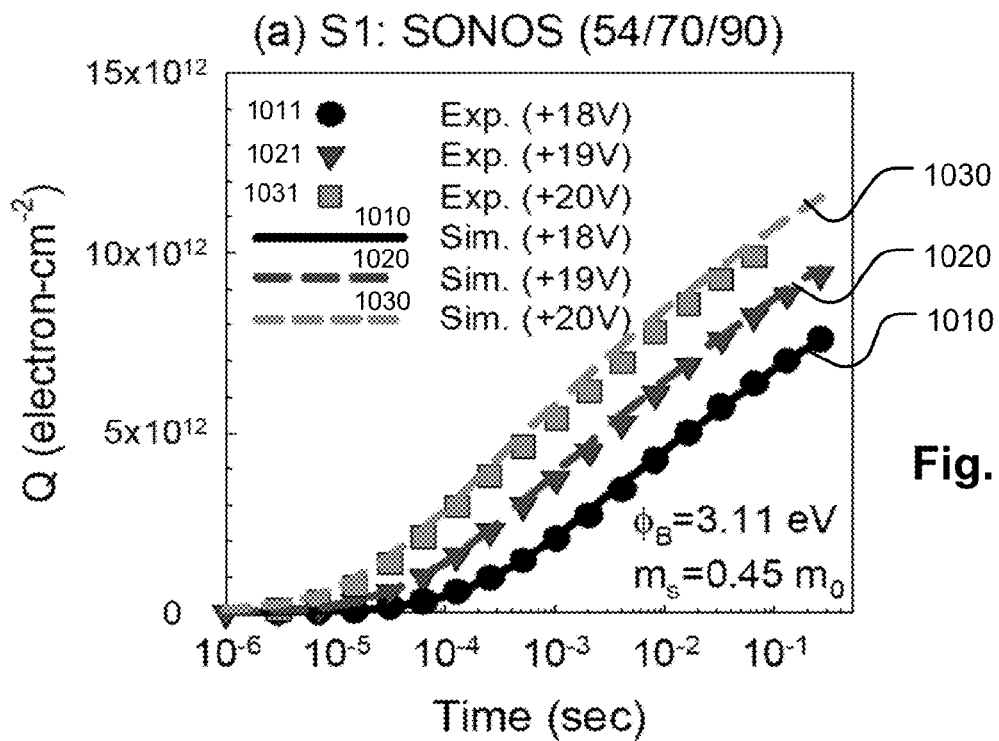
FIGS. 10-12 show the charge trapping efficiency of various nitride thicknesses.
Figure 11:
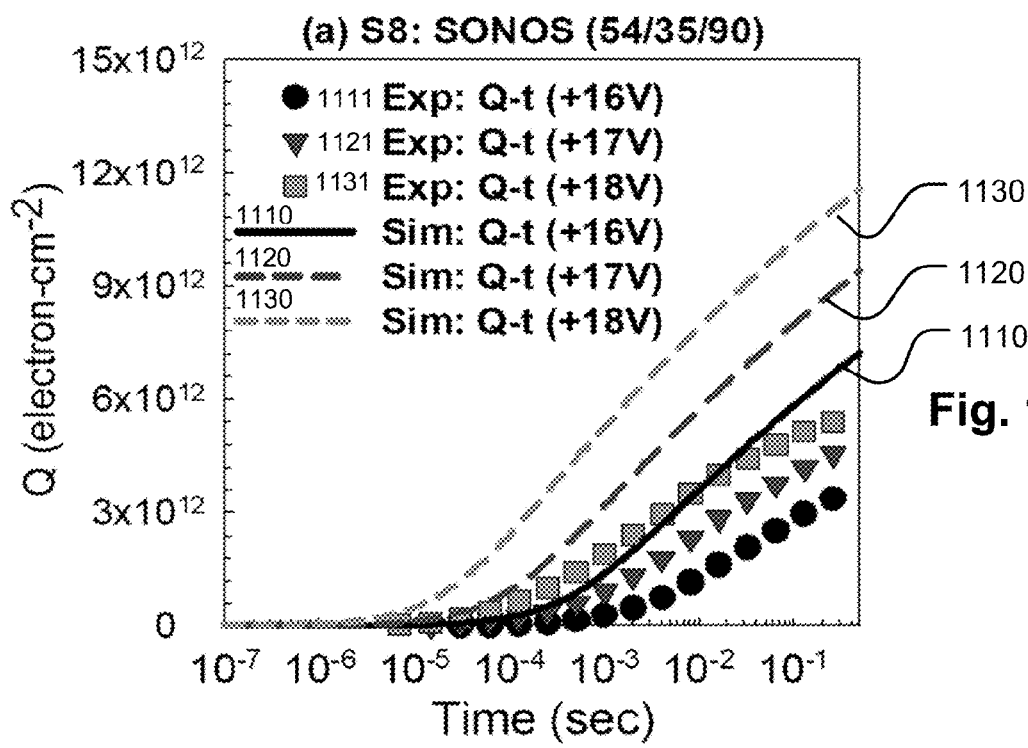
Figure 12:
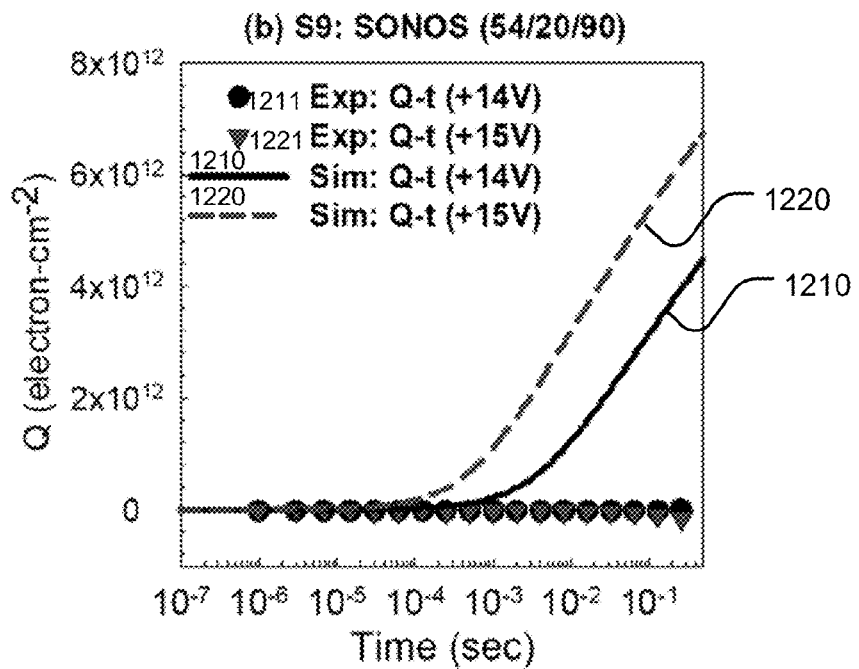

FIGS. 10-12 show the charge trapping efficiency of various nitride thicknesses.

In FIG. 10, erase operations are performed on a SONOS memory cell with O/N/O thicknesses of 54 Å/70 Å/90 Å.

An erase operation with a gate voltage of 18 V results in simulated curve 1010 and experimental data plot points 1011. An erase operation with a gate voltage of 19 V results in simulated curve 1020 and experimental data plot points 1021. An erase operation with a gate voltage of 20 V results in simulated curve 1030 and experimental data plot points 1031. Sufficiently thick SiN (>70 Å) has a high capture rate, close to ideal full-capture. Electron trapping density of more than $10^{13}$ cm$^2$ does not present a problem.

In FIG. 11, erase operations are performed on a SONOS memory cell with O/N/O thicknesses of 54 Å/35 Å/90 Å.

An erase operation with a gate voltage of 16 V results in simulated curve 1110 and experimental data plot points 1111. An erase operation with a gate voltage of 17 V results in simulated curve 1120 and experimental data plot points 1121. An erase operation with a gate voltage of 18 V results in simulated curve 1130 and experimental data plot points 1131. For thinner SiN (<35 Å), the capture efficiency significantly drops. The graph shows the results for the middle SiN layer of an SONOS memory cell. The results can inform the SiN thickness in other structures. For example, the second charge storage nitride layer 19 of FIG. 6 is thick enough to store sufficient electron charge to block electron injection from the gate. An electron charge density of at least $5 \times 10^{12}$ cm$^{-2}$ can block electron injection from the gate.

In FIG. 12, erase operations are performed on a SONOS memory cell with O/N/O thicknesses of 54 Å/20 Å/90 Å.

An erase operation with a gate voltage of 14 V results in simulated curve 1210 and experimental data plot points 1211. An erase operation with a gate voltage of 15 V results in simulated curve 1220 and experimental data plot points 1221. Very thin SiN (<20 Å) nitride provides low or ineffectual charge trapping. For this reason, such thin layers are used in the multi-layer tunneling structure, to provide a band offset effect without charge storage.

Figure 13:
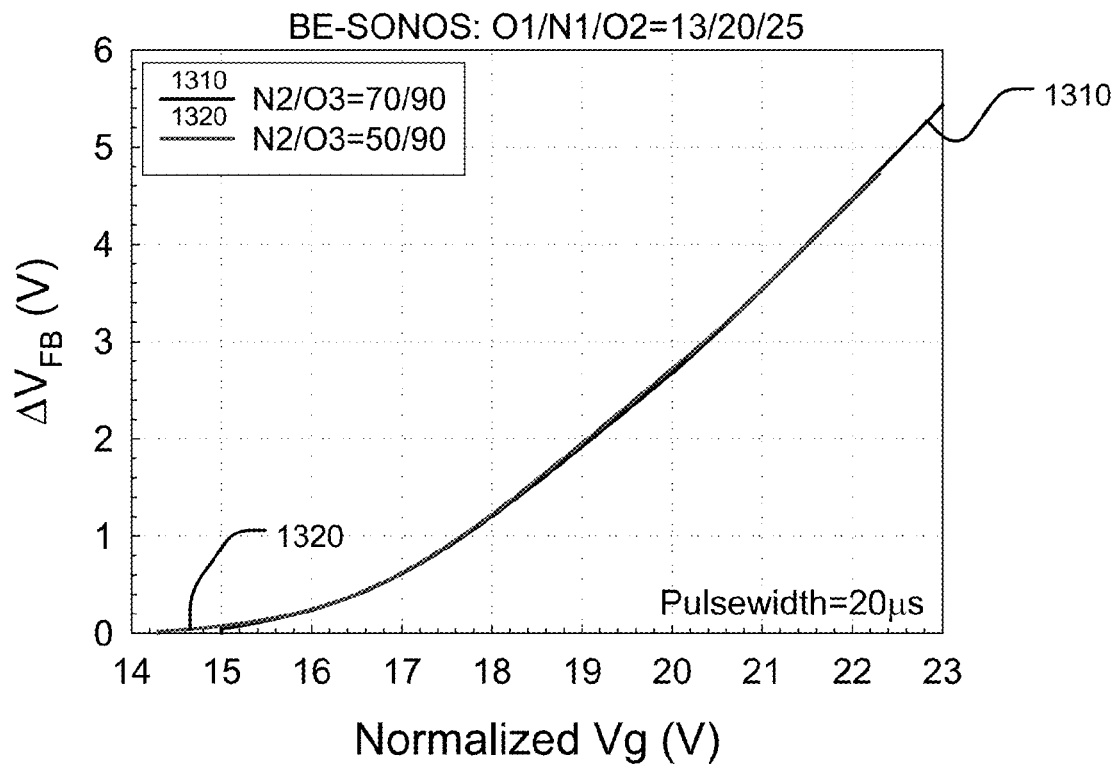
FIG. 13 shows the charge trapping efficiency of the first nitride layer storing charge, even with a reduced thickness.

FIG. 13 shows the charge trapping efficiency of the first nitride layer storing charge, even with a reduced thickness.

Erase operations result in change in flatband voltage, $\Delta V_{FB}$, on the y-axis in response to an 20 µs erase pulse from a gate voltage on the x-axis on a BE-SONOS memory cell with a bandgap engineered tunneling layer of O1/N1/O2 thicknesses 13 Å/20 Å/25 Å. The erase operation with N2/O3 thicknesses of 70 Å/90 Å results in curve 1310. The erase operation with N2/O3 thicknesses of 50 Å/90 Å results in curve 1320. The results indicate that even when N2 thickness is reduced to only 50 Å while O3 thickness is 90 Å, the result is an excellent ISPP slope similar to N2 thickness of 70 Å. Thus N2 can be scaled down to 50 Å, while still maintaining a good trapping efficiency.

Figure 14:
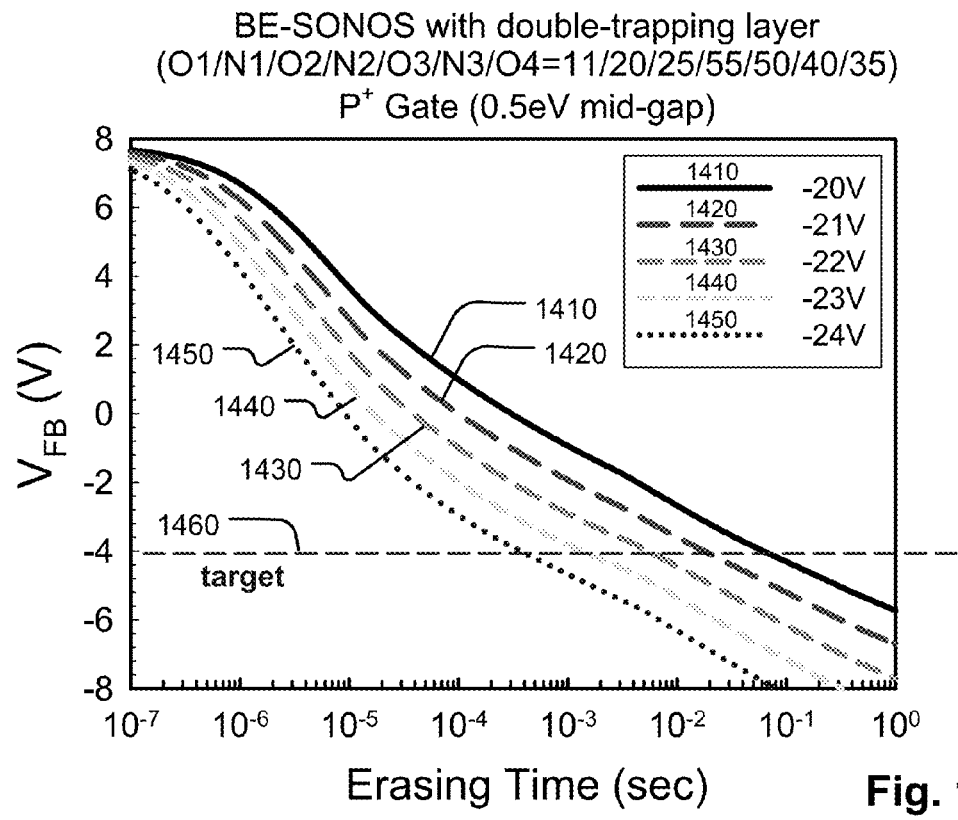
FIG. 14 is a graph of flat band voltage versus erase time for the memory cell of FIG. 6.
Figure 15:
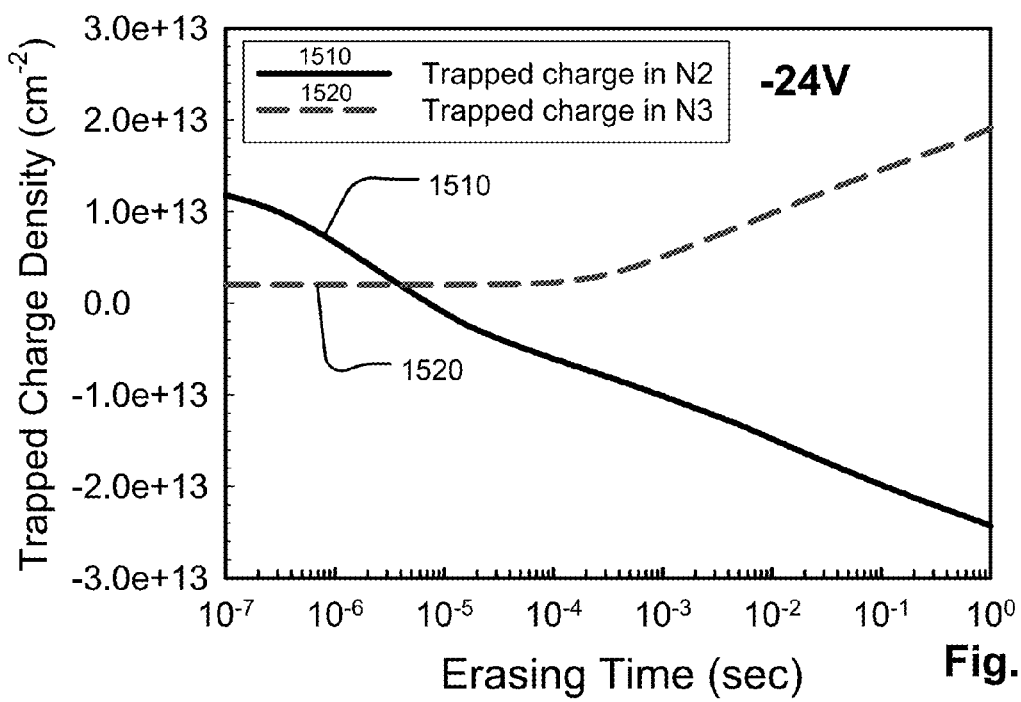
FIG. 15 is a graph of trapped charge density versus erase time for the different nitride layers for charge storage of the memory cell of FIG. 6.
Figure 16:
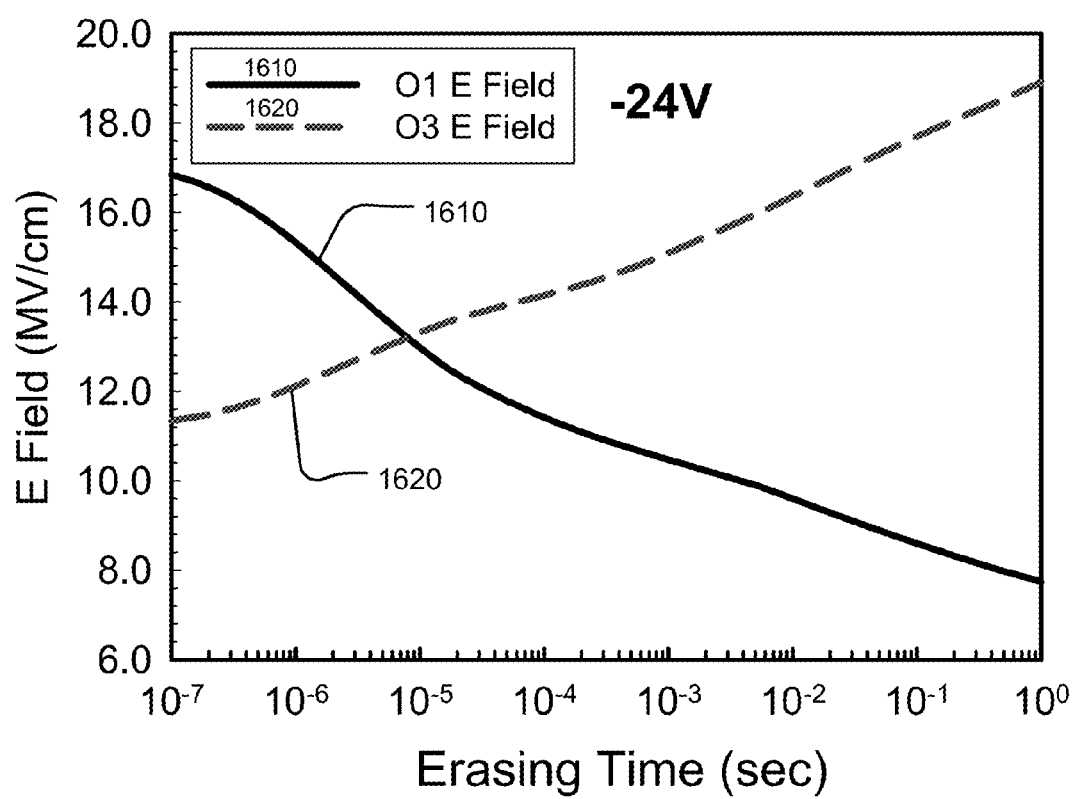
FIG. 16 is a graph of electric field versus erase time for different nitride layers for charge storage of the memory cell of FIG. 6.

With FIGS. 14-16, erase operations are performed on a SONOS memory cell modified with multiple charge storage nitride layers, with O1/N1/O2/N2/O3/N3/O4 thicknesses of 11 Å/20 Å/25 Å/55 Å/50 Å/40 Å/35 Å and a p polysilicon gate.

FIG. 14 is a graph of flat band voltage versus erase time for the memory cell of FIG. 6. An erase operation with a gate voltage of −20 V results in simulated curve 1410. An erase operation with a gate voltage of −21 V results in simulated curve 1420. An erase operation with a gate voltage of −22 V results in simulated curve 1430. An erase operation with a gate voltage of −23 V results in simulated curve 1440. An erase operation with a gate voltage of −24 V results in simulated curve 1450. The target voltage 1460 of −4 V is reached more quickly as the gate voltage is more negative. With gate voltage of −23 or −24V the target voltage is reached within 1 millisecond. Because no erase saturation is observed for $V_{FB}$<−8 V, higher magnitude erase biases can gain faster erase time.

FIG. 15 is a graph of trapped charge density versus erase time for the different nitride layers for charge storage of the memory cell of FIG. 6.

An erase operation with a gate voltage of −24 V results in simulated curve 1510 for trapped charge density in N2. An erase operation with a gate voltage of −24 V results in simulated curve 1520 for trapped charge density in N3. Trapped electron area density approaches ~$5 \times 10^{12}$ cm$^{-2}$ in N3 when $V_{FB}$~−4 V.

Simulations indicates that −FN gate injection of electrons into N3 occurs, and N3 traps electrons. As the density of trapped electrons in N3 increases, the trapped electrons in N3 increasingly retard electron injection from the gate. As N3 traps electrons, N2 continues trapping holes injected from channel material. The overall effect is that the trapped electron density in N3 helps to stop gate injection, allowing continuous hole injection into N2 and N2 being continuously erased, without erase saturation.

FIG. 16 is a graph of electric field versus erase time for different nitride layers for charge storage of the memory cell of FIG. 6. An erase operation with a gate voltage of −24 V results in simulated curve 1610 for electric field in N2. An erase operation with a gate voltage of −24 V results in simulated curve 1620 for electric field in N3.

The simulations indicate that the bottom O1 electric field decreases, while the upper O3 electric field greatly increases during −FN erasing. Because of the high electric field in O3, a high oxide quality of O3 is important.

Figure 17:
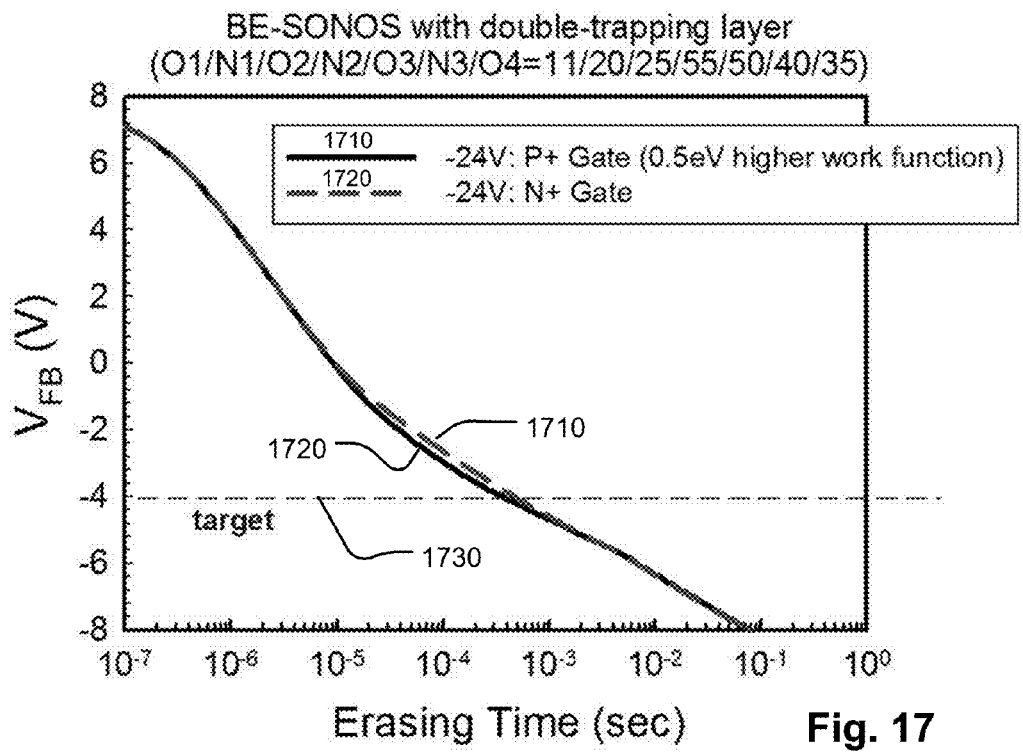
FIG. 17 is a graph of flat band voltage versus erase time with different gate materials for the memory cell of FIG. 6.
Figure 18:
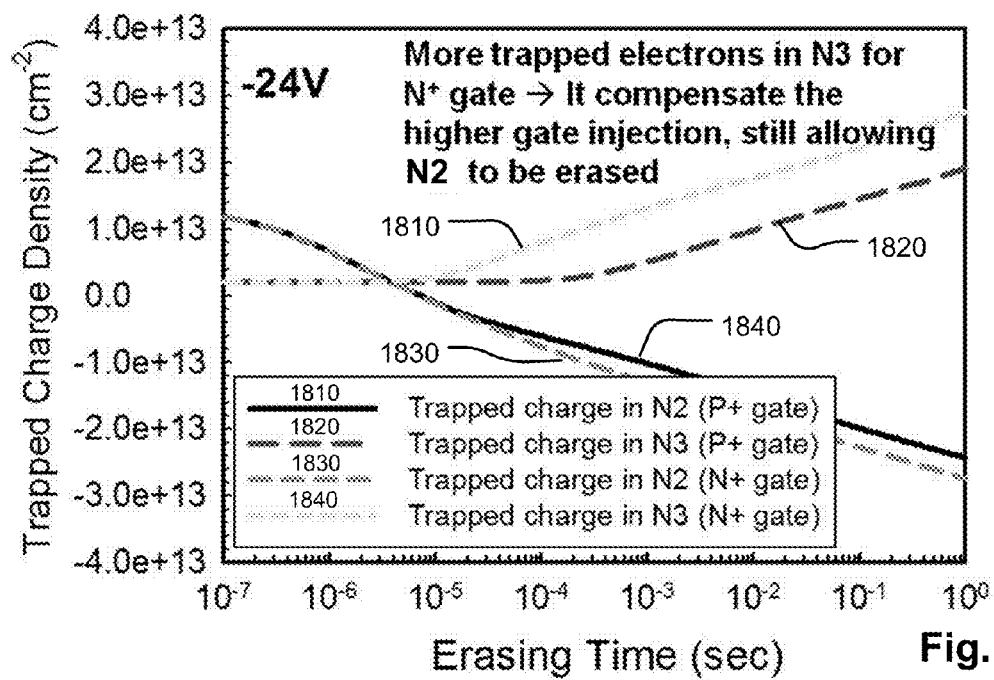
FIG. 18 is a graph of trapped charge density versus erase time for the different nitride layers for charge storage with different gate materials of the memory cell of FIG. 6.
Figure 19:
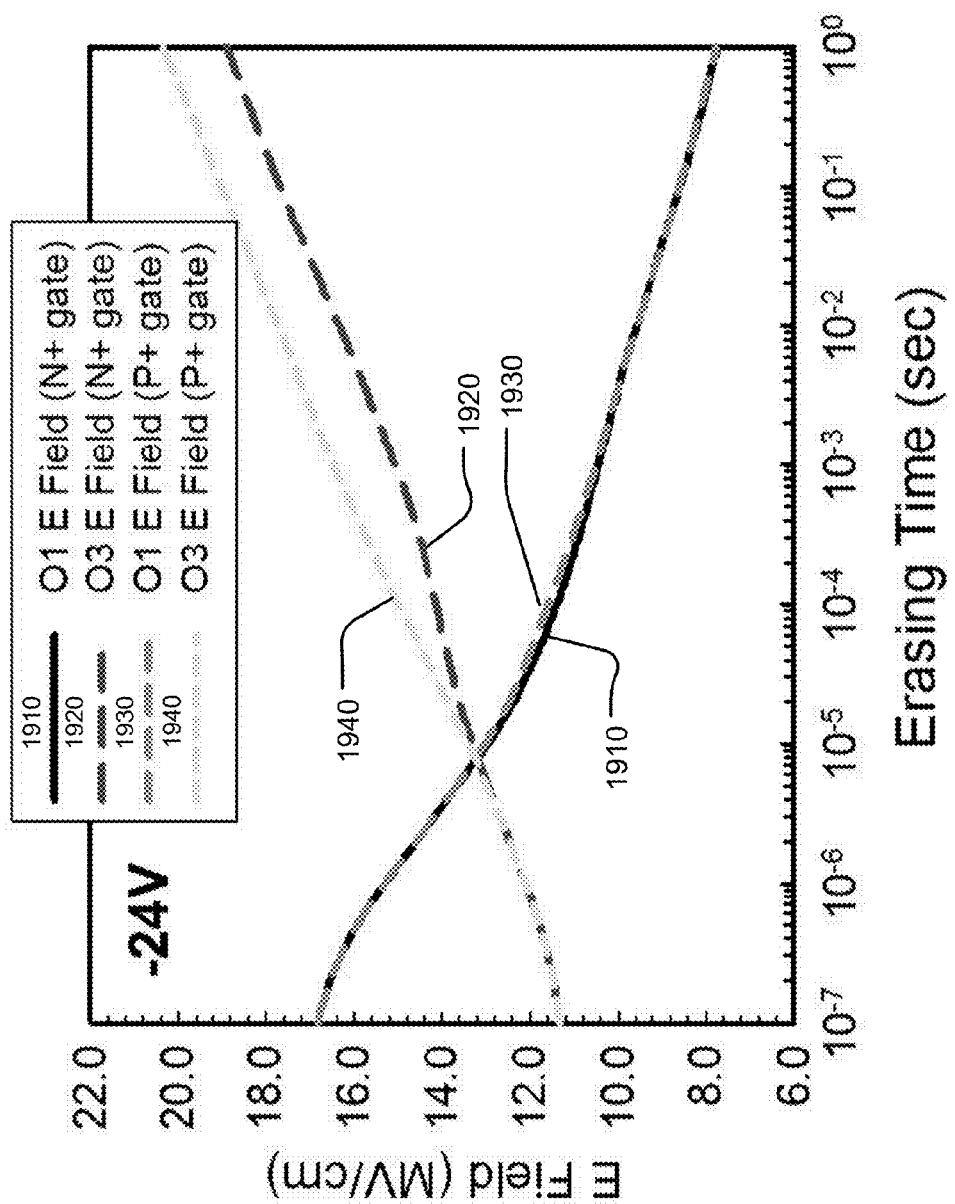
FIG. 19 is a graph of electric field versus erase time for different nitride layers for charge storage with different gate materials of the memory cell of FIG. 6.

With FIGS. 17-19, erase operations are performed on a SONOS memory cell modified with multiple charge storage nitride layers, with O1/N1/O2/N2/O3/N3/O4 thicknesses of 11 Å/20 Å/25 Å/55 Å/50 Å/40 Å/35 Å.

FIG. 17 is a graph of flat band voltage versus erase time with different gate materials for the memory cell of FIG. 6.

An erase operation with a gate voltage of −24 V with a p polysilicon gate results in simulated curve 1710. An erase operation with a gate voltage of −24 V with an n polysilicon gate results in simulated curve 1720. Whether the gate is doped n or p, the resulting curve shows no erase saturation.

FIG. 18 is a graph of trapped charge density versus erase time for the different nitride layers for charge storage with different gate materials of the memory cell of FIG. 6.

An erase operation with a gate voltage of −24 V with a p polysilicon gate results in simulated curve 1810 of trapped charge in N2. An erase operation with a gate voltage of −24 V with a p polysilicon gate results in simulated curve 1820 of trapped charge in N3. An erase operation with a gate voltage of −24 V with an n polysilicon gate results in simulated curve 1830 of trapped charge in N2. An erase operation with a gate voltage of −24 V with an n polysilicon gate results in simulated curve 1840 of trapped charge in N3.

The simulations show that the N3 trapped electrons have increased density due to the N gate, compensating for the effects of higher gate injection of electrons. This increased electron density allows N2 to be continuously erased by hole injection from the channel.

FIG. 19 is a graph of electric field versus erase time for different nitride layers for charge storage with different gate materials of the memory cell of FIG. 6.

An erase operation with a gate voltage of −24 V with a n polysilicon gate results in simulated curve 1910 of electric field in O1. An erase operation with a gate voltage of −24 V with an n polysilicon gate results in simulated curve 1920 of electric field in O3. An erase operation with a gate voltage of −24 V with a p polysilicon gate results in simulated curve 1930 of electric field in O1. An erase operation with a gate voltage of −24 V with a p polysilicon gate results in simulated curve 1940 of electric field in O3.

The multiple charge storage nitride layer BE-SONOS device has high immunity to gate injection variation. Whenever gate injection of electrons is higher (by poly gate doping variation, or field enhancement effect), N3 can accommodate the higher gate injection of electrons with higher trapped charge density of electrons. The increased charge density of electrons in N3 allows N2 to continue to erase with hole injection from the channel.

Figure 20:
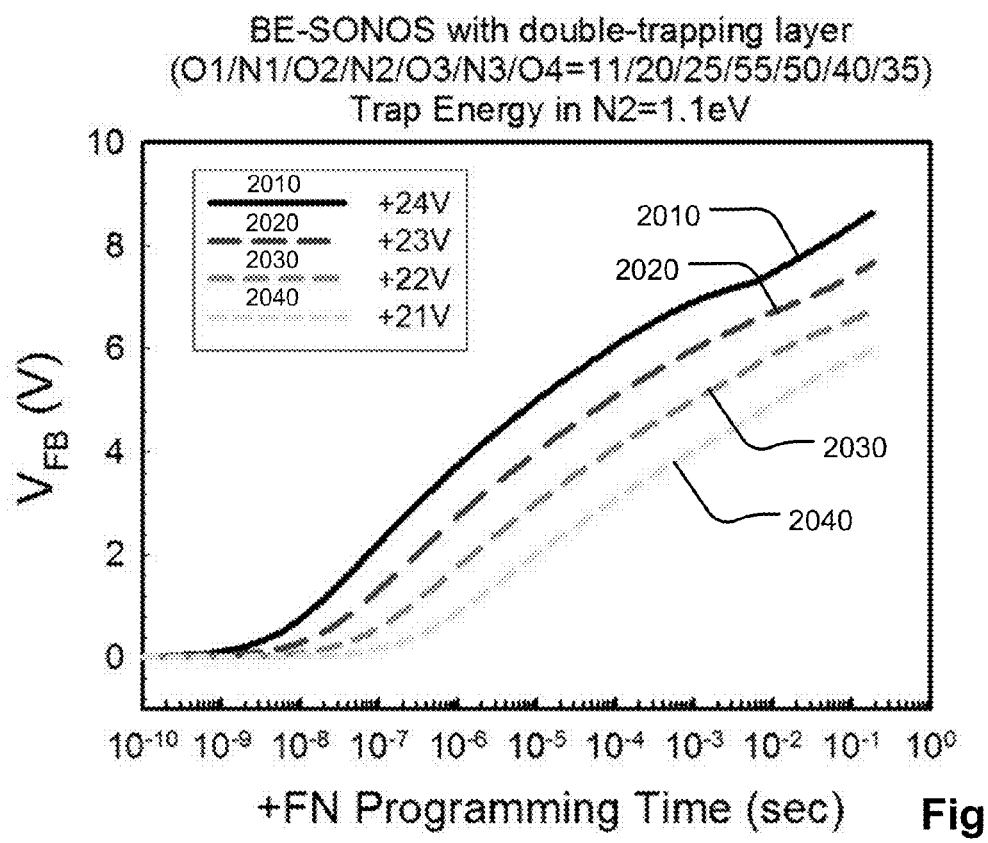
FIG. 20 is a graph of flat band voltage versus programming time for the memory cell of FIG. 6.
Figure 21:
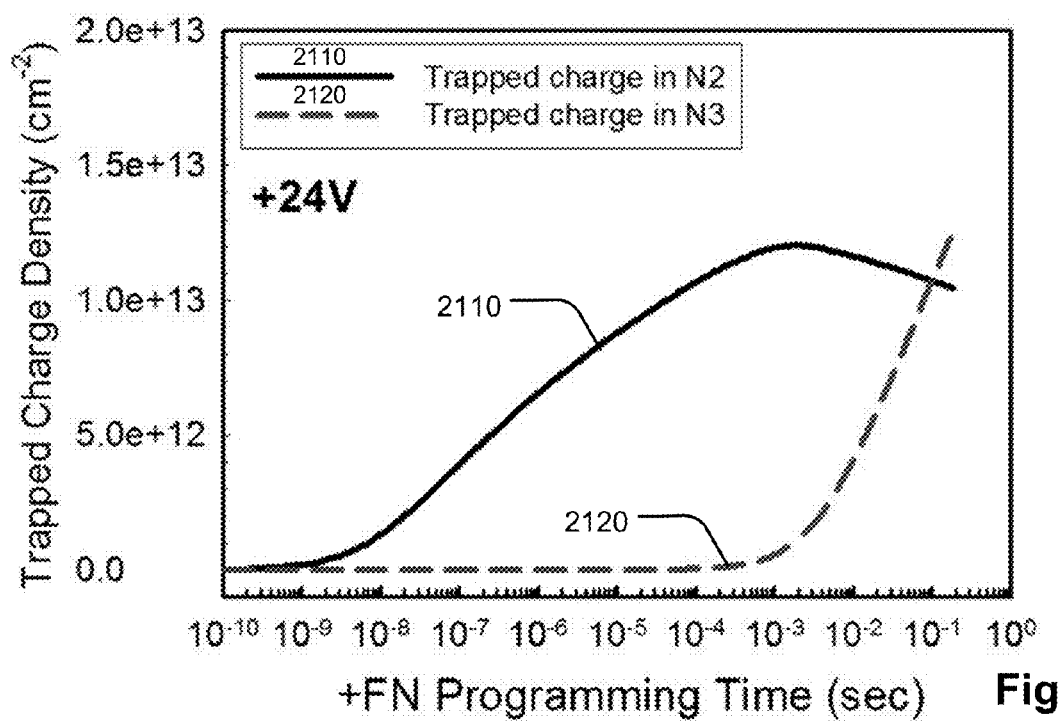
FIG. 21 is a graph of trapped charge density versus programming time for the different nitride layers for charge storage of the memory cell of FIG. 6.
Figure 22:
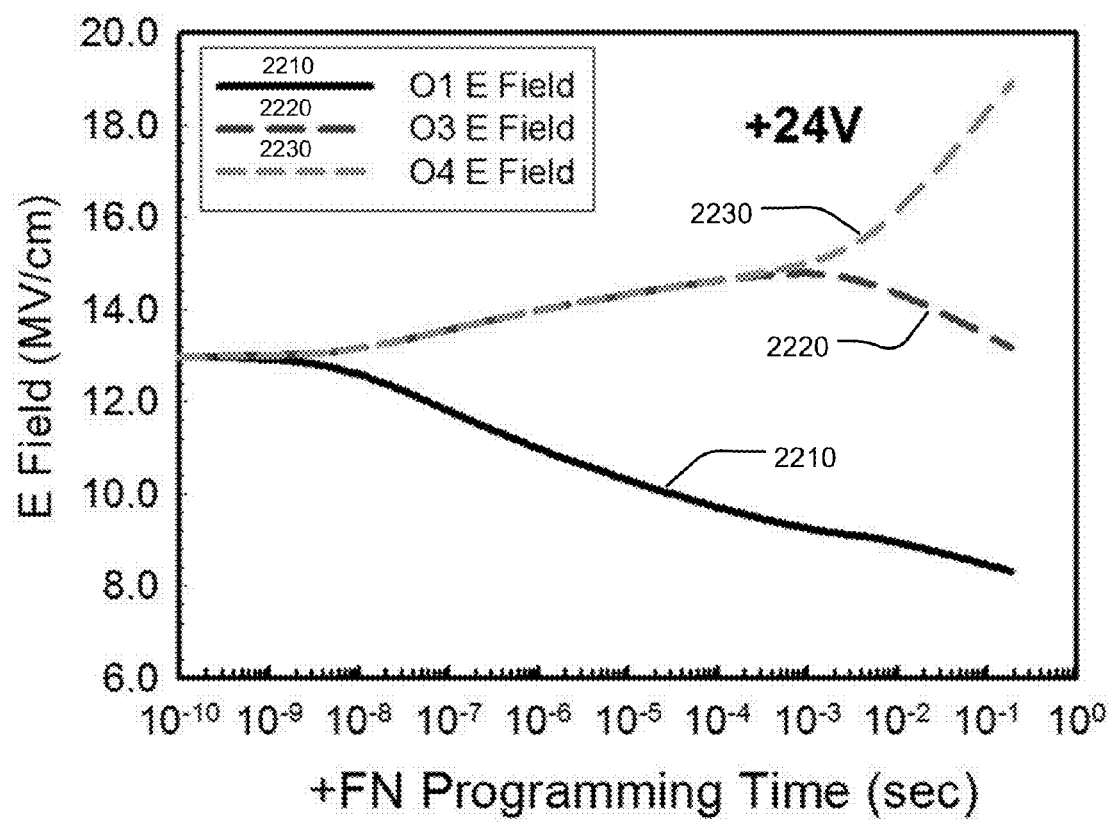
FIG. 22 is a graph of electric field versus programming time for different nitride layers for charge storage of the memory cell of FIG. 6.

With FIGS. 20-22, program operations are performed on a SONOS memory cell modified with multiple charge storage nitride layers, with O1/N1/O2/N2/O3/N3/O4 thicknesses of 11 Å/20 Å/25 Å/55 Å/50 Å/40 Å/35 Å.

FIG. 20 is a graph of flat band voltage versus programming time for the memory cell of FIG. 6.

A program operation with a gate voltage of +24 V results in simulated curve 2010. A program operation with a gate voltage of +23 V results in simulated curve 2020. A program operation with a gate voltage of +22 V results in simulated curve 2030. A program operation with a gate voltage of +21 V results in simulated curve 2040.

FIG. 21 is a graph of trapped charge density versus programming time for the different nitride layers for charge storage of the memory cell of FIG. 6.

A program operation with a gate voltage of +24 V results in simulated curve 2110 of trapped charge in N2. A program operation with a gate voltage of +24 V results in simulated curve 2110 of trapped charge in N3.

FIG. 22 is a graph of electric field versus programming time for different nitride layers for charge storage of the memory cell of FIG. 6.

A program operation with a gate voltage of +24 V with results in simulated curve 2210 of electric field in O1. A program operation with a gate voltage of +24 V with results in simulated curve 2220 of electric field in O3. A program operation with a gate voltage of +24 V with results in simulated curve 2230 of electric field in O4.

As more electrons are injected into N2, the electric field in O3 increases. The increasing electrical field in O3 gradually increases de-trapping of electrons in N2 toward N3. Thus at higher injection levels of electrons ($V_{FB}$>6V), more electrons are trapped in N3. Programming saturation is still not observed, and the memory cell can be continuously programmed to $V_{FB}$>8V, which is more than enough for the MLC (multi-level cell) operation window.

Figure 23:
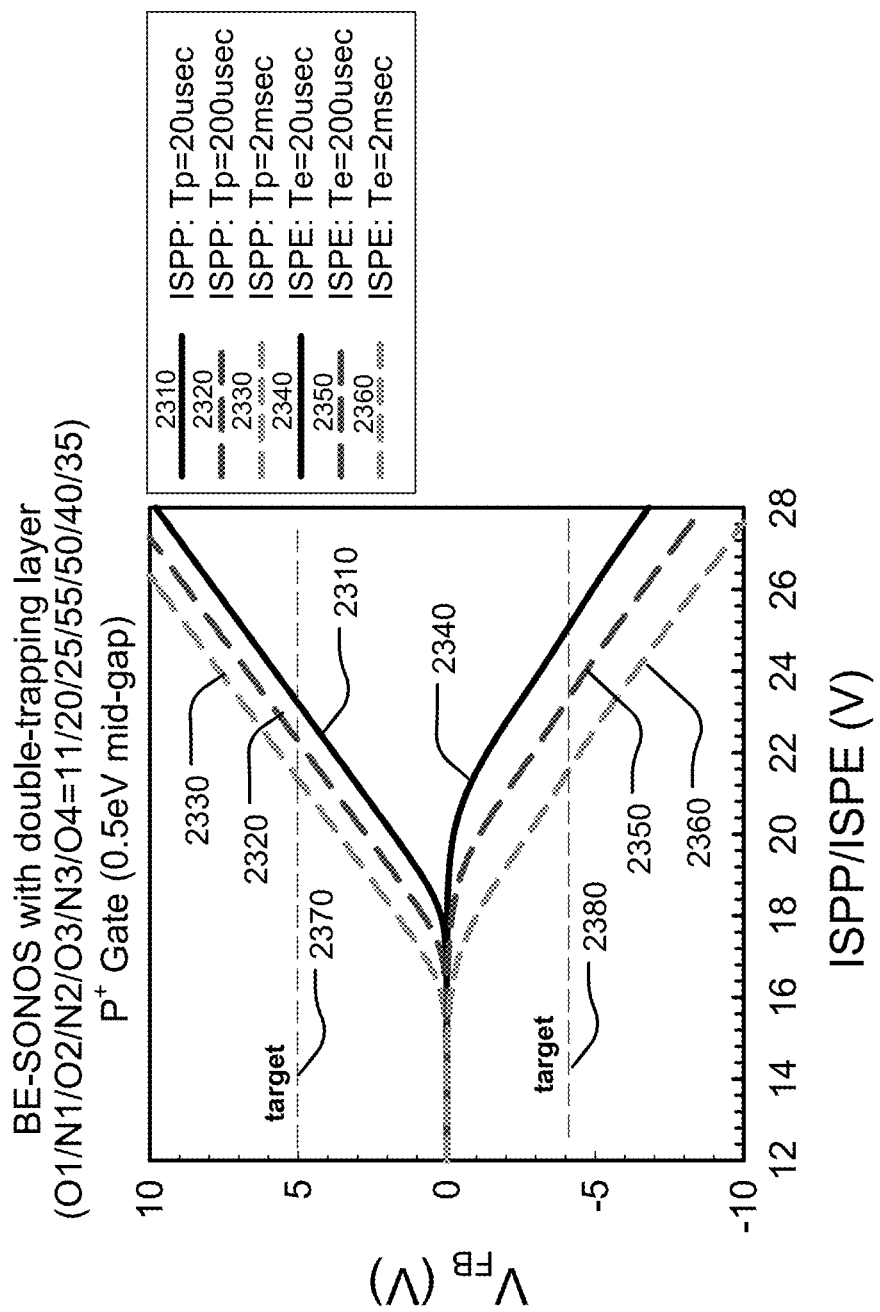
FIG. 23 is a graph of flat band voltage versus erase voltage and programming voltage for different erase times and programming times of the memory cell of FIG. 6.

FIG. 23 is a graph of flat band voltage versus erase voltage and programming voltage for different erase times and programming times of the memory cell of FIG. 6.

Program and erase operations are performed on a SONOS memory cell modified with multiple charge storage nitride layers, with a p plysilicon gate and O1/N1/O2/N2/O3/N3/O4 thicknesses of 11 Å/20 Å/25 Å/55 Å/50 Å/40 Å/35 Å.

ISPP and ISPE operations tighten the Vt distribution. ISPP is incremental step pulse programming which programs the memory step-by-step to gradually increase the programming voltage. ISPE is incremental step pulse erasing: which erases the device step-by-step by gradually increasing the erasing voltage.

A program operation with an incremented step pulse program of pulse time 20 μsec results in simulated curve 2310. A program operation with an incremented step pulse program of pulse time 200 μsec results in simulated curve 2320. A program operation with an incremented step pulse program of pulse time 2 milliseconds results in simulated curve 2330.

An erase operation with an incremented step pulse erase of pulse time 20 μsec results in simulated curve 2340. An erase operation with an incremented step pulse erase of pulse time 200 μsec results in simulated curve 2350. An erase operation with an incremented step pulse erase of pulse time 2 milliseconds results in simulated curve 2360.

The curves show a large ISPP/ISPE window without saturation, before $V_{FB}=+/-8V$. The slopes of the ISPP and ISPE curves is close to the ideal slope of 1.

For small memory cells, the 3D fringe field effect causes degradation of charge storage efficiency. Accordingly, the Vt or flat-band voltage (VFB) of a 3D memory cell is lower than the Vt or flat-band voltage (VFB) of a 1D memory cell. With a 3D memory cell, programming and erasing are overdriven to simulate the actual device/transistor window.

In one embodiment, approximately +23V for 20 usec reaches $V_{FB}=+5V$, and −23V for 2 msec reaches $V_{FB}=-4$ V. Threshold voltage Vt is about +3 to +4V for programming, and threshold voltage Vt is about −2 to −3V for erasing. These program and erase threshold voltages are suitable for a multi-level (MLC) memory window. An MLC memory cell with 4 logical levels requires a wider memory window than a 2 level memory cell.

Figure 24:
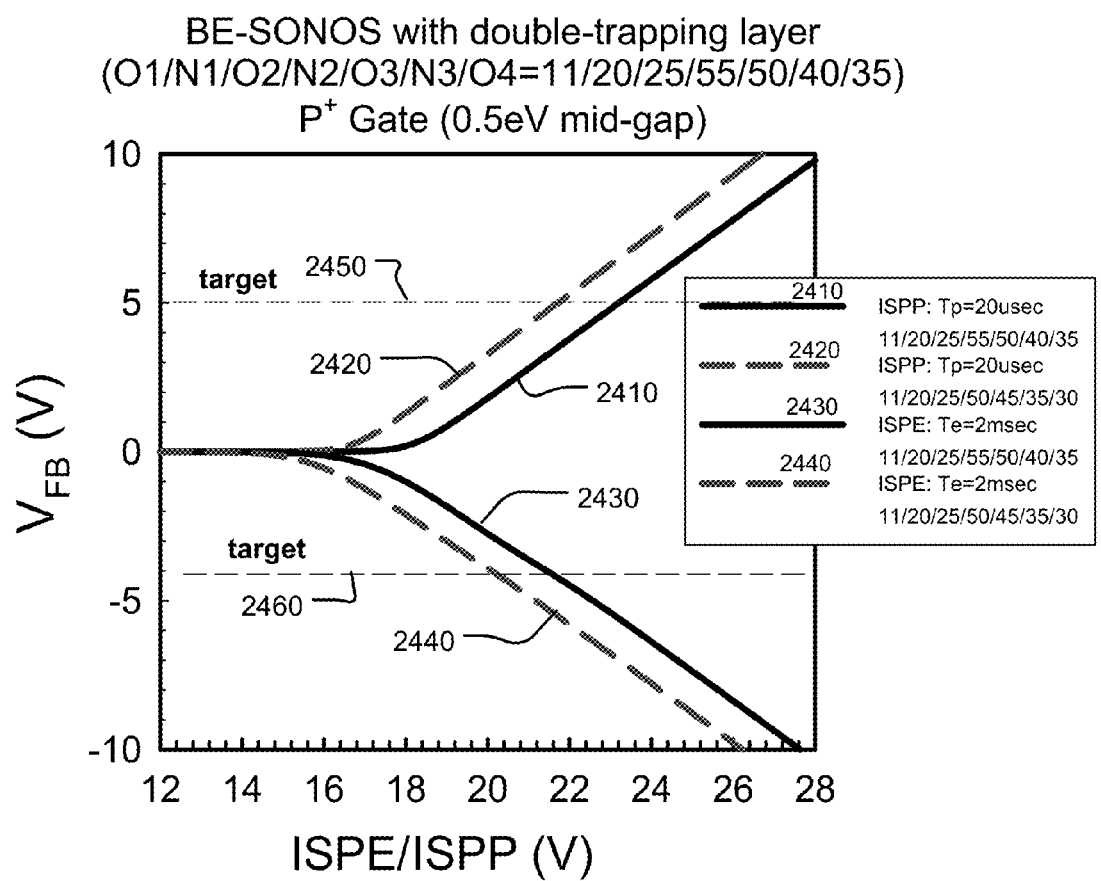
FIG. 24 is a graph of flat band voltage versus erase voltage and programming voltage for different sets of layer thicknesses of the memory cell of FIG. 6.

FIG. 24 is a graph of flat band voltage versus erase voltage and programming voltage for different sets of layer thicknesses of the memory cell of FIG. 6.

Program and erase operations are performed on a SONOS memory cell modified with multiple charge storage nitride layers, with a p polysilicon gate.

An ISPP program operation with program pulse of 20 μsec with O1/N1/O2/N2/O3/N3/O4 thicknesses of 11 Å/20 Å/25 Å/55 Å/50 Å/40 Å/35 Å results in simulated curve 2410. An ISPP program operation with program pulse of 20 iusec with O1/N1/O2/N2/O3/N3/O4 thicknesses of 11 Å/20 Å/25 Å/50 Å/45 Å/35 Å/30 Å results in simulated curve 2420.

An ISPE erase operation with erase pulse of 2 milliseconds with O1/N1/O2/N2/O3/N3/O4 thicknesses of 11 Å/20 Å/25 Å/55 Å/50 Å/40 Å/35 Å results in simulated curve 2430. An ISPE erase operation with erase pulse of 2 milliseconds with O1/N1/O2/N2/O3/N3/O4 thicknesses of 11 Å/20 Å/25 Å/50 Å/45 Å/35 Å/30 Å results in simulated curve 2440.

Slight reduction of the layer thickness decreases the programming voltage about 1-2 V to Vpgm=21V.

Figure 25:
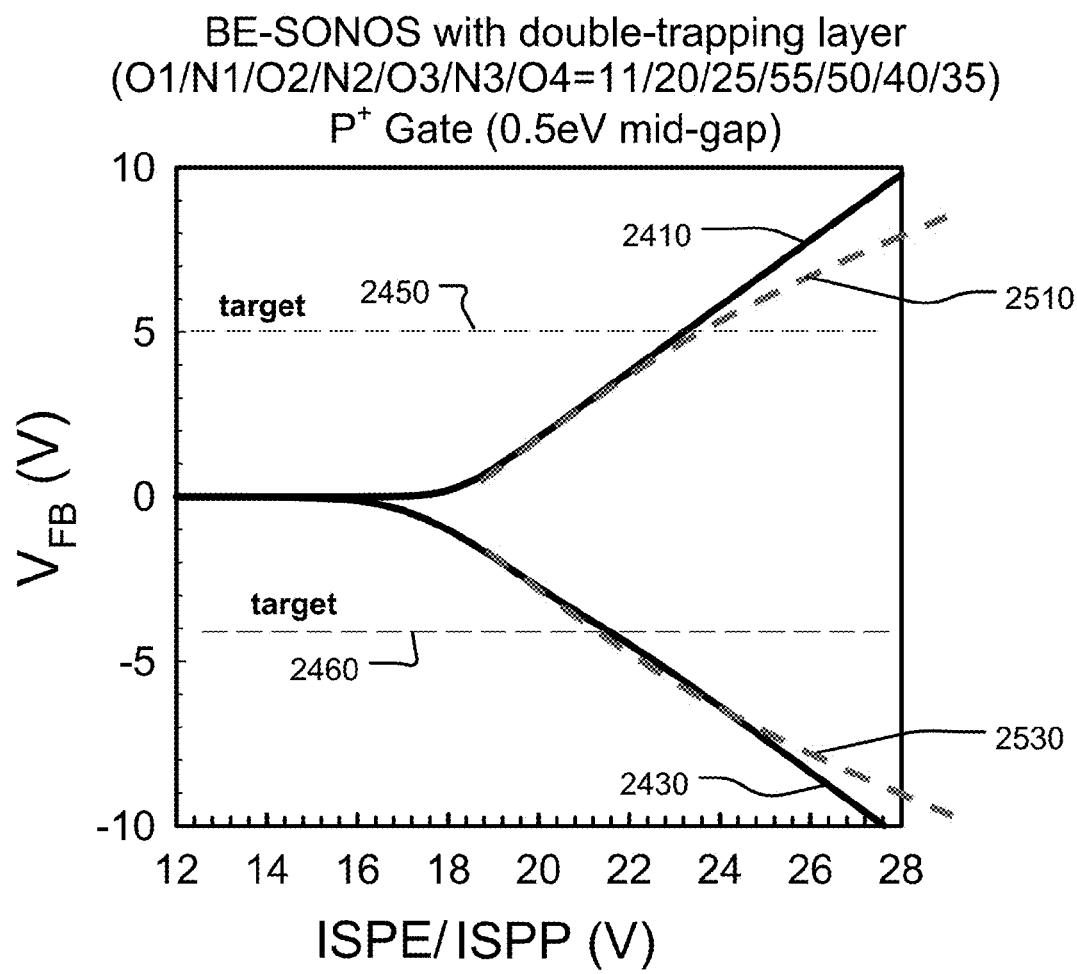
FIG. 25 is a graph of flat band voltage versus erase voltage and programming voltage for different sets of layer thicknesses of the memory cell of FIG. 6, showing non-ideal behavior.

FIG. 25 is a graph of flat band voltage versus erase voltage and programming voltage for different sets of layer thicknesses of the memory cell of FIG. 6, showing non-ideal behavior. Non-ideal behavior is describes as follows. If charge injected by tunneling is not 100% captured and trapped in nitride, the injection efficiency is lower than ideal, and the ISPP/ISPE slope may not be equal to 1. This may happen when thicknesses of N2 and N3 are not insufficient (for example, N2<4 nm). If there is charge mixing or transport between N2 and N3 during programming/erasing than the ISPP/ISPE slope may be also degraded. This may happen when the thickness of O3 is not enough (for example, O3<3 nm).

FIG. 25 shows similar curves 2410 and 2430 as in FIG. 24. However, in FIG. 25 the thicknesses of charge storage nitride layers N2 and/or N3 are too thin to show an ideal slope of ISPP and ISPE. In a physical model, the charge capturing process has a scattering mean free path, and capturing efficiency is degraded exponentially if the thickness is thinner than the mean free path. Alternatively, blocking oxide layer O3 allows too much tunneling of electrons into the first nitride charge storage layer. Due to such non-ideal behavior, curve 2410 degrades into curve 2510, and curve 2420 degrades into curve 2520.

With curve 2510, gradual saturation occurs at $V_{FB}>+8V$, and non-ideal ISPP slope <0.95 rather than being equal to 1. Because blocking oxide layers are too thin, outward tunneling is enhanced. A charge interchange occurs between N2/N3 during high-field +FN tunneling.

With curve 2520, gradual saturation occurs at $V_{FB}<-8V$, and non-ideal ISPE slope <0.95 rather than being equal to 1.

Insufficient electron trapping in N3 exists to stop gate injection of further electrons, as shown in connection with FIG. 18. Without a sufficient density of trapped electrons in N3 to stop gate injection of further electrons, the gate injected electrons reach N2, resulting in slight erase saturation. Charge interchange between N2/N3 during high-field −FN tunneling.

If O3 thickness is too thin, then charge interchange between N2/N3 may happen. For example, during −FN erasing, electrons are trapped in N3, while holes are trapped in N2. If charge interchange happens, the trapped electrons may go to N2, leading to a degraded erasing window.

The blocking oxide O3 between N2 and N3 maintains the erase performance, and avoids too much non-ideal charge transport between N2 and N3. Good charge capture efficiency is maintained by sufficient thicknesses of N2 and N3. As shown by FIGS. 10-13, N2 thicknesses of at least 50 Å result in sufficient charge storage for a memory window, and N3 thicknesses of at least 30 Å result in sufficient charge storage to resist gate injection of further electrons.

Figure 1:
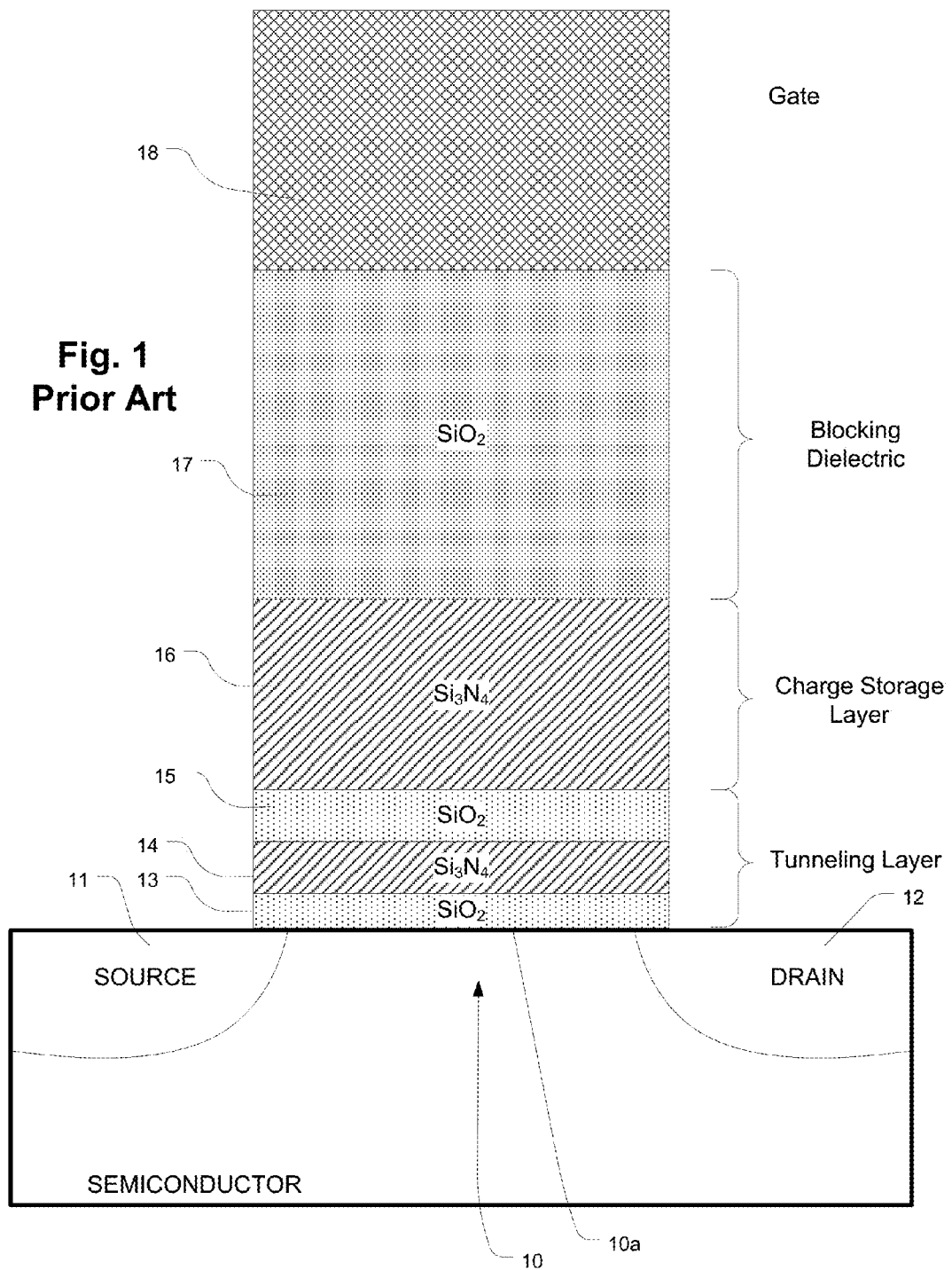
FIG. 1 is a simplified diagram of a BE-SONOS memory cell.
Figure 2:
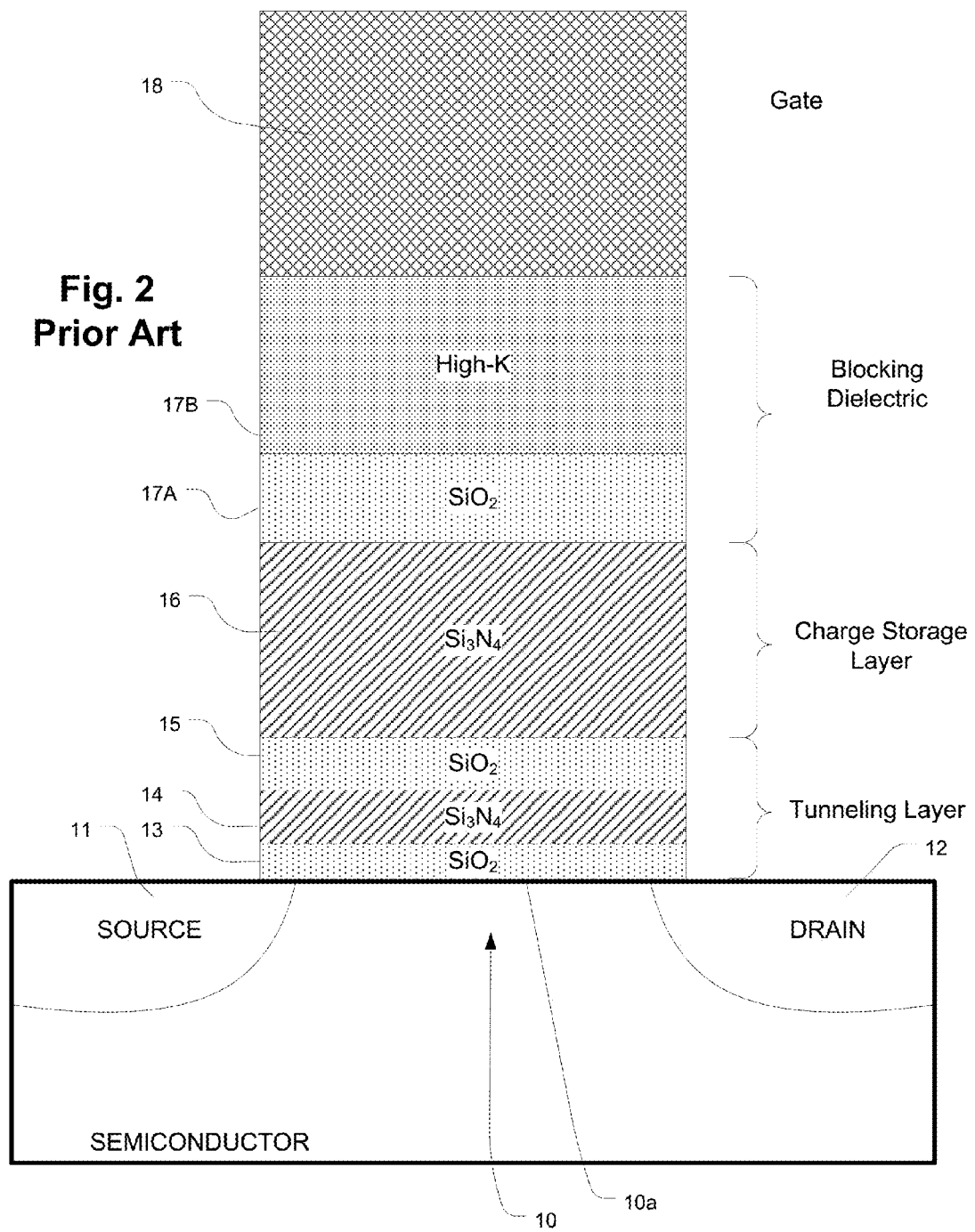
FIG. 2 is a simplified diagram of a BE-SONOS memory cell with a high-K blocking dielectric.
Figure 26:
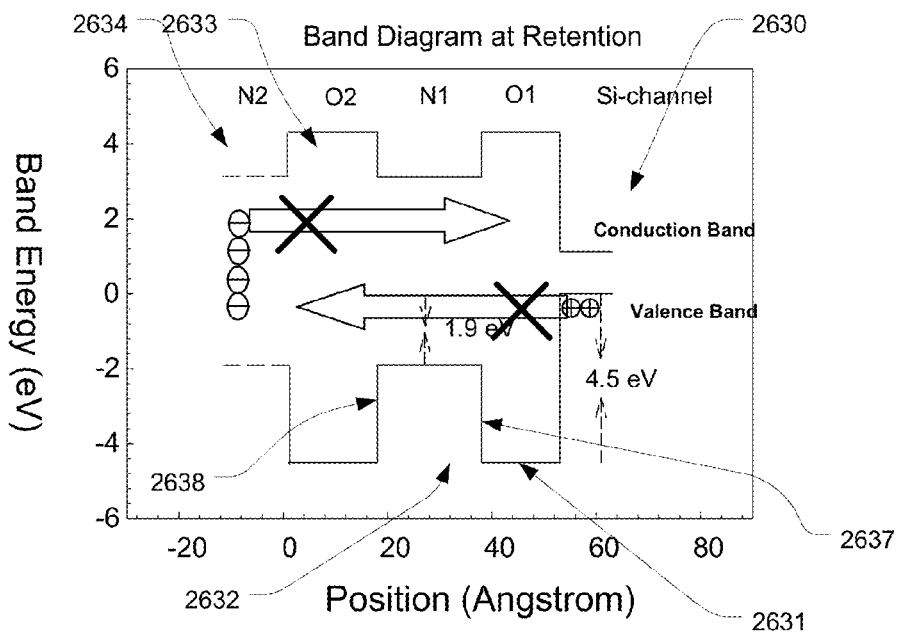
FIG. 26 is a band diagram for a tunneling dielectric layer including band offset technology at a low electric fields.

FIG. 26 is a diagram of the energy levels of the conduction and valence bands of the dielectric tunneling structure the including the stack of layers 13-15 of FIG. 1 under a low electric field, showing a "U-shaped" conduction band and an "inverted U-shaped" valence band. From the right side, the band gap for the semiconductor body is shown in region 2630, the valence and conduction bands for the hole tunneling layer are shown in region 2631, the band gap for the tunneling nitride layer is shown in region 2632, the valence and conduction bands for the isolation layer are shown in region 2633 and the valence and conduction bands for the charge trapping layer are shown in region 2634. Electrons, represented by the circles with the negative sign, trapped within the charge trapping region 2634 are unable to tunnel to the conduction band in the channel, because the conduction band of the tunneling dielectric layer in all three regions 2631, 2632, 2633 remains high relative to the energy level of the trap. The likelihood of electron tunneling correlates with the area under the "U-shaped" conduction band in the tunneling dielectric layer and above a horizontal line at the energy level of the trap to the channel. Thus, electron tunneling is very unlikely at low field conditions. Likewise, holes in the valence band of the channel in region 2630 are blocked by the full thickness of regions 2631, 2632 and 2633 from tunneling to the charge trapping layer 2634, and the high hole tunneling barrier height at the channel interface. The likelihood of hole tunneling correlates with the area over the "inverted U-shaped" valence band in the tunneling dielectric layer and below a horizontal line at the energy level of the channel to the charge trapping layer. Thus, hole tunneling is very unlikely at low field conditions. For the representative embodiment, in which the hole tunneling layer comprises silicon dioxide, a hole tunneling barrier height of about 4.5 eV prevents hole tunneling. The valence band in the silicon nitride remains 1.9 eV below that of the valence band in the channel. Therefore, the valence band in all three layers 2631, 2632, 2633 the tunneling dielectric structure remain significantly below the valence band in the channel 2630; the valence band of all of layer 2632 has a lower band energy than the valence band in the channel 2630. The tunneling layer described herein therefore is characterized by band offset characteristics, include a relatively large hole tunneling barrier height in a thin region (layer 2631) at the interface with the semiconductor body, and an increase 2637 in valence band energy level at a first offset less than 2 nm from the channel surface. The band offset characteristics also include a decrease 2638 in valence band energy level at a second offset from the channel by providing a thin layer 2633 of relatively high tunneling barrier height material, resulting in the inverted U-shaped valence band shape. Likewise, the conduction band has a U-shape caused by the same selection of materials.

Figure 3:
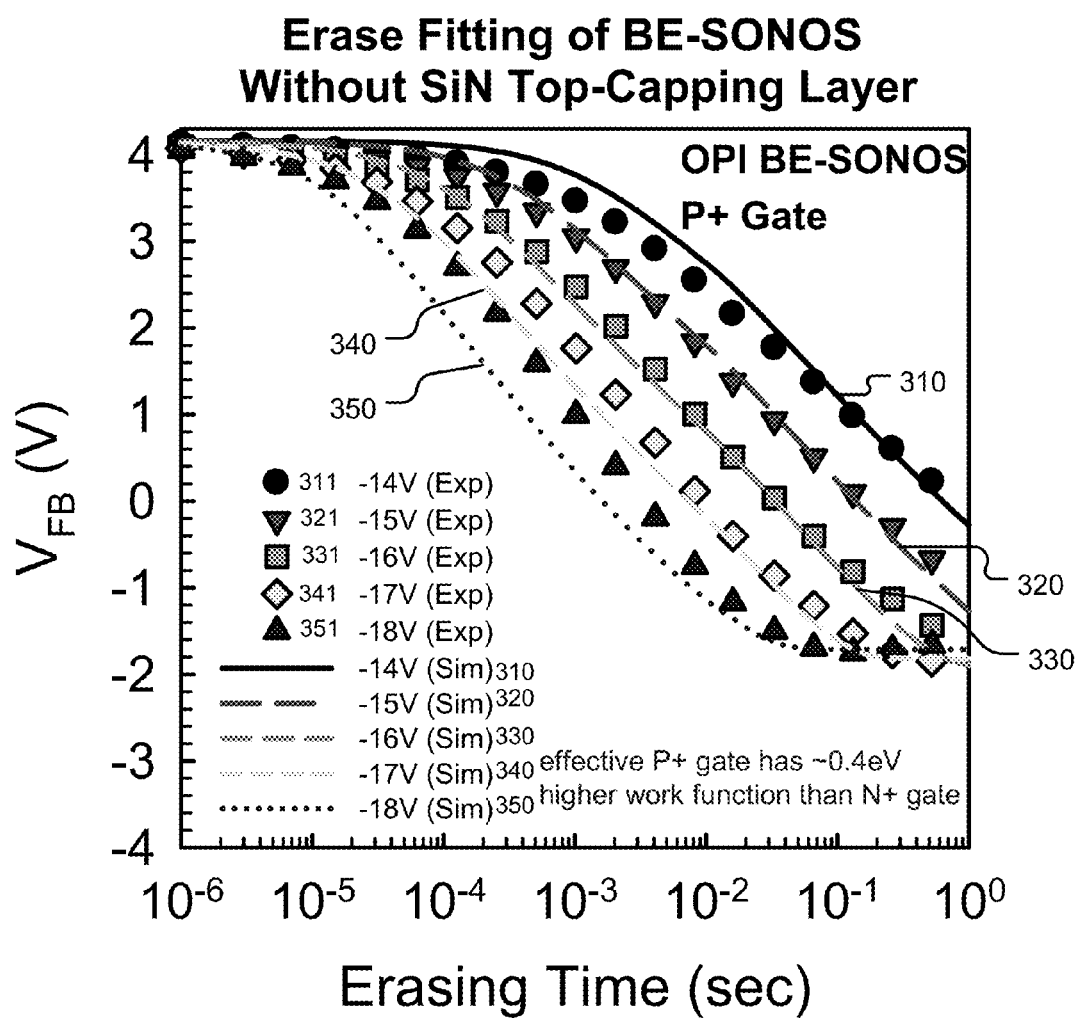
FIG. 3 is a graph of flat band voltage versus erase time for the memory cell of FIG. 1.
Figures 4, 5:
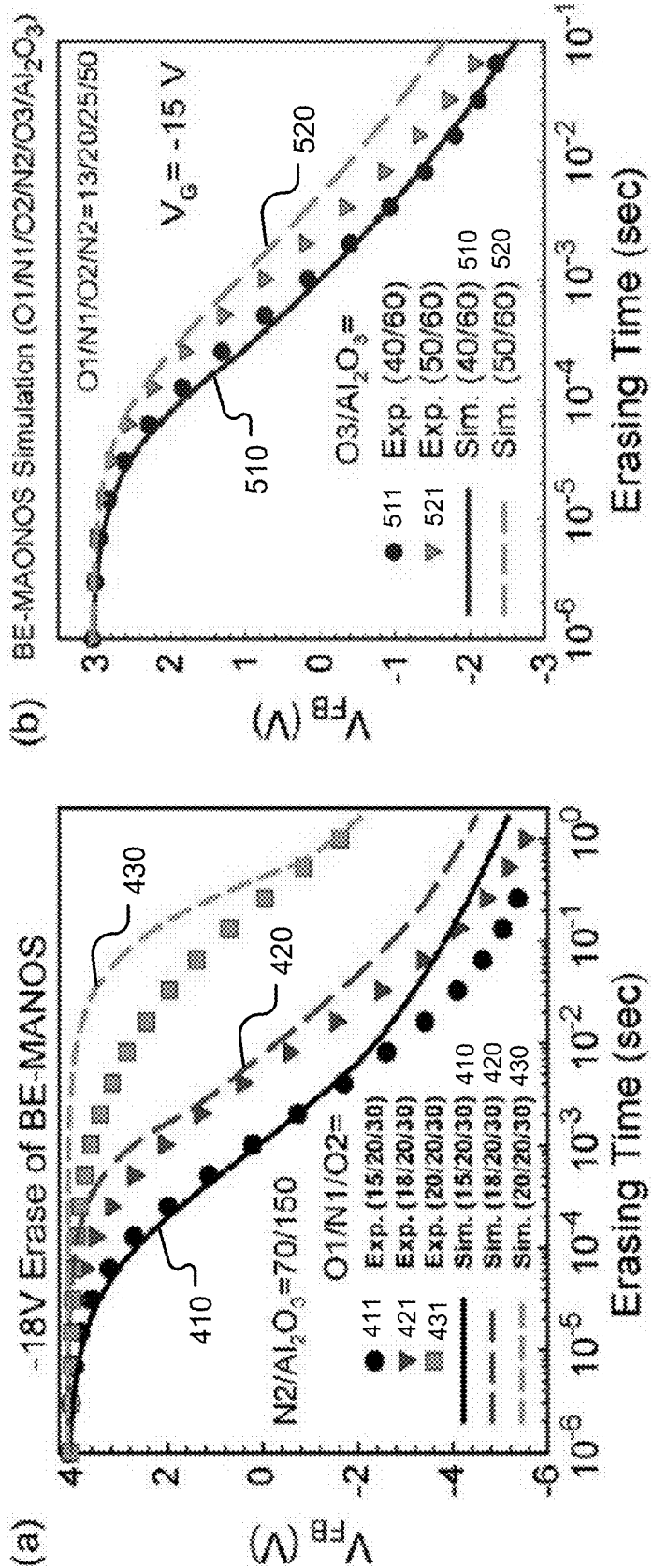
FIG. 4 is a graph of flat band voltage versus erase time for a variation of the memory cell of FIG. 2.
FIG. 5 is a graph of flat band voltage versus erase time for the memory cell of FIG. 2.
Figure 27:
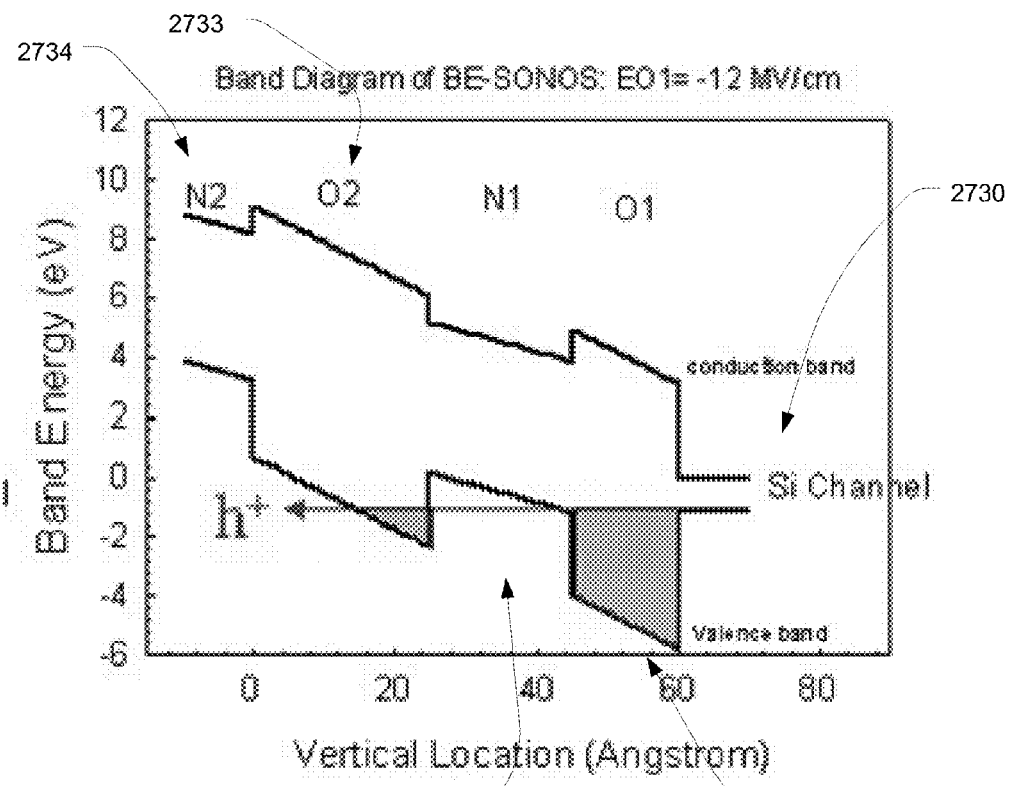
FIG. 27 is a band diagram for a tunneling dielectric layer including band offset technology at high electric fields.

FIG. 27 shows the band diagram for the dielectric tunneling structure under conditions of an electric field of about—12 MV/cm in the tunneling layer 2731, for the purposes of inducing hole tunneling (in FIG. 3, the O1 layer is about 15 Å thick). Under the electric field the valence band slopes upward from the channel surface. Therefore, at an offset distance from the channel surface the valence band in the tunneling dielectric structure increases in band energy level substantially, and in the illustration rises above the band energy in the valence band in the channel region; the edge of the valence band of layer 2632 has a higher band energy than the valence band in the channel 2630. Therefore, the hole tunneling probability is increased substantially as the area (shaded in FIG. 27) between the level of the valence band in the channel and above sloped, inverted U-shaped valence band in the tunneling stack is reduced. The band offset effectively eliminates the blocking function of the tunneling nitride layer in region 2732 and isolation layer in region 2733 from the tunneling dielectric during high electric field allowing a large hole tunneling current under relatively small electric fields (e.g. E<14 MV/cm).

The isolation layer 2733 isolates the tunneling nitride layer 2732 from a charge trapping layer 2734. This increases the effective blocking capability during low electric field for both electrons and holes, improving charge retention.

The tunneling nitride layer 2732 in this embodiment must be thin enough that it has negligible charge trapping efficiency. Also, the tunneling nitride layer is a dielectric, and not conductive. Thus, for an embodiment employing silicon nitride, the tunneling nitride layer should be less than 30 Å thick, and more preferably about 25 Å or less.

The hole tunneling layer 2731, for an embodiment employing silicon dioxide, should be less than 20 Å thick, and more preferably less than 15 Å thick. For example, in a preferred embodiment, the hole tunneling layer 2731 is silicon dioxide about 13 Å thick, and exposed to a nitridation process as mentioned above resulting in an ultrathin silicon oxynitride.

The tunneling dielectric layer can be implemented in embodiments of the present technology using a composite of silicon oxide, silicon oxynitride and silicon nitride without precise transitions between the layers, so long as the composite results in the required inverted U-shape valence band, having a change in valence band energy level at the offset distance from the channel surface needed for efficient hole tunneling. Also, other combinations of materials could be used to provide band offset technology.

The description of the dielectric tunneling layer focuses on "hole tunneling" rather than electron tunneling because the technology has solved the problems associated with the need to rely on hole tunneling in SONOS type memory. For example, a tunnel dielectric consisting of silicon dioxide which is thin enough to support hole tunneling at practical speeds, will be too thin to block leakage by electron tunneling. The effects of the engineering however, also improve performance of electron tunneling. So, both programming by electron tunneling and erasing by hole tunneling are substantially improved using band gap engineering.

Figure 28:
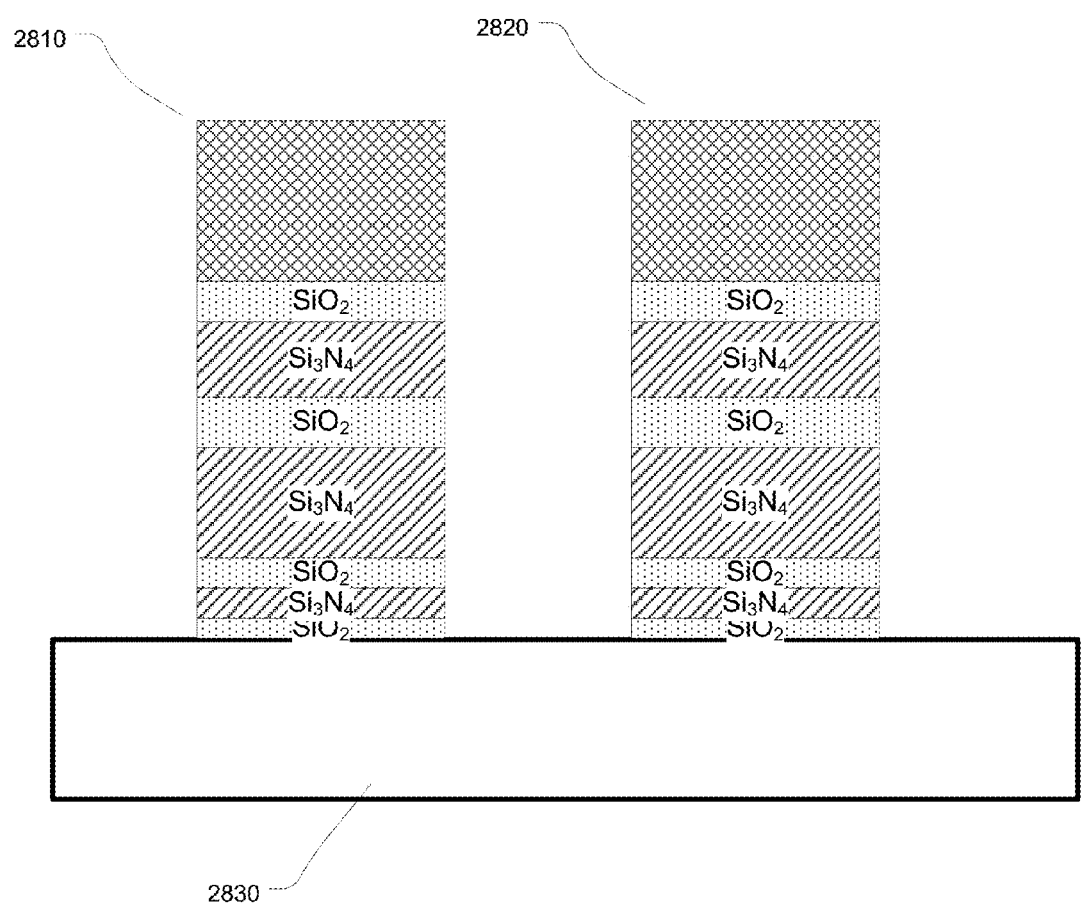
FIG. 28 is a simplified diagram of a 2D NAND array of BE-SONOS memory cells modified to include multiple nitride layers storing charge as well as the nitride layer in the multi-layer tunneling structure.

FIG. 28 is a simplified diagram of a 2D NAND array of BE-SONOS memory cells modified to include multiple nitride layers storing charge as well as the nitride layer in the multi-layer tunneling structure.

Shown is a part of a NAND string of BE-SONOS memory cells modified to include multiple nitride layers storing charge. Memory cells 2810 and 2820 are instances of the memory cell shown in FIG. 6. The memory cells 2810 and 2820 are on channel material 2830. The dielectric between adjacent memory cells 2810 and 2820 can be filled with insulating dielectric such as an oxide or an airgap to suppress leakage between adjacent word lines. The ONONONO layers can be discrete to each memory cell 2810 and 2820, or continuous between adjacent memory cells 2810 and 2820. The channel material between adjacent memory cells 2810 and 2820 can have a junction with various levels of doping, or be junction free.

Figure 29:
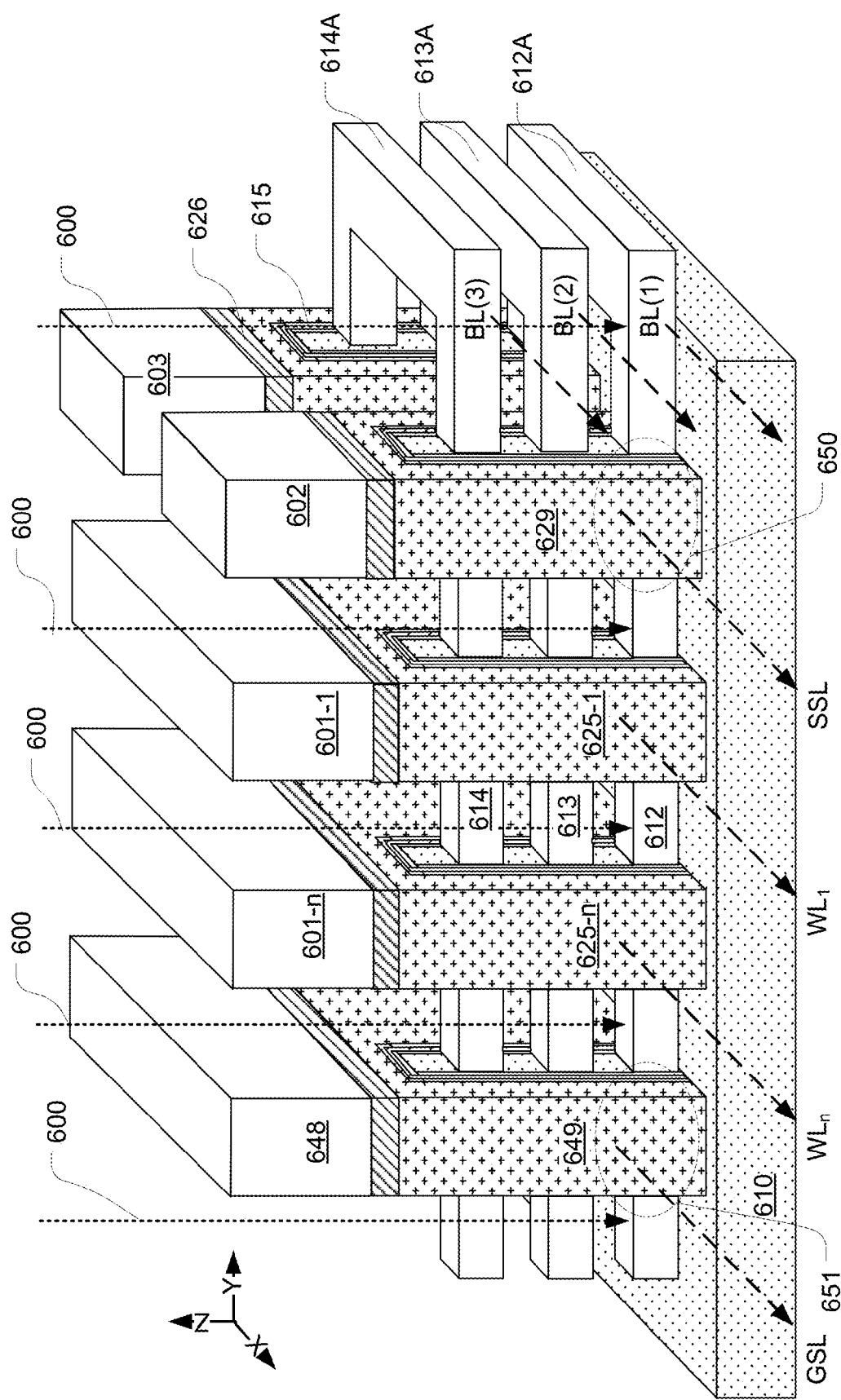
FIG. 29 is a simplified diagram of a 3D vertical gate array of BE-SONOS memory cells modified to include multiple nitride layers storing charge as well as the nitride layer in the multi-layer tunneling structure.

FIG. 29 is a simplified diagram of a 3D vertical gate array of BE-SONOS memory cells modified to include multiple nitride layers storing charge as well as the nitride layer in the multi-layer tunneling structure. FIG. 29 is a perspective view of a NAND flash array, showing the manner in which the semiconductor material strips are connected together in one decoding structure, and illustrating hard masks and an optional implant step. The perspective in FIG. 29 22 is rotated so that the Y- and Z-axes lie in the plane of the paper.

The insulating layers between the semiconductor material strips, in the ridge-shaped stacks are removed from the drawing to expose additional structure.

The multilayer array is formed on an insulating layer 610, and includes a plurality of conductive lines 625-1, . . . , 625-n conformal with the plurality of ridge-shaped stacks, and which act as word lines WLn, WLn–1, . . . WL1. The plurality of ridge-shaped stacks includes semiconductor material strips 612, 613, 614, which are coupled to the semiconductor material strips in the same plane in parallel ridge-shaped stacks by extensions 612A, 613A, 614A. These extensions 612A, 613A, 614A of the semiconductor material strips are oriented along the X-axis direction, coupled to the plurality of ridge-shaped stacks of semiconductor material strips. Also, as illustrated below, these extensions 612A, 613A, 614A extend beyond the edge of the array, and are arranged for connection to decoding circuitry to select planes within the array. These extensions 612A, 613A, 614A can be patterned at the same time that the plurality of ridge-shaped stacks are defined, or previously when the alternating layers of semiconductor material and insulator material are formed.

In some embodiments, the extensions 612A, 613A, 614A form a staircase structure that terminates the semiconductor material strips 612, 613, 614. These extensions 612A, 613A, 614A can be patterned at the same time that the plurality of ridge-shaped stacks are defined.

A layer of memory material 615, which includes a multi-layer charge trapping structure ONONONO, separates the conductive lines 625-1 through 625-n, from the semiconductor material strips 612-614 as described in detail above.

Transistors, e.g. transistor 650, are formed between the extensions 612A, 613A, 614A and the conductive line 625-1. Also, transistors, e.g. transistor 651, are formed at opposite ends of the semiconductor material strips for controlling connection of sectors of the array to a common source line (not shown). In the transistors 650, 651, the semiconductor material strip (e.g. 612) acts as the channel region of the device. Gate structures (e.g. 629, 649) are patterned during the same step in which the conductive lines 625-1 through 625-n are defined. The GSL select line 649 can be oriented along a row, across a plurality of the ridge-shaped stacks of semiconductor material strips. A layer of silicide 626 can be formed along the top surface of the conductive lines, and over the gate structures 629, 649. The layer of memory material 615 can act as the gate dielectric for the transistors. These transistors 650, 651 act as select gates coupled to decoding circuitry for selecting sectors and columns along the ridge-shaped stacks in the array.

An optional manufacturing step includes forming hard masks 601-1 through 601-n over the plurality of conductive lines, hard mask 648 over GSL select line 649 and hard masks 602 and 603 over the gate structures 629. The hard masks can be formed using relatively thick layers of silicon nitride or other material which can block ion implantation processes. After the hard masks are formed, an implant 600 of n-type or p-type dopants, depending on the implementation chosen, can be applied to increase the doping concentration in the semiconductor material strips 612-614, and in the extensions 612A-614A, and thereby reduce the resistance of the current path along the semiconductor material strips. Also, dopants having a conductivity type opposite that of the bulk semiconductor material strip (e.g. n-type implants, assuming a p-type semiconductor material strip) can be applied to form doped source/drain junctions along the semiconductor material strips if desired. By utilizing controlled implant energies, the implants can be caused to penetrate to the bottom semiconductor material strip 612, and each overlying semiconductor material strip in the stacks.

To program a selected memory cell, in this embodiment, the selected word line can be biased with +20 Volts, the unselected word lines can be set at +10 Volts, the selected bit line can be set at 0 Volts, the unselected bit lines can be set at 0 Volts, the selected SSL line can be set at 3.3 volts, and the unselected SSL lines and the GSL line can be set at 0 Volts. To read a selected cell, in this embodiment, the selected word line can be biased with a read reference voltage, the unselected word lines can be set at 6 Volts, the selected bit line can be set at 1 Volt, the unselected bit lines can be set at 0 Volts, the selected SSL line can be set at 3.3 volts, and the unselected SSL lines can be set at 0 Volts.

Figure 30:
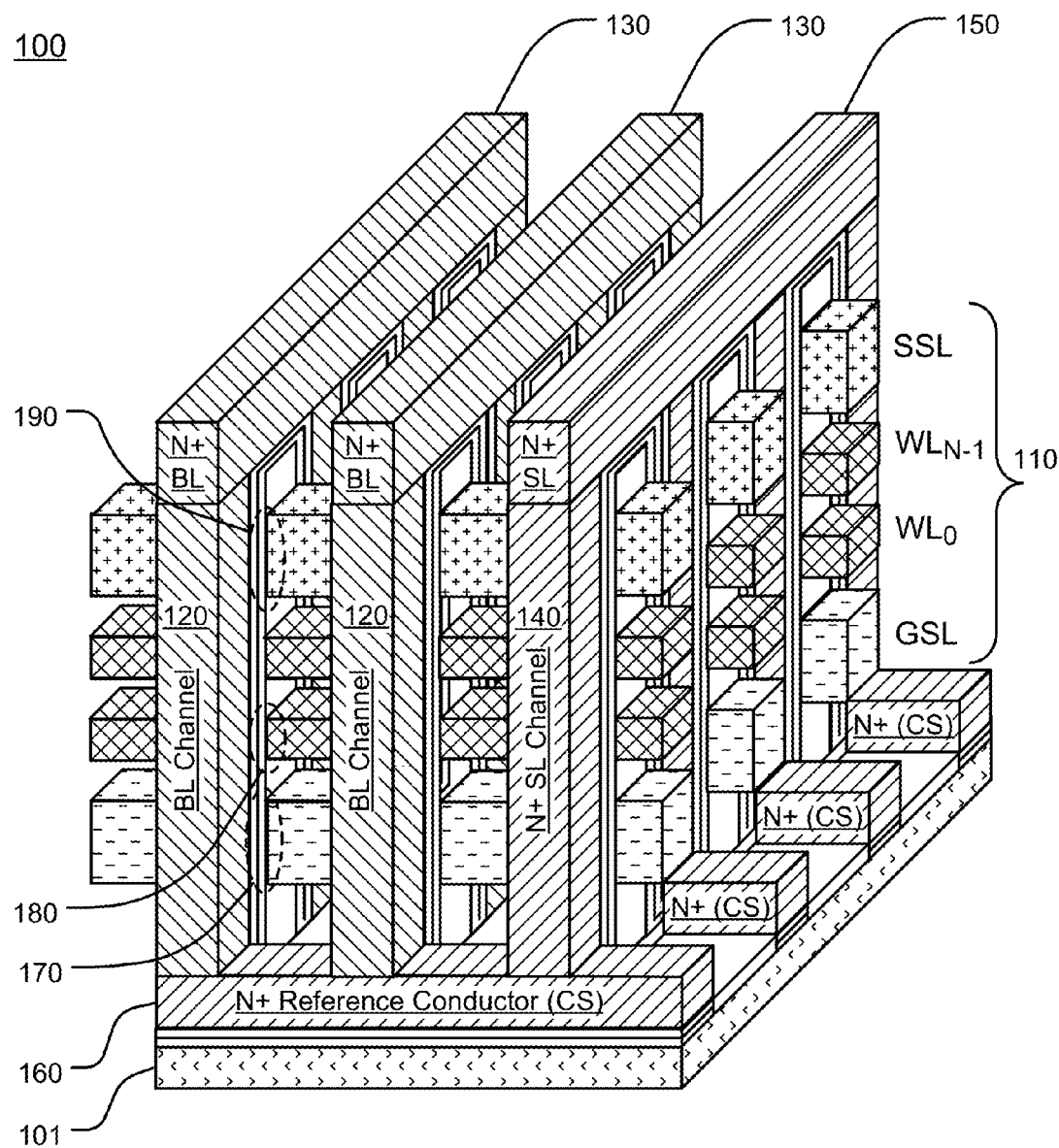
FIG. 30 is a simplified diagram of a 3D double-gate vertical channel array of BE-SONOS memory cells modified to include multiple nitride layers storing charge as well as the nitride layer in the multi-layer tunneling structure.

FIG. 30 is a schematic diagram of a three-dimensional (3D) memory device 100. The memory device 100 includes an array of NAND strings of memory cells, and can be a double-gate vertical channel memory array (DGVC). The memory device 100 includes an integrated circuit substrate, and a plurality of stacks of conductive strips separated by insulating material, including at least a bottom plane of conductive strips (GSL), a plurality of intermediate planes of conductive strips (WLs), and a top plane of conductive strips (SSLs). In the example shown in FIG. 1, a stack 110 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on.

The plurality of bit line structures are arranged orthogonally over, and have surfaces conformal with, the plurality of stacks, including inter-stack semiconductor body elements 120 between the stacks and linking elements 130 over the stacks connecting the inter-stack semiconductor body elements 120. The linking elements 130 in this example comprise a semiconductor, such as polysilicon, having a relatively high doping concentration so that they have higher conductivity than the inter-stack semiconductor body elements 120, which are configured to provide channel regions for the cells in the stacks.

The memory device includes ONONONO structures in interface regions at cross-points 180 between side surfaces of the conductive strips in the plurality of intermediate planes (WLs) in the stacks and the inter-stack semiconductor body elements 120 of the plurality of bit line structures. In the illustrated example, the memory cells in the cross-points 180 are configured in vertical, dual-gate NAND strings, where the conductive strips on both sides of a single inter-stack semiconductor body element behave as dual-gates, and can be operated cooperatively for read, erase and program operations.

A reference conductor 160 is disposed between the bottom plane (GSL) of conductive strips and the integrated circuit substrate (not shown). At least one reference line structure is arranged orthogonally over the plurality of stacks, including inter-stack vertical conductive elements 140 between the stacks in electrical communication with the reference conductor 160, and linking elements 150 over the stacks 110 connecting the inter-stack vertical conductive elements 140. The inter-stack vertical conductive elements 140 can have a higher conductivity than the inter-stack semiconductor body elements 120.

The memory device includes string select switches 190 at interface regions with the top plane of conductive strips, and reference select switches 170 at interface regions with the bottom plane (GSL) of conductive strips. The dielectric layers of the charge storage structure can act as gate dielectric layers for the switches 170, 190 in some examples.

The memory device includes a first overlying patterned conductive layer (not shown) connected to the plurality of bit line structures, including a plurality of global bit lines coupled to sensing circuits. The memory device also includes a second overlying conductive layer (not shown), which can be patterned, and can be above or below the first patterned conductor layer. The second overlying conductive layer is connected to the at least one reference line structure, such as by contact to the linking element 150. The second patterned conductor layer can connect the at least one reference line structure to a reference voltage source, or to circuitry for providing a reference voltage.

In the example shown in FIG. 30, the linking elements 130 of the bit line structures include N doped semiconductor material. The inter-stack semiconductor body elements 120 of the bit line structures include lightly doped semiconductor material. In the example shown in FIG. 30, the reference conductor 160 includes N doped semiconductor material, and the linking elements 150 of the at least one reference line structure include N doped semiconductor material. The inter-stack vertical conductive elements 140 of the at least one reference line structure also include N doped semiconductor material. In alternative implementations a metal or metal compound can be used in place of the doped semiconductors.

In one embodiment, in order to reduce the resistance of the reference conductor 160, the memory device can include a bottom gate 101 near the reference conductor 160. During read operations, the bottom gate 101 can be turned on by a suitable pass voltage applied to an underlying doped well or wells in the substrate, or other underlying patterned conductor structures, to increase the conductivity of the reference conductor 160.

Figure 31:
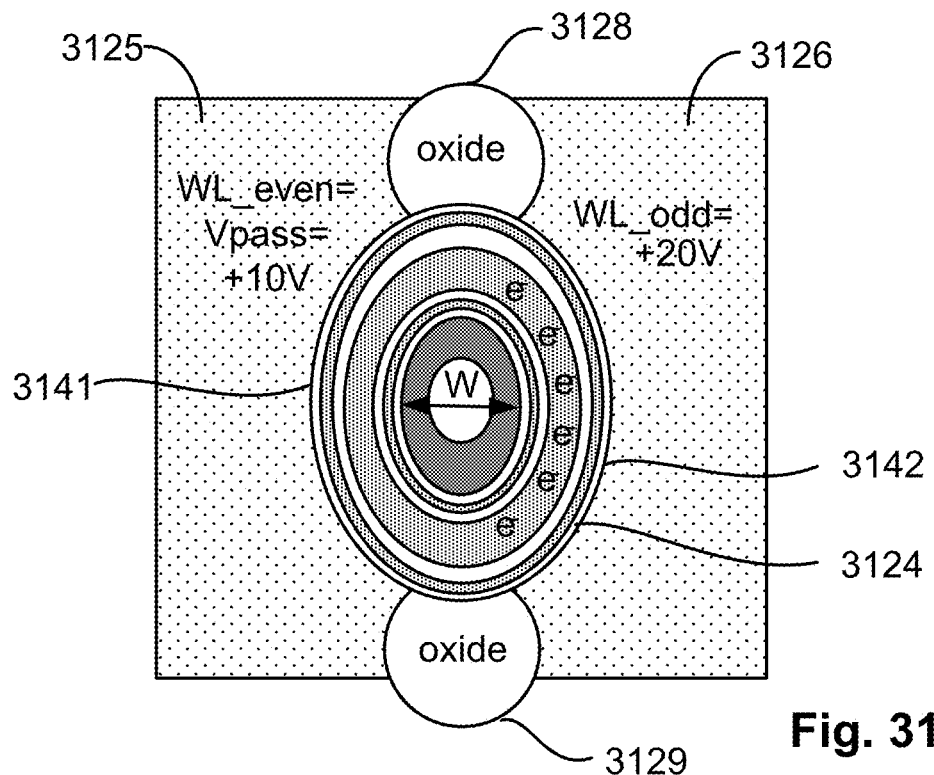
FIG. 31 is a simplified diagram of a BE-SONOS memory cell modified to include multiple nitride layers storing charge as well as the nitride layer in the multi-layer tunneling structure, in a pipe-shaped double gate arrangement.

FIG. 31 is a simplified diagram of a BE-SONOS memory cell modified to include multiple nitride layers storing charge as well as the nitride layer in the multi-layer tunneling structure to form an ONONONO structure, in a pipe-shaped double gate arrangement. In the embodiment's horizontal cross-section, the outside surface of silicon oxide layer 3124 in this example, contacts the even word line 3125 along a first arcuate edge 3141, and contacts the odd word line 3126 along a second arcuate edge 3142. An increased average radius of curvature of the first and second arcuate edges 3141, 3142 can substantially reduce field enhancement between the word lines and proximate semiconductor material, and improve read and program disturb performance significantly for the device.

Embodiments of the independent double gate memory structure can comprise cross-sections that are square, rectangular, circular and/or other shapes at one or more of the word line layers.

Figure 32:
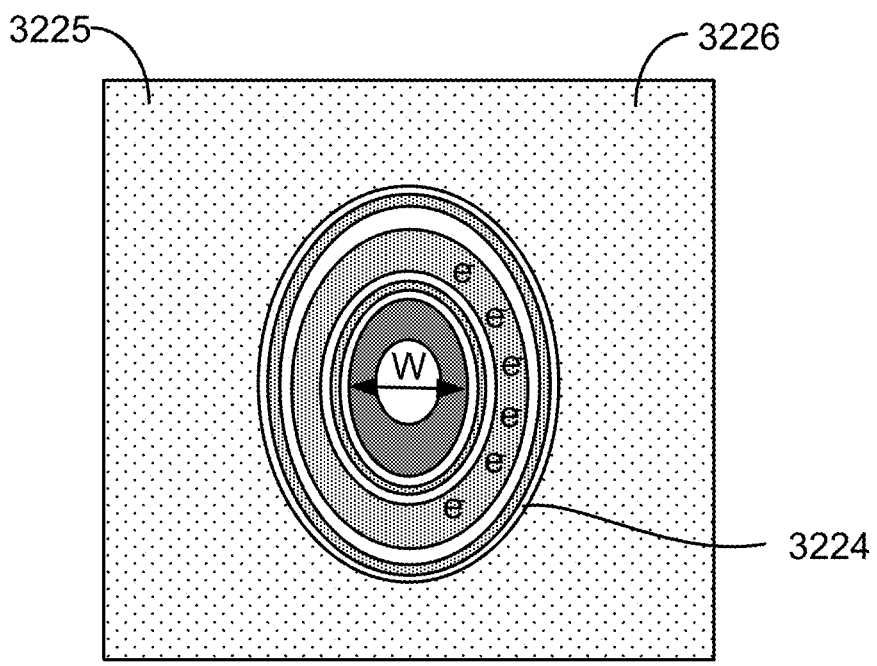
FIG. 32 is a simplified diagram of a BE-SONOS memory cell modified to include multiple nitride layers storing charge as well as the nitride layer in the multi-layer tunneling structure, in a "gate all around" arrangement.

FIG. 32 is a simplified diagram of a BE-SONOS memory cell modified to include multiple nitride layers storing charge as well as the nitride layer in the multi-layer tunneling structure, in a "gate all around" arrangement.

The memory cell of FIG. 32 is similar to FIG. 31. However, the word lines are not divided into odd and even word lines by oxides.

U.S. patent application Ser. No. 14/284,306 is incorporated by reference. The multiple charge storage layer cells described herein can be used with the memory devices disclosed in U.S. patent application Ser. No. 14/284,306.

Figure 33:
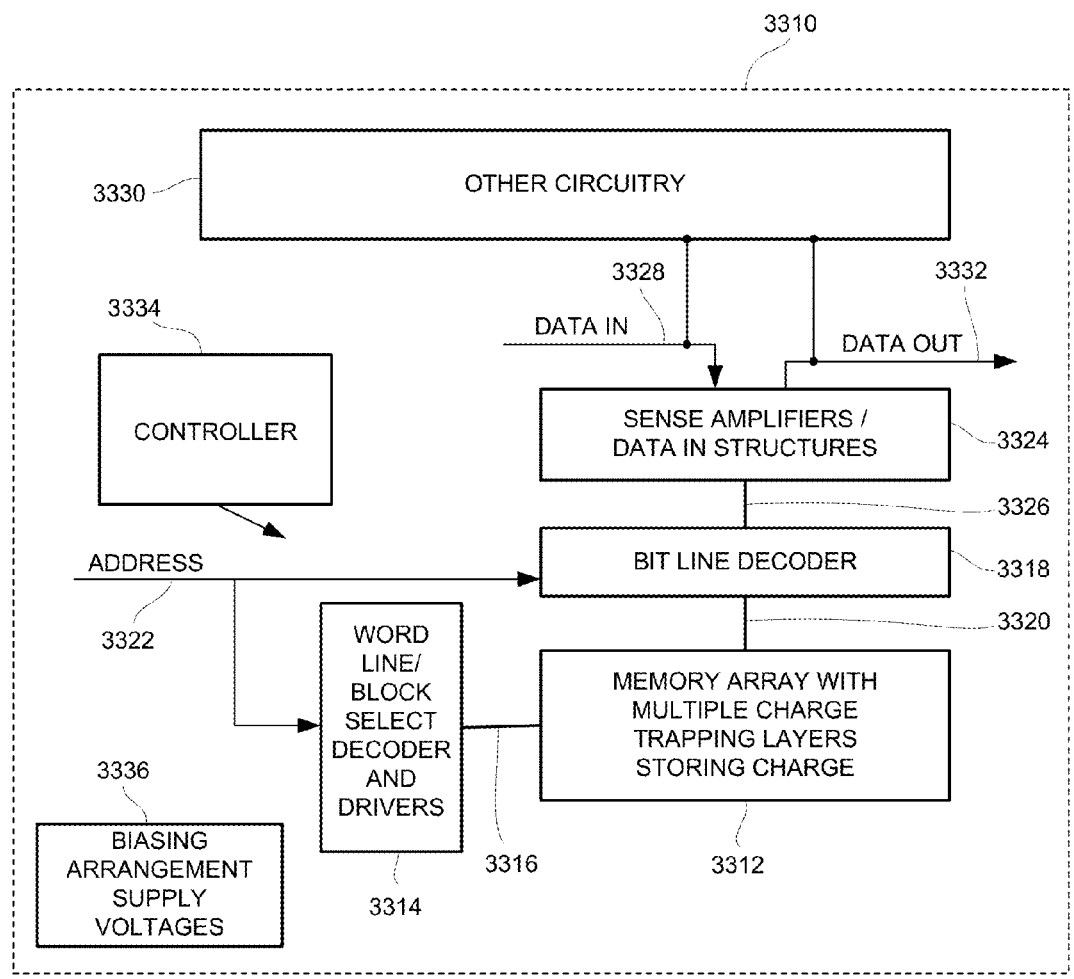
FIG. 33 is a block diagram of an integrated circuit memory employing memory cells and bias circuitry according to embodiments of the technology.

FIG. 33 is a simplified block diagram of an integrated circuit employing blocking dielectric engineered BE-SONOS memory cells as described herein having multiple charge storage nitride layers and a bandgap engineered tunneling dielectric layer. The integrated circuit 3310 includes a memory array 3312 implemented using blocking dielectric engineered BE-SONOS memory cells as described herein on a semiconductor substrate. A word line (or row) and block select decoder 3314 are coupled to, and in electrical communication with, a plurality 3316 of word lines and block select lines, and arranged along rows in the memory array 3312. A bit line (column) decoder and drivers 3318 are coupled to and in electrical communication with a plurality of bit lines 3320 arranged along columns in the memory array 3312 for reading data from, and writing data to, the memory cells in the memory array 3312. Addresses are supplied on bus 3322 to the word line decoder and drivers 3314 and to the bit line decoder 3318. Sense amplifiers and data-in structures in block 3324, including current sources for the read, program and erase modes, are coupled to the bit line decoder 3318 via data bus 3326. Data is supplied via the data-in line 3328 from input/output ports on the integrated circuit 3310 or from other data sources internal or external to the integrated circuit 3310, to the data-in structures in block 3324. In the illustrated embodiment, other circuitry 3330 is included on the integrated circuit 3310, such as a general purpose processor or special purpose application circuitry, or a combination of modules providing system-on-a-chip functionality supported by the memory cell array. Data is supplied via the data-out line 3332 from the sense amplifiers in block 3324 to input/output ports on the integrated circuit 3310, or to other data destinations internal or external to the integrated circuit 3310.

The array 3312 can be a NAND array, an AND array or a NOR array, depending on the particular application. The very large memory window available supports storing multiple bits per cell, and thus multiple bit sense amplifiers can be included on the device.

A controller implemented in this example, using bias arrangement state machine 3334, controls the application of bias arrangement supply voltages and current sources 3336, such as read, program, erase, erase verify, program verify voltages or currents for the word lines and bit lines, and controls the word line/source line operation using an access control process. The controller applies a selected one of multiple bias arrangements. The program bias arrangement programs data by moving electrons from the channel surface, through the multi-layer tunneling structure including the first tunneling nitride layer, to the first charge storage nitride layer. The erase bias arrangement erases data by moving holes from the channel surface to the first charge storage nitride layer, and uses stored electrons in the second charge storage nitride layer to block additional electrons from moving into the first charge storage nitride layer The controller 3334 can be implemented using special purpose logic circuitry as known in the art. In alternative embodiments, the controller 3334 comprises a general purpose processor, which may be implemented on the same integrated circuit, which executes a computer program to control the operations of the device. In yet other embodiments, a combination of special-purpose logic circuitry and a general-purpose processor may be utilized for implementation of the controller 3334.

Figure 34:
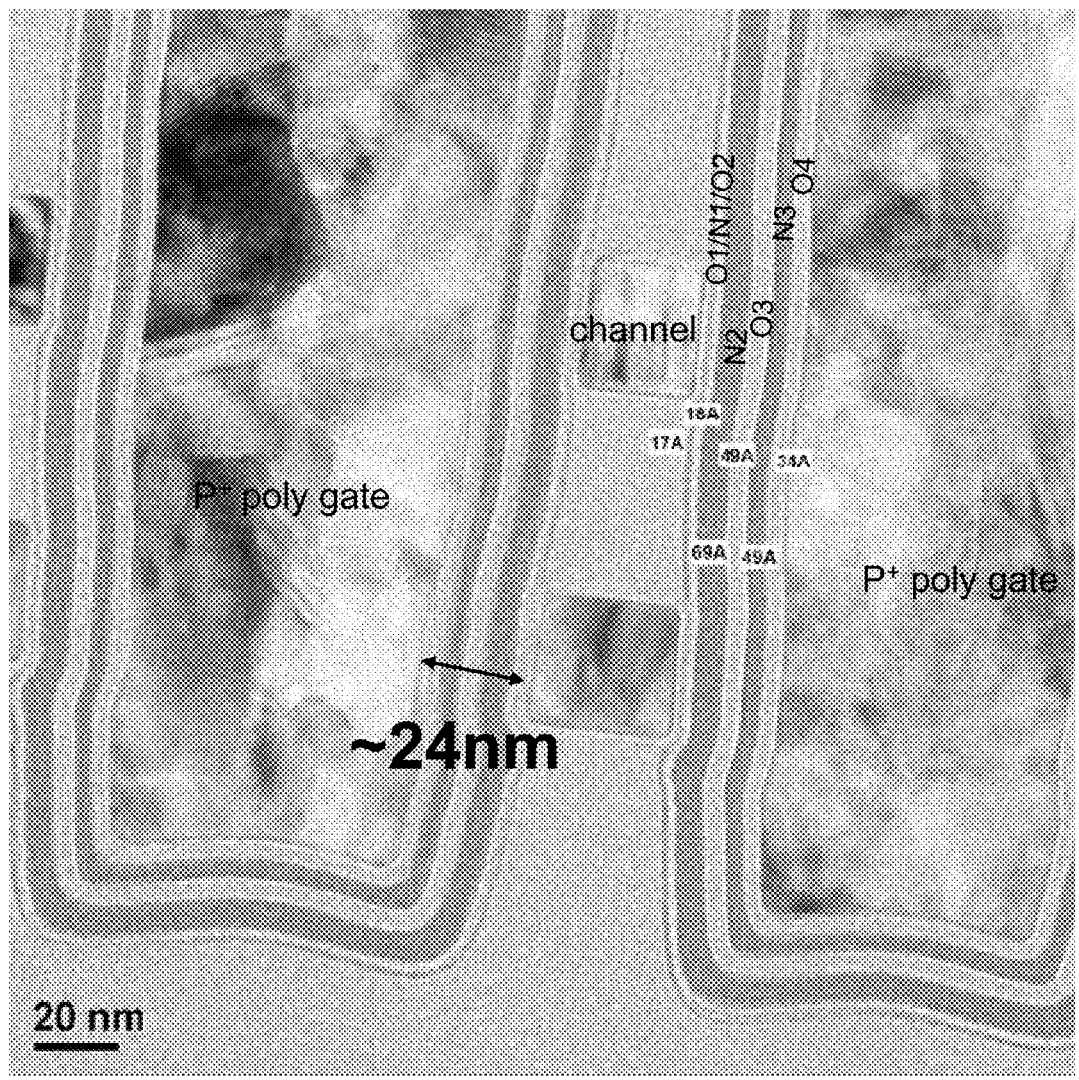
FIG. 34 is a picture of a BE-SONOS memory cell modified to include multiple nitride layers storing charge as well as the nitride layer in the multi-layer tunneling structure, in a 3D vertical gate array such as FIG. 29.

FIG. 34 is a picture of a BE-SONOS memory cell modified to include multiple nitride layers storing charge as well as the nitride layer in the multi-layer tunneling structure, in a 3D vertical gate array such as FIG. 29. O1/N1/O2/N2/O3/N3/O4 thicknesses are 10 Å/17 Å/18 Å/69 Å/49 Å/49 A/34 Å. Overall thickness is about 24 nm.

Figure 35:
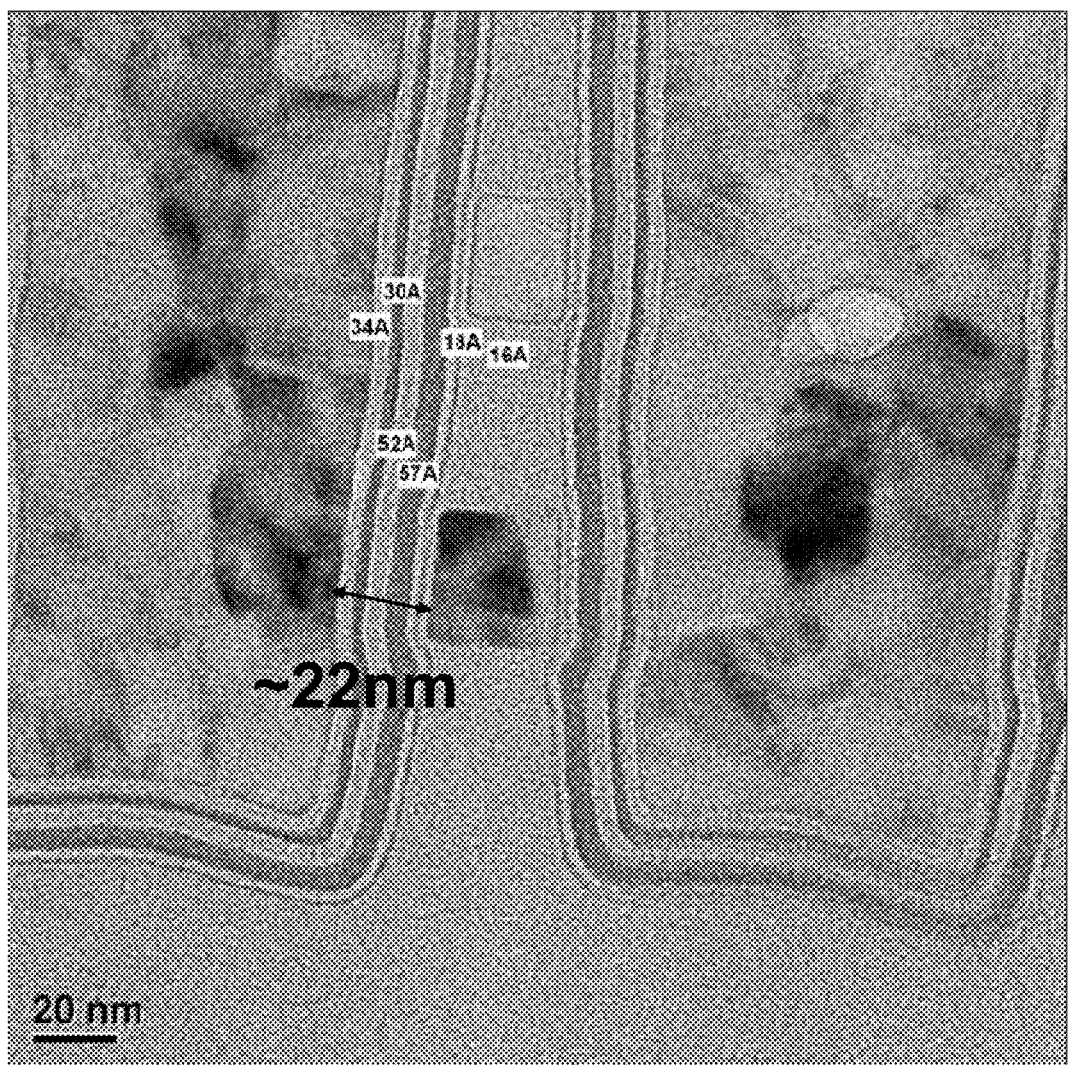
FIG. 35 is a picture of a BE-SONOS memory cell modified to include multiple nitride layers storing charge as well as the nitride layer in the multi-layer tunneling structure, in a 3D vertical gate array such as FIG. 29, with different layer thicknesses.

FIG. 35 is a picture of a BE-SONOS memory cell modified to include multiple nitride layers storing charge as well as the nitride layer in the multi-layer tunneling structure, in a 3D vertical gate array such as FIG. 29, with different layer thicknesses.

O1/N1/O2/N2/O3/N3/O4 thicknesses are 10 Å/16 Å/18 Å/57 Å/52 Å/30 Å/34 Å. Overall thickness is about 22 nm.

Figure 36:
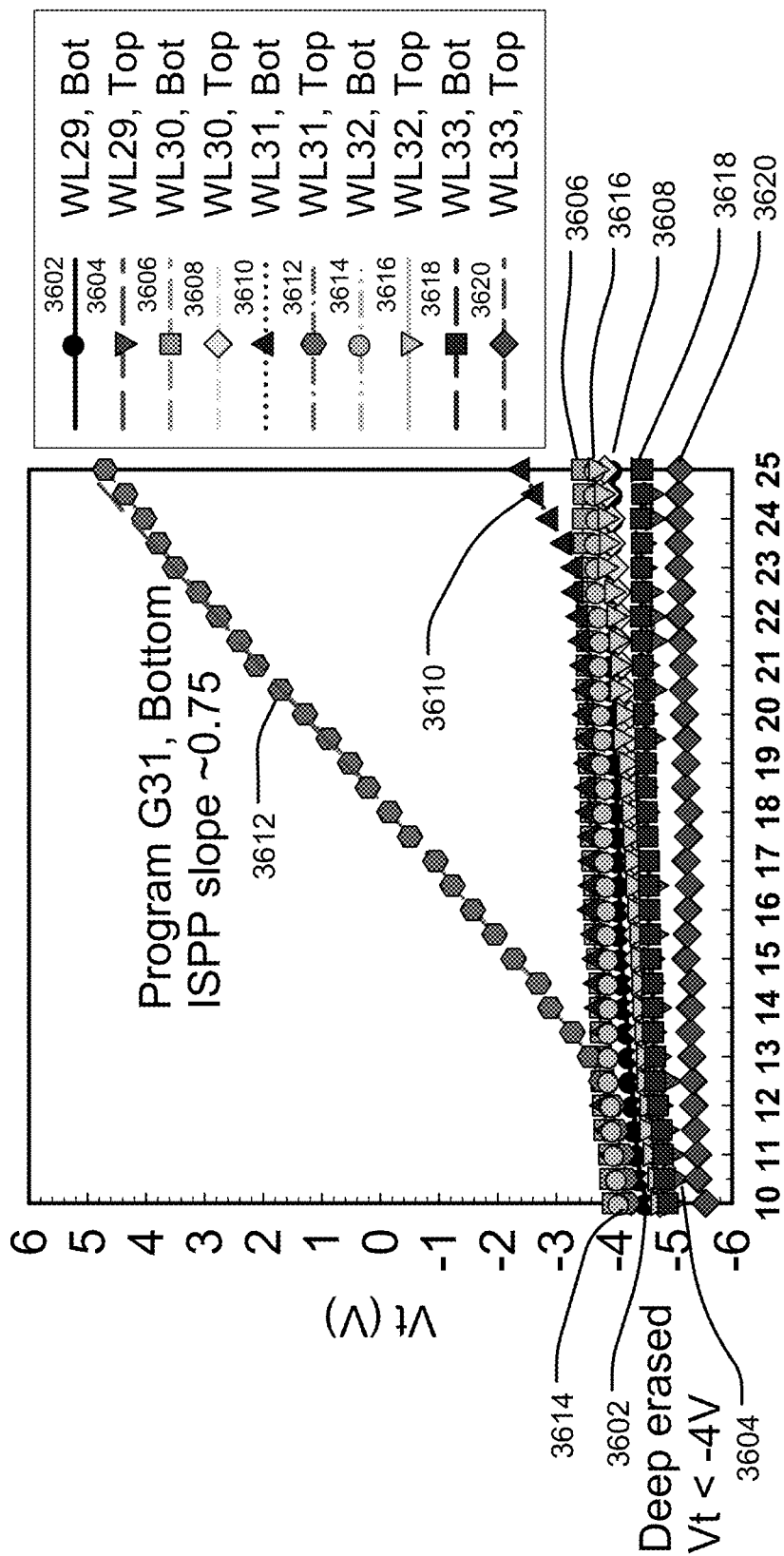
FIG. 36 is a graph of threshold voltage versus programming voltage for memory cells of FIG. 34.

FIG. 36 is a graph of threshold voltage versus programming voltage for memory cells of FIG. 34. Memory cell 3612 is programmed with an ISPP slope of 0.75. Program inhibit is shown, as the remaining memory cells 3602, 3604, 3606, 3608, 3610, 3614, 3616, 3618, 3620, that are not selected exhibit little change in threshold voltage. The program inhibit boosted channel voltage was 9V.

Figure 37:
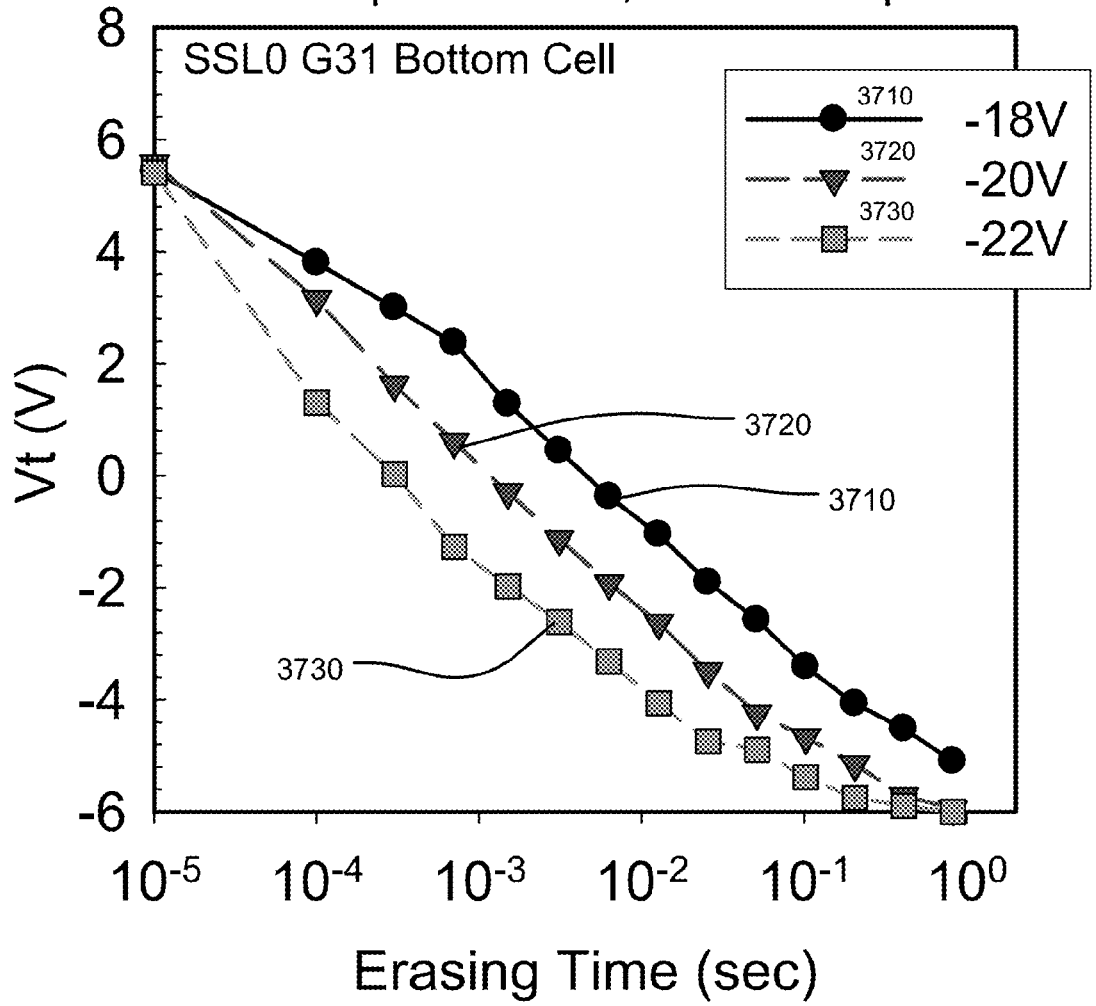
FIG. 37 is a graph of threshold voltage versus erase time for memory cells of FIG. 34.

FIG. 37 is a graph of threshold voltage versus erase time for memory cells of FIG. 34. In FIG. 37, a memory cell is erased at gate voltages of −18V 3710, −20V 3720, and −22V 3730. In FIG. 37, a memory cell demonstrates a memory window of about 12 V, between 6V and −6V. Erase saturation occurred with a deep erase of at about −6V. 3DVG NAND erase is slowed by gate induced drain leakage (GIDL)-induced erase that limits the channel hole generation speed.

Figure 38:
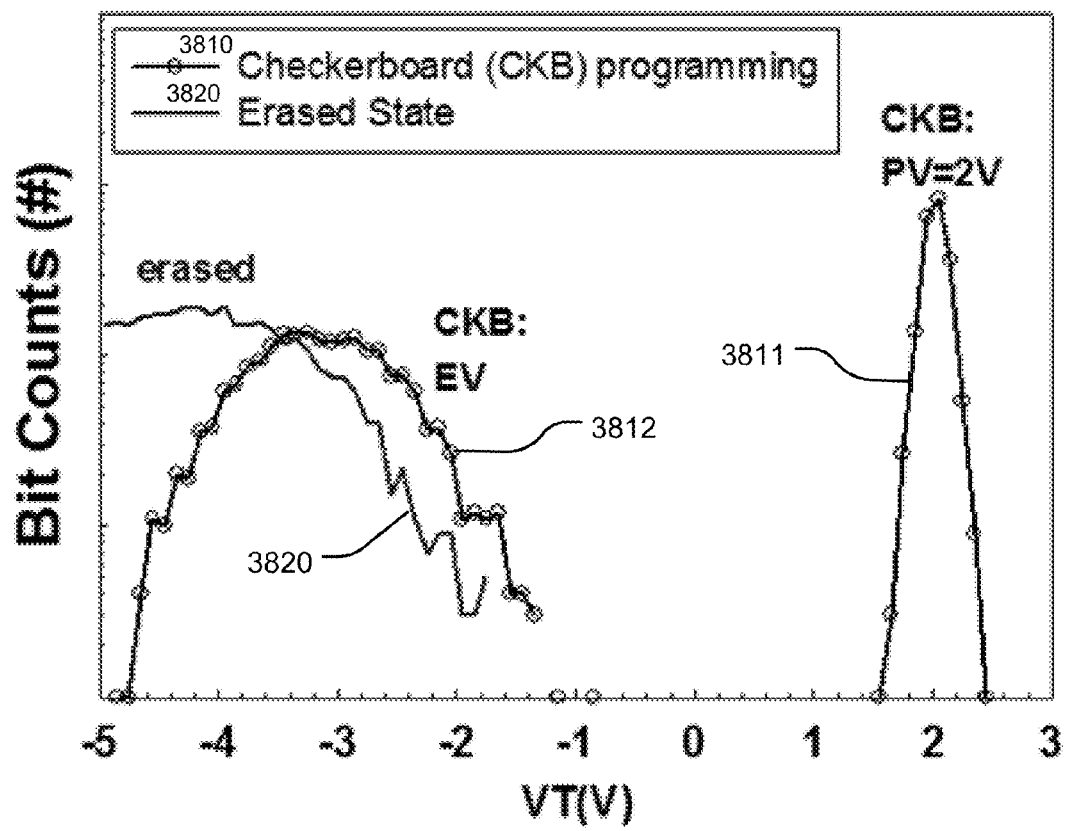
FIG. 38 is a graph of threshold voltage window versus memory cell count for memory cells of FIG. 34.

FIG. 38 is a graph of threshold voltage window versus memory cell count for memory cells of FIG. 34.

Shown are the bit distributions for checkerboard programming 3810 and the erased state 3820. The checkerboard programming cells are in an erase voltage distribution 3812 and a program voltage distribution 3811. Also shown are the erased bits 3820.

Figure 39:
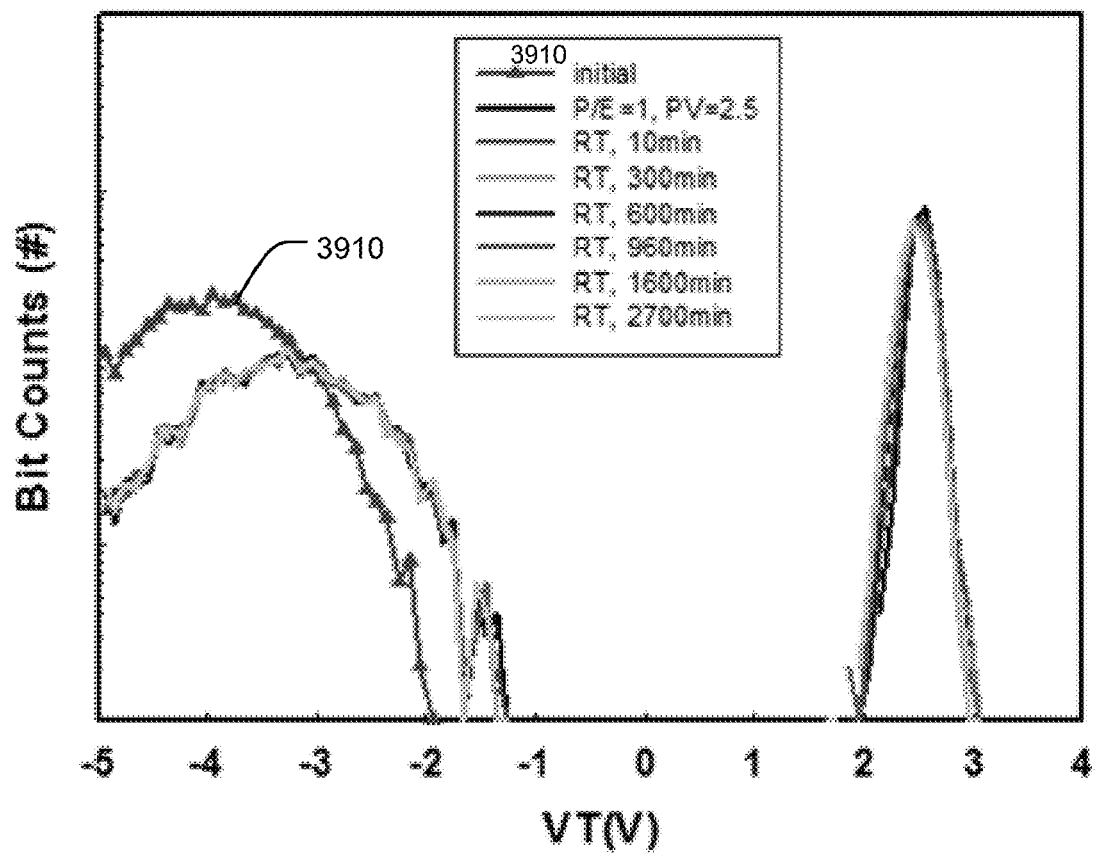
FIG. 39 is a graph of threshold voltage window versus memory cell count for memory cells of FIG. 34, showing retention times.

FIG. 39 is a graph of threshold voltage window versus memory cell count for memory cells of FIG. 34, showing retention times.

After the initial distribution 3910, the bit count distributions showing retention at various times are substantially identical—a program and erase distribution with a program voltage of 2.5 V, and retention time distributions at 10 minutes, 300 minutes, 600 minutes, 960 minutes, 1600 minutes, and 2700 minutes.

Figure 40:
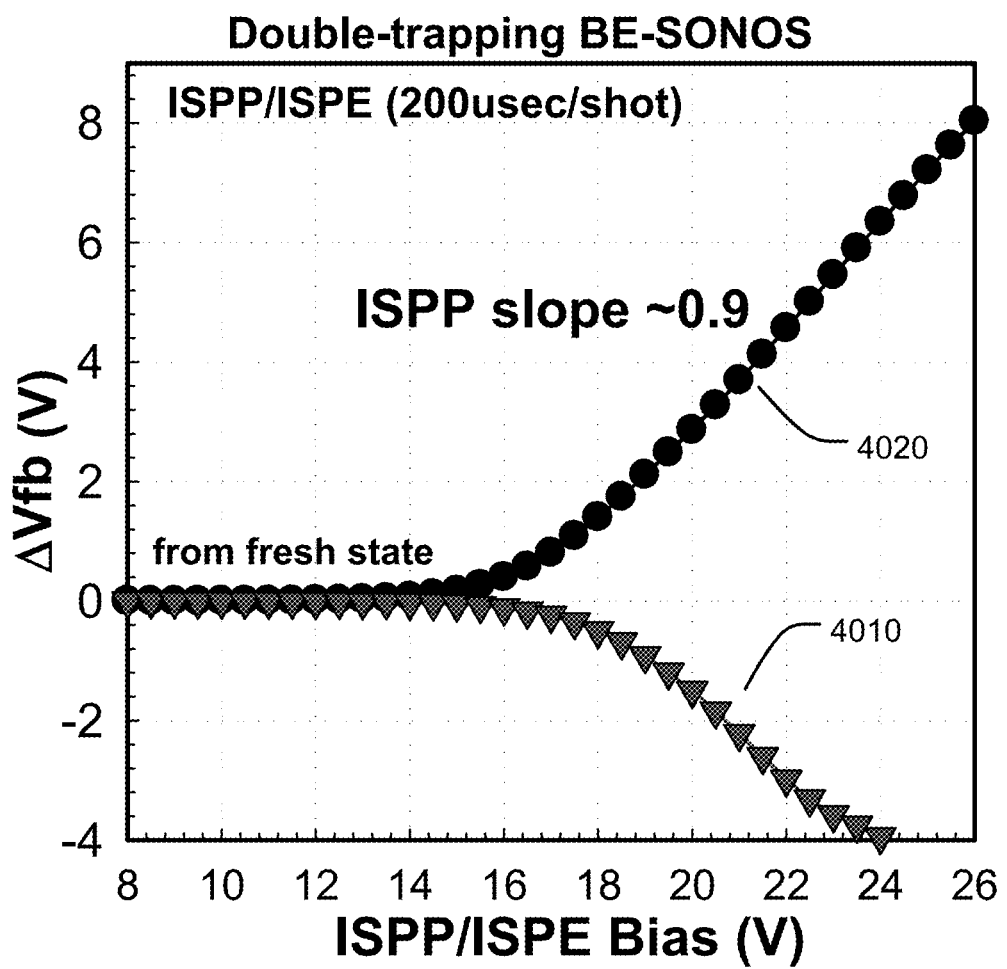
FIG. 40 is an experimental graph of flat band voltage versus erase voltage and programming voltage for an embodiment of the memory cell of FIG. 6.

FIG. 40 is a graph of flat band voltage versus erase voltage and programming voltage for an embodiment of the memory cell of FIG. 6.

Program and erase operations are performed on a SONOS memory cell modified with multiple charge storage nitride layers, with a p+ polysilicon gate, and O1/N1/O2/N2/O3/N3/O4 thicknesses of about 1 nm/1.5 nm/2 nm/5.5 nm/5.5 nm/4 nm/4 nm.

An ISPP program operation with program pulse of 200 μsec results in experimental curve 4020, with a slope of about 0.9. An ISPE erase operation with erase pulse of 200 μsec results in experimental curve 4010. Both the ISPP program operation and the ISPE erase operation are from a memory cell in a fresh state prior to erase or program.

Figure 41:
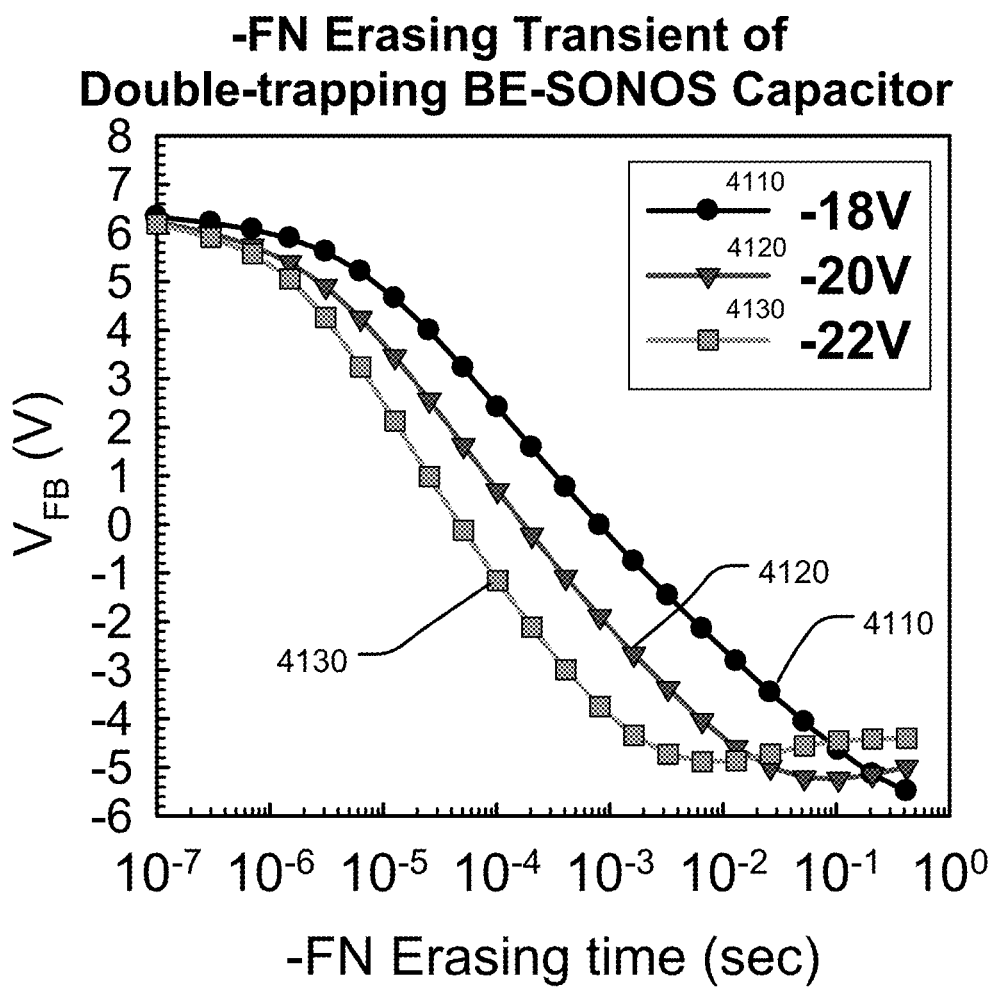
FIG. 41 is an experimental graph of flat band voltage versus erase time an embodiment of the memory cell of FIG. 6.

FIG. 41 is a graph of flat band voltage versus erase time an embodiment of the memory cell of FIG. 6.

Erase operations are performed on a SONOS memory cell modified with multiple charge storage nitride layers, with a p+ polysilicon gate, and O1/N1/O2/N2/O3/N3/O4 thicknesses of about 1 nm/1.5 nm/2 nm/5.5 nm/5.5 nm/4 nm/4 nm. An erase operation with a gate voltage of −18 V results in experimental curve 4110. An erase operation with a gate voltage of −20 V results in experimental curve 4120. An erase operation with a gate voltage of −22 V results in experimental curve 4130. A flatband voltage of less than −4 V is reached within 1 millisecond with a gate voltage of −22 V. Erase saturation is observed for $V_{FB}$<−5 V. Compared with prior technology without multiple charge storage nitride layers, the erase saturation is improved (lowered) by more than 3V.

Figure 42:
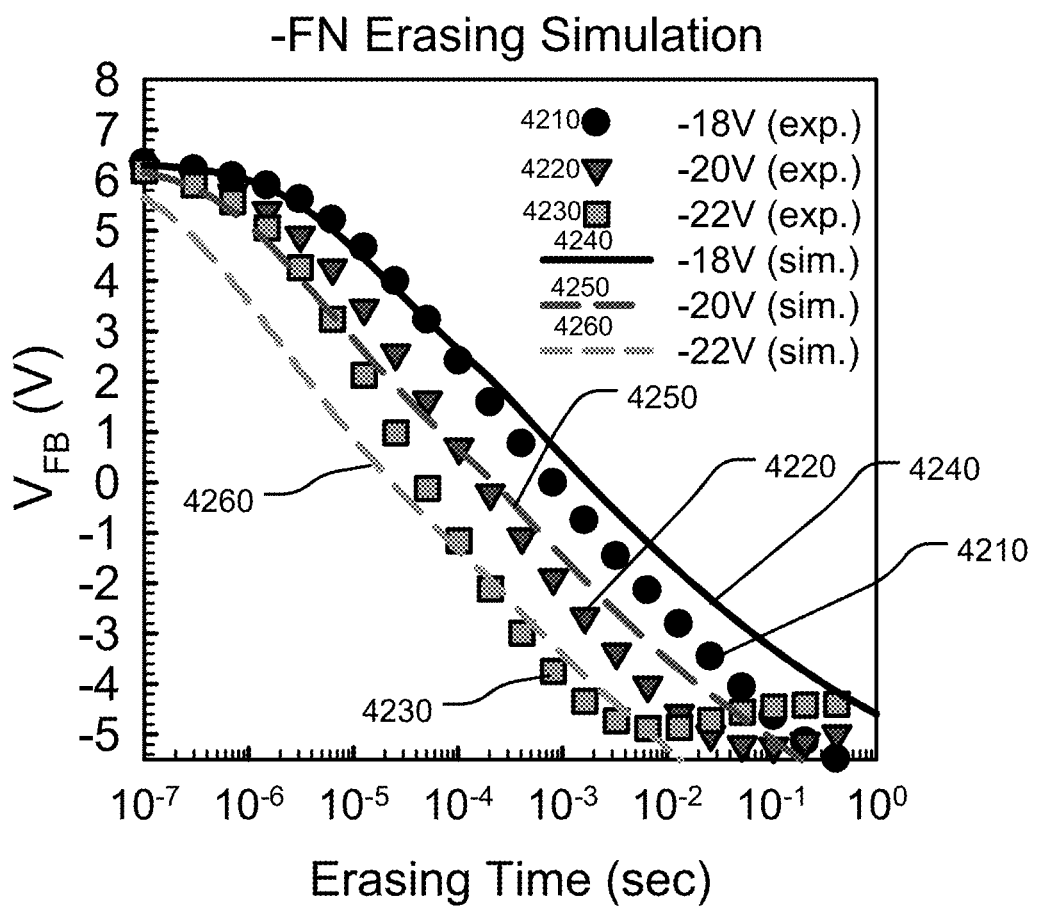
FIG. 42 is a simulated graph of flat band voltage versus erase time an embodiment of the memory cell of FIG. 6.

FIG. 42 is a simulated graph of flat band voltage versus erase time an embodiment of the memory cell of FIG. 6.

Erase operations are performed on a SONOS memory cell modified with multiple charge storage nitride layers, with a p+ polysilicon gate, and O1/N1/O2/N2/O3/N3/O4 thicknesses of about 1 nm/1.5 nm/2 nm/5.5 nm/5.5 nm/4 nm/4 nm. An erase operation with a gate voltage of −18 V results in experimental curve 4210 and simulated curve 4240. An erase operation with a gate voltage of −20 V results in experimental curve 4220 and simulated curve 4250. An erase operation with a gate voltage of −22 V results in experimental curve 4230 and simulated curve 4260. Simulation is performed with a theoretical WKB model.

Figure 43:
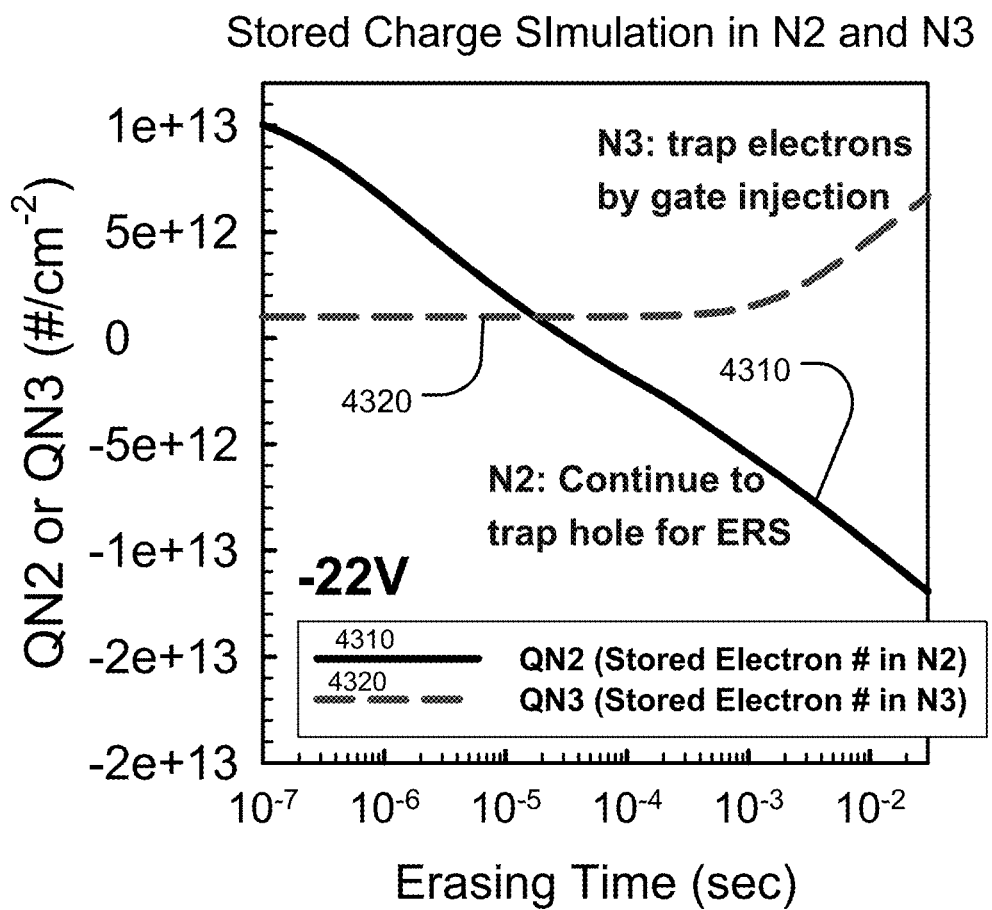
FIG. 43 is a simulated graph of trapped charge density versus erase time for the different nitride layers for charge storage of an embodiment of the memory cell of FIG. 6.

FIG. 43 is a graph of trapped charge density versus erase time for the different nitride layers for charge storage of the memory cell of FIG. 6.

The curves simulated trapped charge density in N2 4310 and N3 4320. After sufficiently long erase time, N3 starts to trap electrons, while N2 is continuously erased by substrate hole injection, with hole density exceeding 1E13 cm$^{-2}$. Gate injection is stopped after the trapped electron density in N3 exceeds 5E12 cm$^{-2}$. Although N3 traps electrons as holes are injected into N2, the threshold voltage is continuously lowered because N2 is closer to the channel and has a larger weighting factor for the threshold voltage shift.

Figure 44:
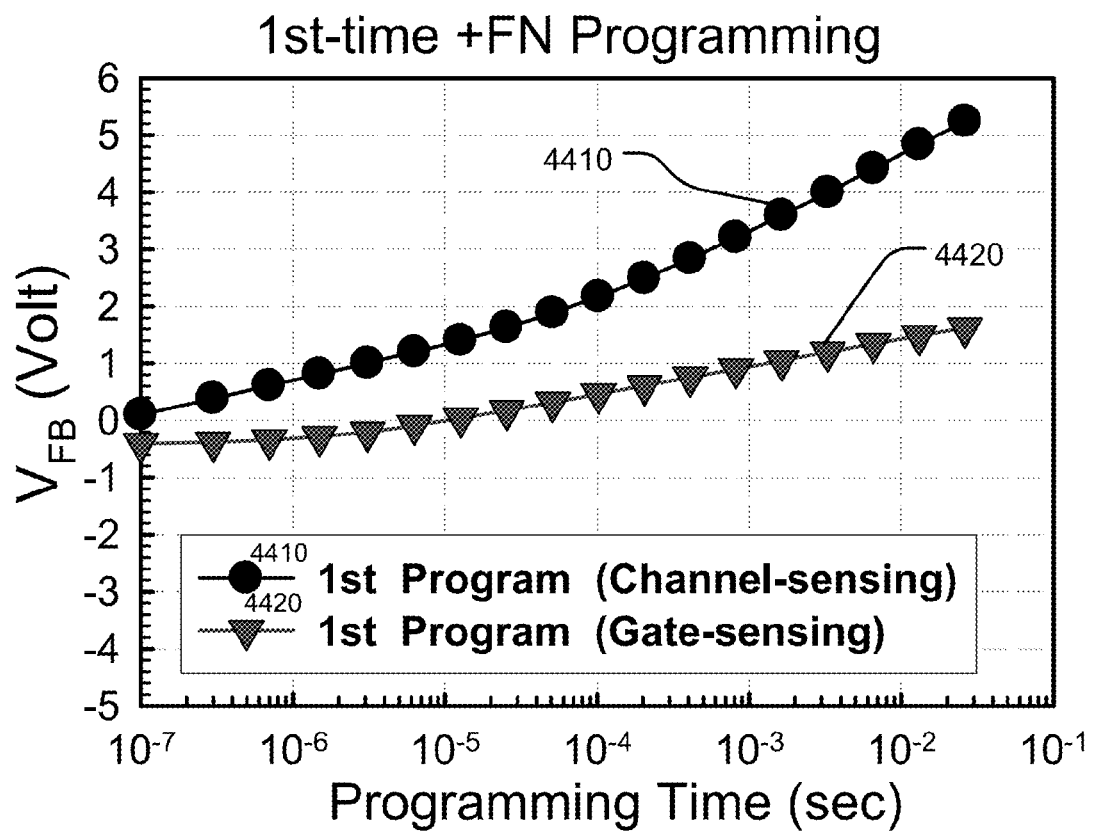
FIG. 44 is an experimental graph of flat band voltage shift versus programming time for a first programming on an embodiment of the memory cell of FIG. 6.
Figure 45:
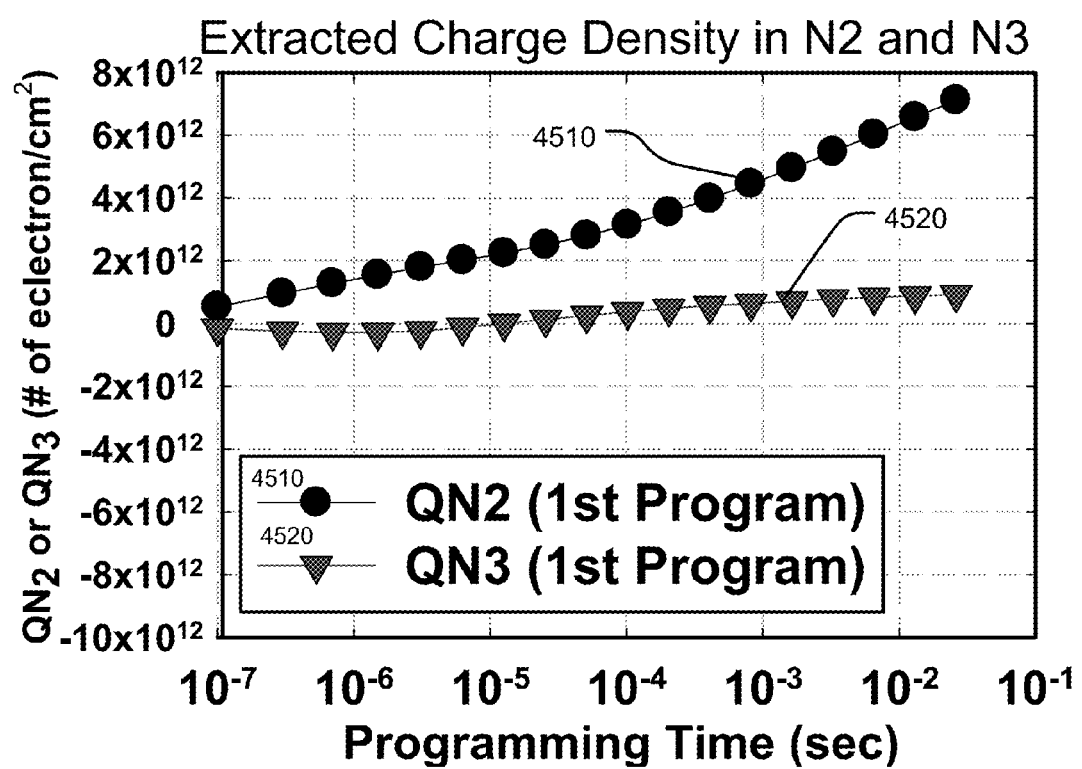
FIG. 45 is an experimental graph of charge density versus programming time the different nitride layers for charge storage for a first programming on an embodiment of the memory cell of FIG. 6.

In FIGS. 44 and 45, gate-sensing and channel-sensing techniques are applied to measure the stored charge distribution experimentally. Channel sensing has a heavily doped p+-type gate and a lightly doped p-well. Gate sensing has a lightly doped p-type gate and a heavily doped p-well. With the following equations, the charge densities QN2 and QN3 of the respective charge storage nitride layers N2 and N3 are extracted.

$$V_{FB,CS} = QN2 * \left( \frac{T_{Q4}}{a_Q a_{QX}} + \frac{T_{Nz}}{a_Q a_{StN}} + \frac{T_{Og}}{a_Q a_{QX}} + \frac{T_{Nz}}{2 a_Q a_{StN}} \right) +$$
$$QN3 * \left( \frac{T_{Q4}}{a_Q a_{QX}} + \frac{T_{Nz}}{a_Q a_{StN}} \right)$$

$$V_{FB,GS} = QN2 * \left( \frac{T_{Qz}}{a_Q a_{QX}} + \frac{T_{Nz}}{a_Q a_{StN}} + \frac{T_{Qz}}{a_Q a_{QX}} + \frac{T_{Nz}}{2 a_Q a_{StN}} \right) +$$
$$QN3 * \left( \frac{T_{Qz}}{a_Q a_{QX}} + \frac{T_{Nz}}{a_Q a_{StN}} + \frac{T_{Qz}}{a_Q a_{QX}} + \frac{T_{Nz}}{2 a_Q a_{StN}} + \frac{T_{Qz}}{a_Q a_{QX}} + \frac{T_{Nz}}{a_Q a_{StN}} \right)$$

FIG. 44 is an experimental graph of flat band voltage shift versus programming time for an embodiment of the memory cell of FIG. 6.

Flat band voltage shift is measured for a 1st +FN programming with +20V, on a memory cell in the fresh state prior to program or erase. Curve 4410 uses the channel-sensing technique. Curve 4420 uses the gate-sensing technique.

FIG. 45 is an experimental graph of charge density versus programming time the different nitride layers for charge storage for an embodiment of the memory cell of FIG. 6.

Curve 4510 shows the charge density QN2 in N2 for a 1st +FN programming with +20V, on a memory cell in the fresh state prior to program or erase. Curve 4520 shows the charge density QN3 in N3 for a 1st +FN programming with +20V, on a memory cell in the fresh state prior to program or erase.

The +FN injected electrons are mostly stored in N2, and N3 has much fewer stored electrons. N2 has a good capture efficiency and O3 can block most out tunneling from N2 toward N3.

Figure 46:
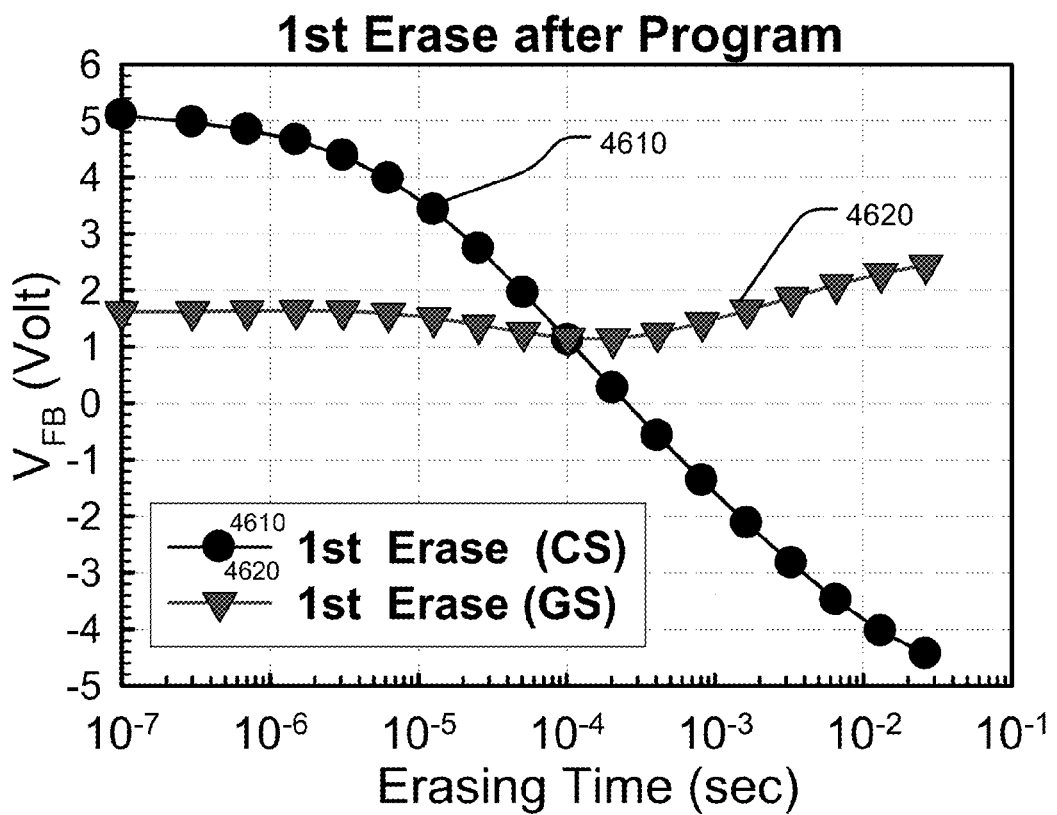
FIG. 46 is an experimental graph of flat band voltage shift versus programming time for a first erase after a first programming on an embodiment of the memory cell of FIG. 6.

FIG. 46 is an experimental graph of flat band voltage shift versus programming time for a first erase after a first programming on an embodiment of the memory cell of FIG. 6.

Curve 4610 shows the measured flat band voltage shift using the channel-sensing technique for erase. Curve 4620 shows the measured flat band voltage shift using the gate-sensing technique for erase.

The channel-sensing and gate-sensing techniques have very different results due to the different flatband voltage weighting factor of N2 and N3, depending on distance from the channel or distance from the gate.

Figure 47:
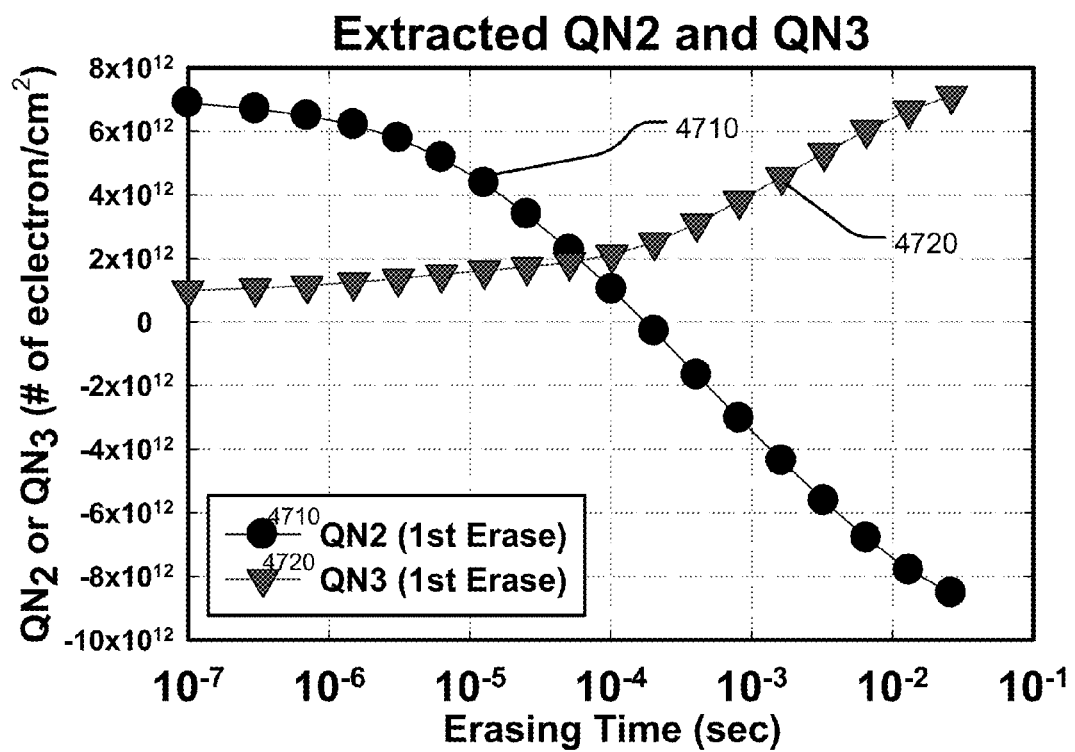
FIG. 47 is an experimental graph of charge density versus programming time the different nitride layers for charge storage for a first erase after a first programming on an embodiment of the memory cell of FIG. 6.

FIG. 47 is an experimental graph of charge density versus programming time the different nitride layers for charge storage for a first erase after a first programming on an embodiment of the memory cell of FIG. 6.

Curve 4710 shows the charge density QN2 in N2 for a first erase. Curve 4720 shows the charge density QN3 in N3 for a first erase. Curve 4720 shows that N3 traps an increasing number of electrons at longer erasing times. Curve 4710 shows that N2 is erased by hole injection and continues to trap holes, allowing a deep erase for the channel-sensing device.

Figure 48:
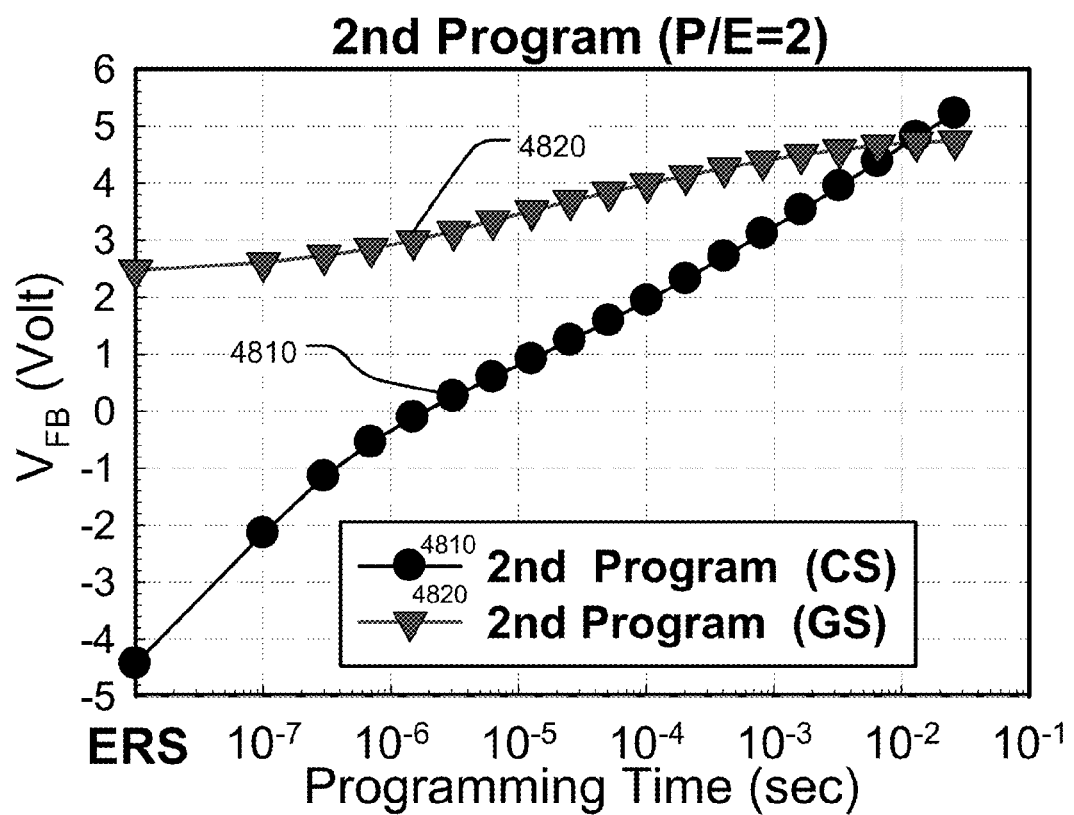
FIG. 48 is an experimental graph of flat band voltage shift versus programming time for a second programming after the first erase on an embodiment of the memory cell of FIG. 6.

FIG. 48 is an experimental graph of flat band voltage shift versus programming time for a second programming after the first erase on an embodiment of the memory cell of FIG. 6.

Curve 4810 shows the measured flat band voltage shift using the channel-sensing technique for erase. Curve 4820 shows the measured flat band voltage shift using the gate-sensing technique for erase.

Figure 49:
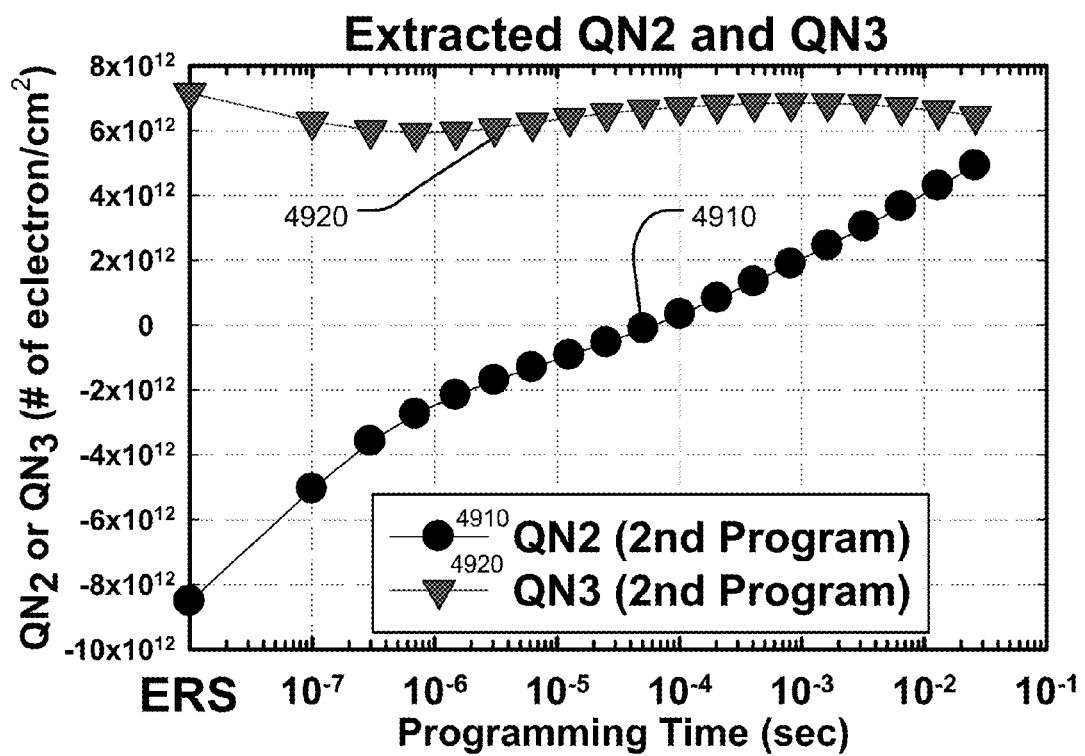
FIG. 49 is an experimental graph of charge density versus programming time the different nitride layers for charge storage for a second programming after the first erase on an embodiment of the memory cell of FIG. 6.

FIG. 49 is an experimental graph of charge density versus programming time the different nitride layers for charge storage for a second programming after the first erase on an embodiment of the memory cell of FIG. 6.

Curve 4910 shows the charge density QN2 in N2 for a second programming. Curve 4920 shows the charge density QN3 in N3 for a second programming. Curve 4920 shows that previous injected electrons in N3 (from erase) are kept substantially constant during 2nd the +FN programming. Curve 4910 shows that for the second programming, the trapped holes in N2 recombine with electrons injected from the substrate.

Figure 50:
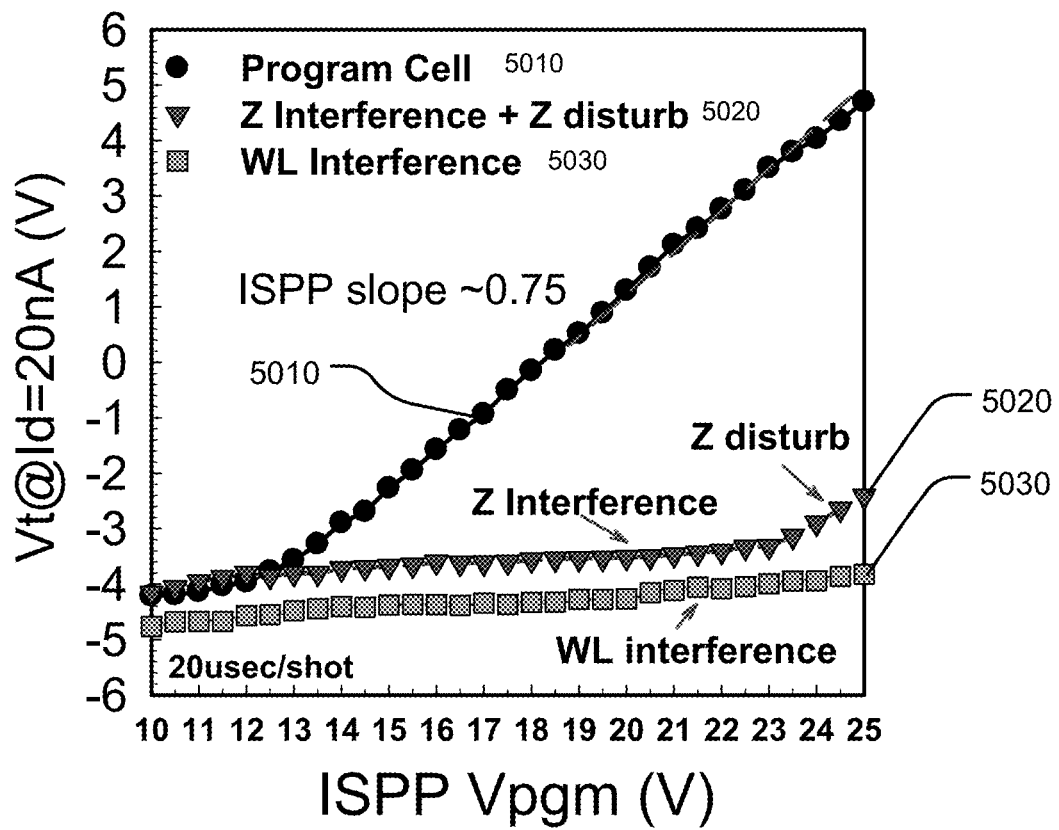
FIG. 50 is a graph of threshold voltage versus programming voltage for memory cells in a 3D vertical gate array of the memory cell of FIG. 6.

FIG. 50 is a graph of threshold voltage versus programming voltage for memory cells in a 3D vertical gate array of the memory cell of FIG. 6.

Curve 5010 shows the threshold voltage of a memory cell undergoing ISPP. The ISPP slope of 3DVG TFT device is ~0.75, which is smaller than ideal. The decreased ISPP slops is from the fringe field effect in a small 3D transistor that modulates the tunnel oxide and blocking oxide E field which alters the FN tunneling ISPP behavior. Curve 5020 shows the disturb effects of other memory cells in the Z-direction that were not undergoing programming. Curve 5030 shows the disturb effects of other memory cells of other word lines that were not undergoing programming.

Figure 51:
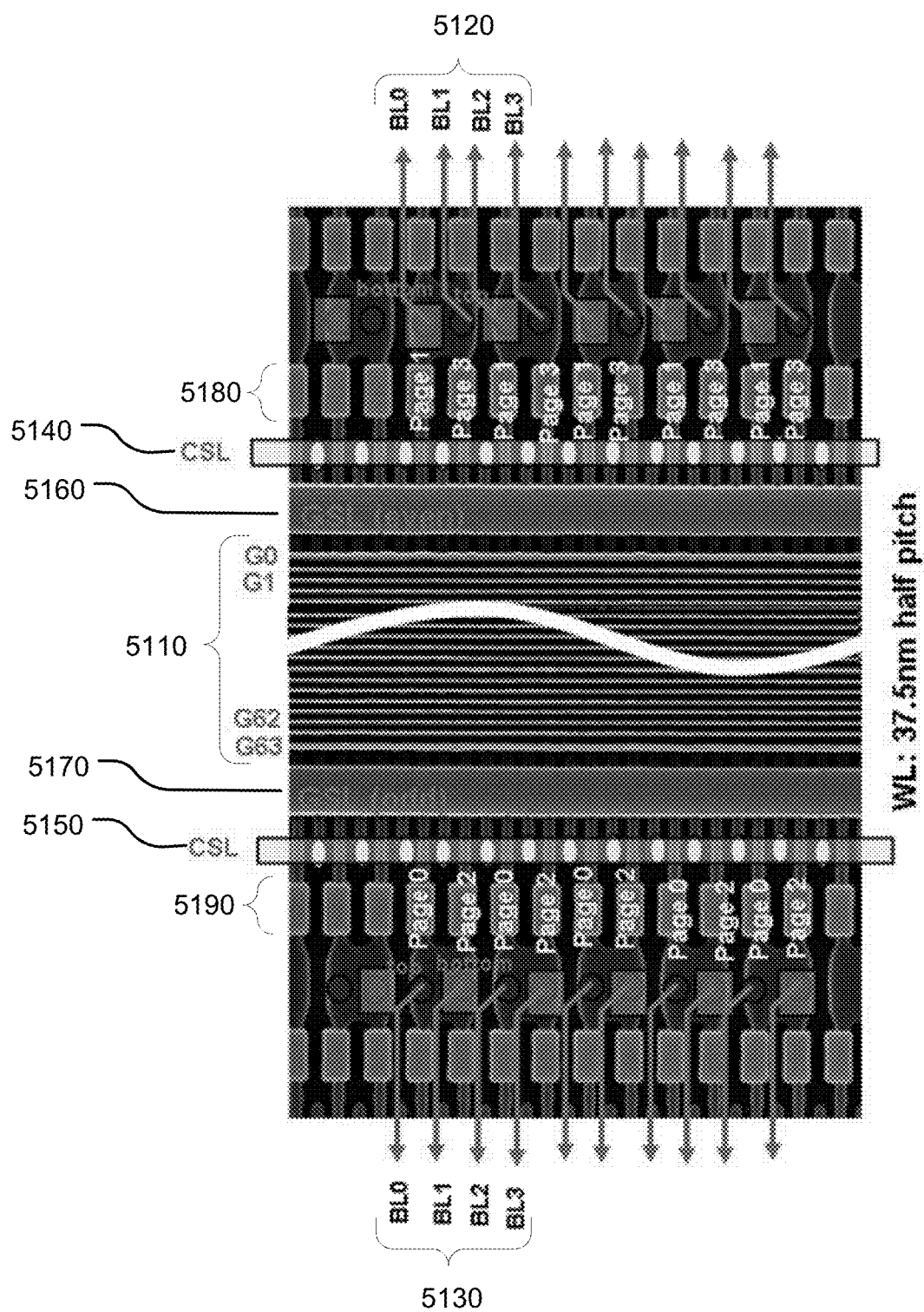
FIG. 51 is a schematic diagram of a split-page 3D vertical gate array of the memory cell of FIG. 6.
Figure 52:
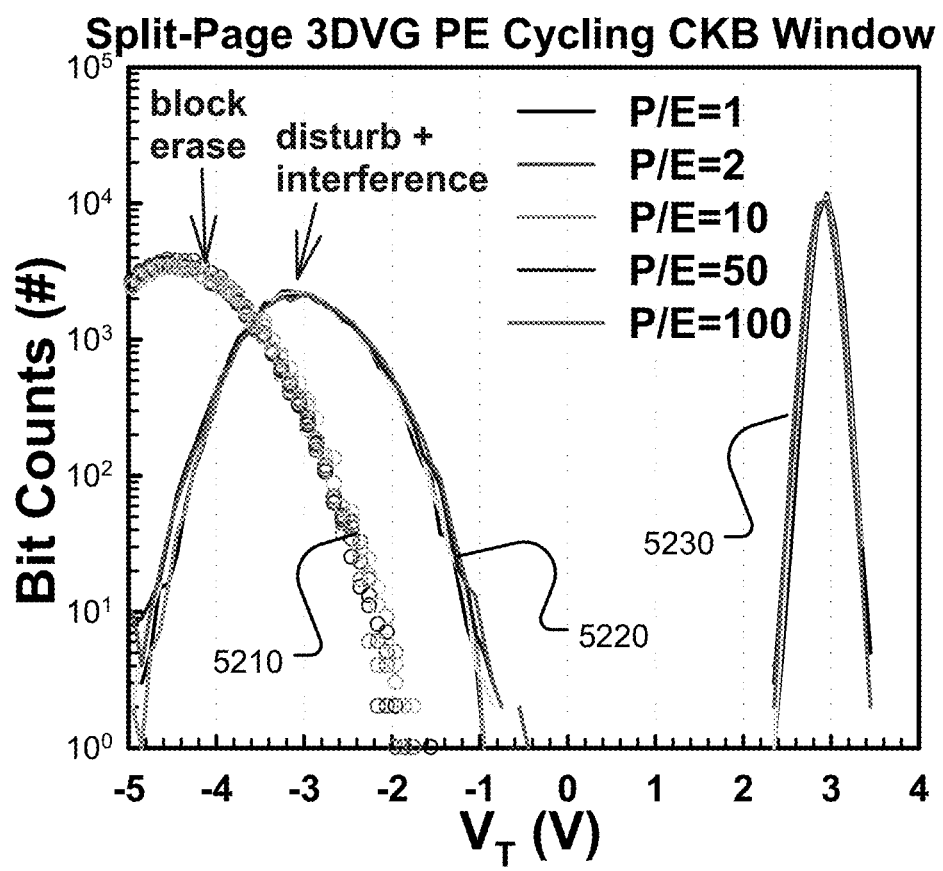
FIG. 52 is a graph of a single-level cell memory window of memory cells in the array of FIG. 51.

FIG. 51 is a schematic diagram of a split-page 3D vertical gate array of the memory cell of FIG. 6. A test-chip includes a full block of a 64 word lines of memory cells that undergo checkerboard (CKB) programming. The array includes 64 word lines 5110 labeled from G0 to G63. Adjacent to the word lines 5110, on top is even ground select line 5160, and on bottom is odd ground select line 5170. Adjacent to the ground select lines, on top is common source line 5140, and on bottom is common source line 5150. Adjacent to the common source lines, on top is string select line structures 5180 for pages 1 and 3, and on bottom is string select line structures 5190 for pages 0 and 2. On top are bit lines 5120, and on bottom are bit lines 5130. FIG. 52 is a graph of a single-level cell memory window of memory cells in the array of FIG. 51.

Memory cells undergo a varying number of program/erase cycles: 1, 2, 10, 50, and 100. However, the traces corresponding to the varying number of program/erase cycles are substantially the same. Each of the traces has multiple distributions, including a block erase distribution 5210, a program disturb distribution 5210, and a program distribution 5230. The block erase distribution 5210 shows a deeply erased threshold voltage distribution due to the multiple nitride layers storing charge. The erased upper bound of the block erase distribution can be lower than −2V after block erase. Even the program disturb distribution 5210 is generally below 0V, allowing a large design window.

Figure 53:
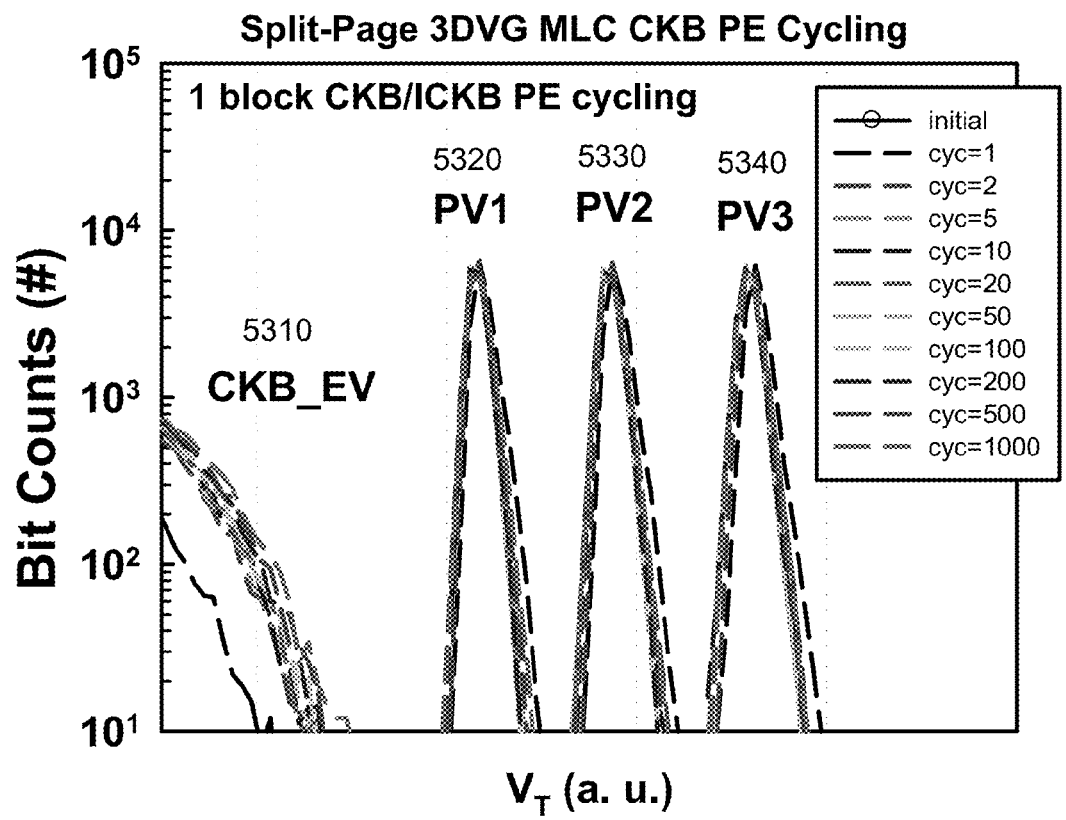
FIG. 53 is a graph of a multi-level cell memory window of memory cells in the array of FIG. 51.

FIG. 53 is a graph of a multi-level cell memory window of memory cells in the array of FIG. 51.

Memory cells undergo a varying number of program/erase cycles: initial/fresh, 1, 2, 5, 10, 20, 50, 100, 200, 500, and 1000. However, the traces corresponding to the varying number of program/erase cycles are substantially the same, with the exception of the 1 cycle trace under distribution 5310. Each of the traces has multiple distributions, including a checkerboard erase verify distribution 5310, a program verify 1 distribution 5320, a program verify 2 distribution 5330, and a program verify 3 distribution 5340. Although more disturb is experienced with the multi-level memory window than the single-level cell window, the multi-level memory window remains suitable.

Figure 54:
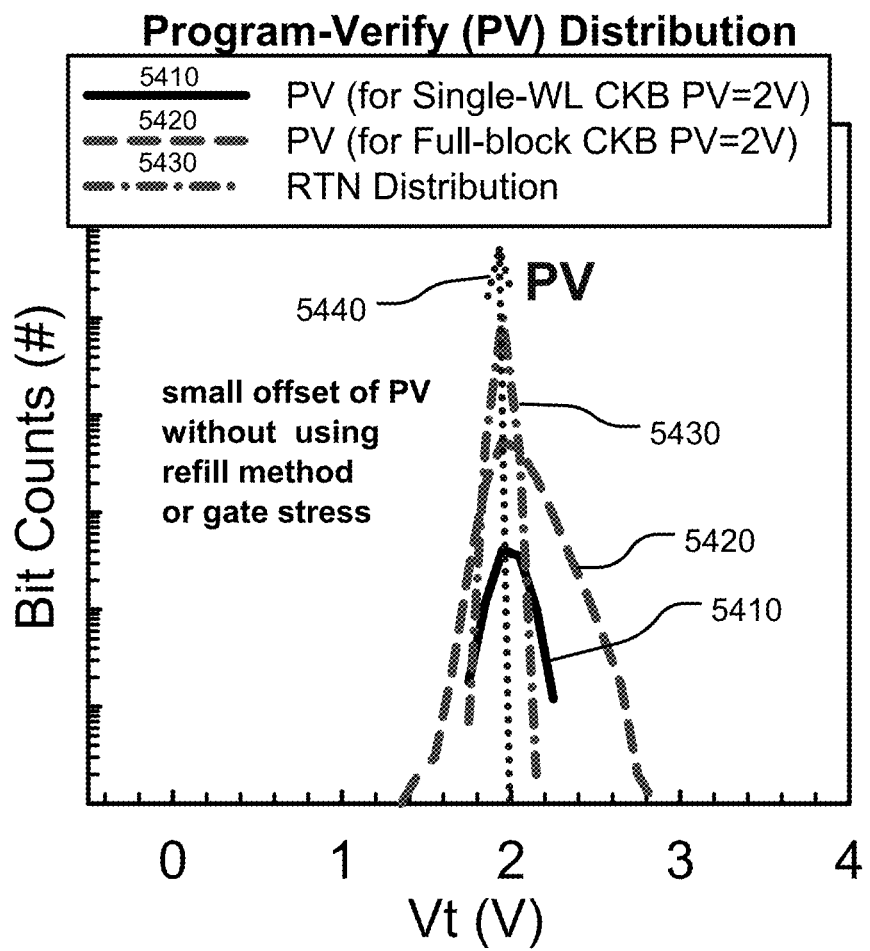
FIG. 54 is a graph of a program-verify distribution of memory cells in the array of FIG. 51.

FIG. 54 is a graph of a program-verify distribution of memory cells in the array of FIG. 51.

The distributions included are a random telegraph noise (RTN) distribution 5410, a program verify distribution for a single word line 5420, and a program verify distribution for a full block 5430. Arrow 5440 originates from the defined program verify level of 2V and crosses the peaks of the distributions.

The single-WL PV distribution 5420 is tight distribution and has a small offset from the PV level defined in the sensing circuit, indicating a small fast initial charge loss. The tightness of the distribution is consistent with the RTN distribution 5410. The small PV offset suggests that the fast initial charge loss is minimized, because of a low-leakage O4 in contact with the gate.

The full-block CKB PV distribution 5430 is wider than the single-WL PV distribution 5420, due to the many interference and back-pattern effects. The rightward shift is due to the interferences but not due to charge loss.

Figure 55:
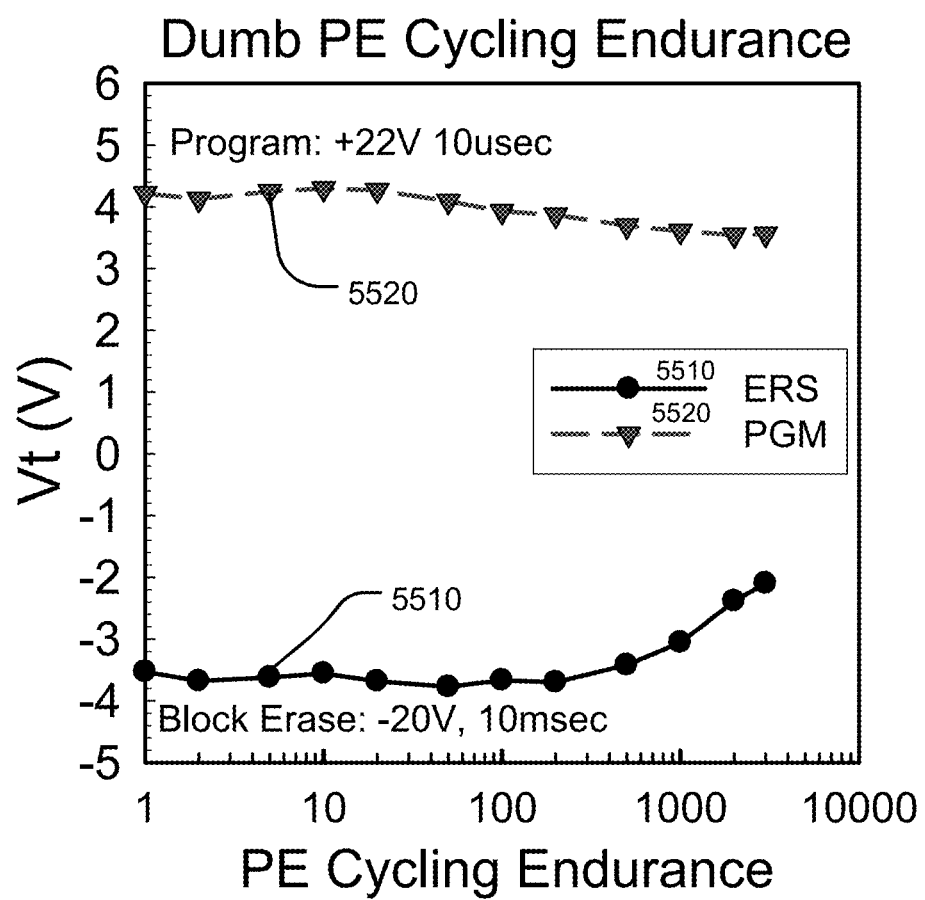
FIG. 55 is a graph of the program and erase threshold voltages versus number of program and erase cycles.

FIG. 55 is a graph of the program and erase threshold voltages versus number of program and erase cycles.

Program and erase cycling endurance of the device is determined under conditions of 1 shot program and erase, or "dumb-mode". Curve 5520 is the programmed state after a +22V shot for 10 usec. Curve 5510 is the erase state after a −20V block erase for 10 millisec. Degradation is observed at high cycling counts for program and erase states. The erased state 5510 has a larger magnitude threshold voltage shift than the programmed state 5520 at high cycling counts.

Figure 56:
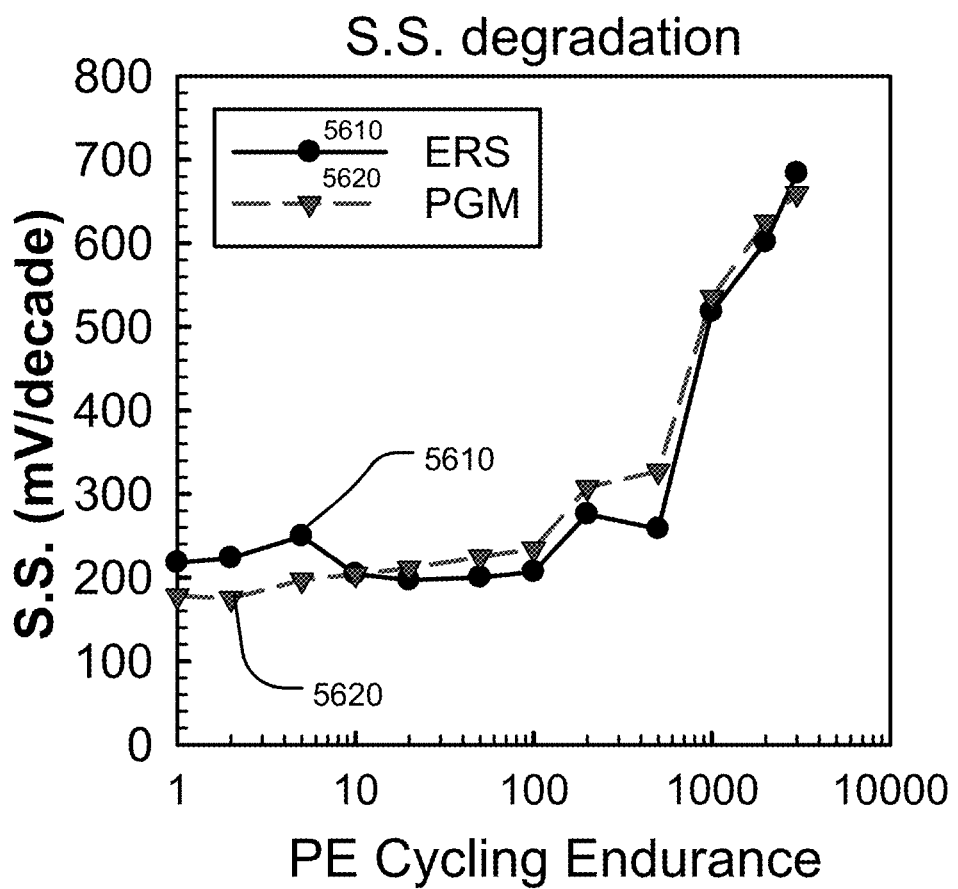
FIG. 56 is a graph of the subthreshold slope of the IV characteristic versus number of program and erase cycles.

FIG. 56 is a graph of the subthreshold slope of the IV characteristic versus number of program and erase cycles.

Curve 5620 is the programmed state. Curve 5610 is the erased state. The subthreshold slope increases due to generation of interface traps.

Figure 57:
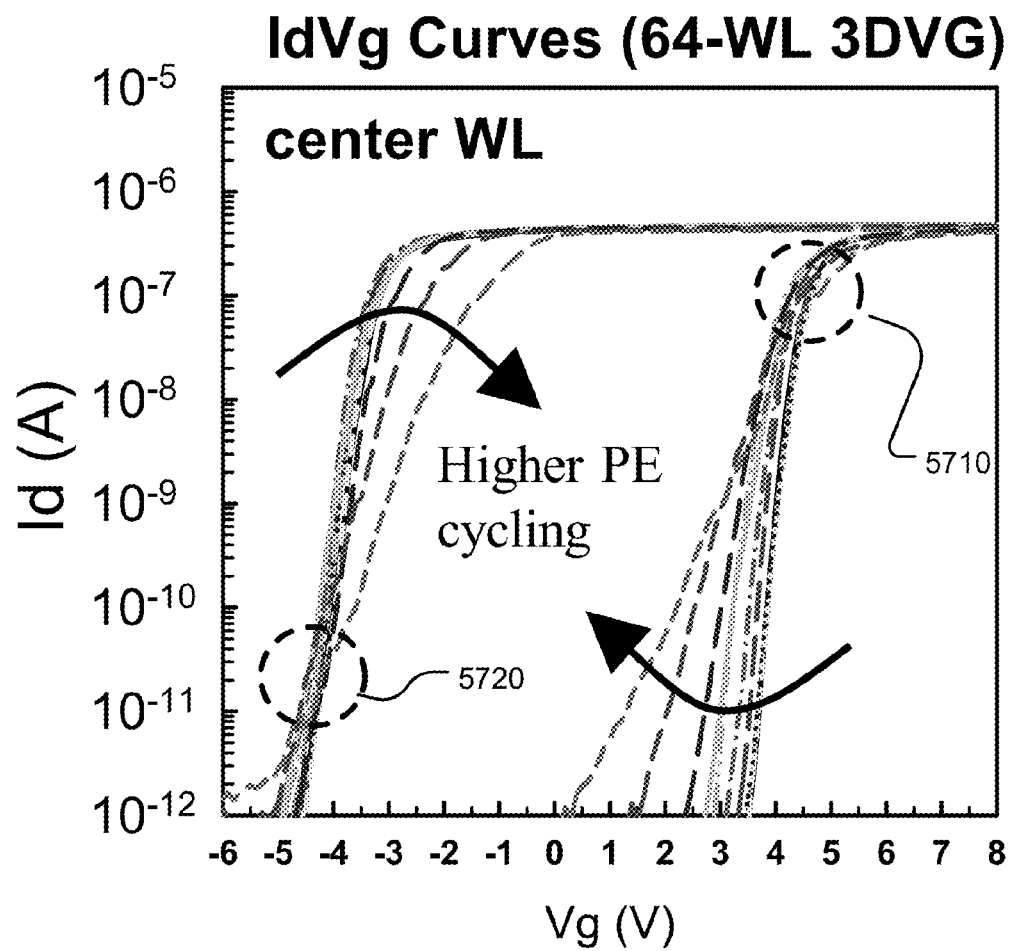
FIG. 57 is a graph of the IV characteristics for programmed and erased memory at different numbers of program and erase cycles.

FIG. 57 is a graph of the IV characteristics for programmed and erased memory at different numbers of program and erase cycles.

The erased state curves at various numbers of program and erase cycles merge at 5720. The respective erased state curves generally represent a higher number of program and erase cycles in the direction of the arrow towards the middle of the graph. The programmed state curves at various numbers of program and erase cycles merge at 5710. Similarly, the respective programmed state curves generally represent a higher number of program and erase cycles in the direction of the arrow towards the middle of the graph. The merge point of the IdVg curves is different for erased state 5720 and programmed state 5710. The difference in merge points is explained in connection with FIG. 58.

Figure 58:
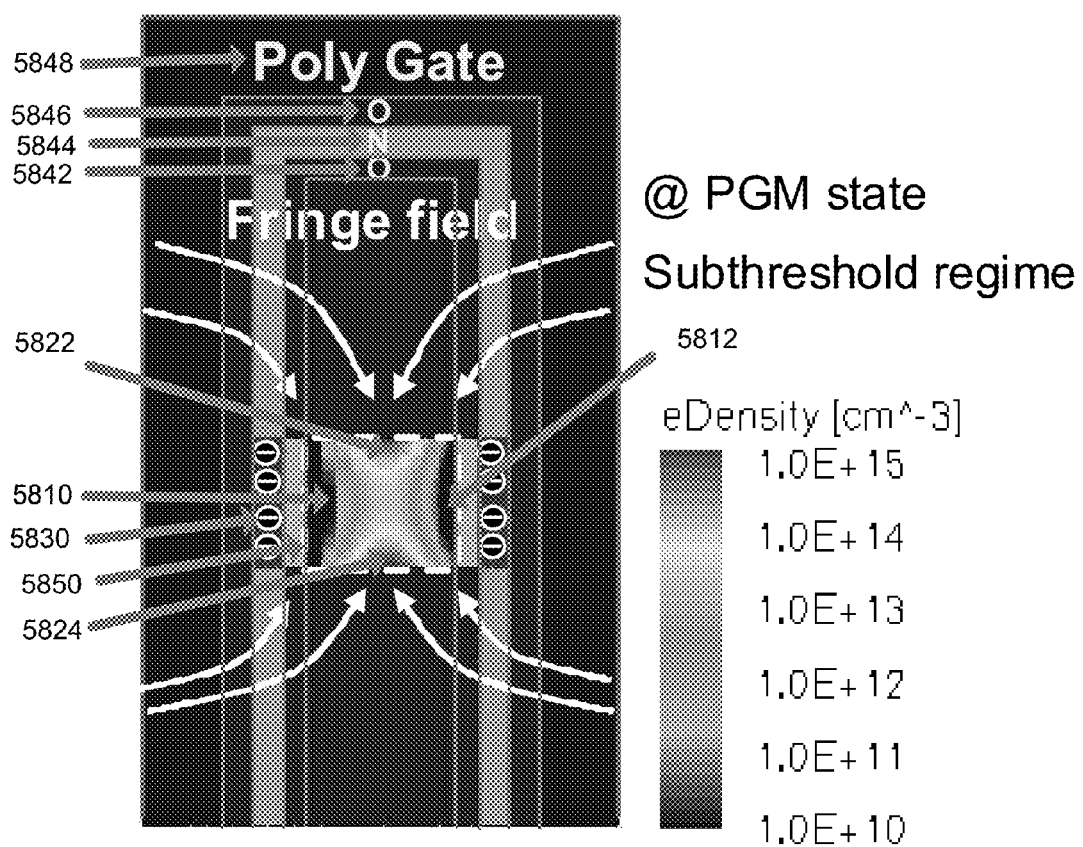
FIG. 58 is a simplified diagram of the electric field in a memory cell modified to include multiple nitride layers storing charge as in FIG. 6.

FIG. 58 is a simplified diagram of the electric field in a BE-SONOS memory cell modified to include multiple nitride layers storing charge.

A stack of alternating silicon and oxide is surrounded by O1 5842, N1 5844, O2 5846, and a polysilicon gate 5848. The dashed rectangle bounds a strip of silicon 5850 corresponding to a memory cell. The memory cell is programmed, as indicated by the electrons 5830 stored on the N1 5844 on both sides. These stored electrons affect the electron density profile, which ranges from about $10E10 \text{ cm}^{-3}$ to $10E15 \text{ cm}^{-3}$. On the sides 5810 and 5812 of the strip of silicon 5850, proximate to the trapped electrons, the electron density is about $10E10 \text{ cm}^{-3}$. On the top 5822 and bottom 5824 of the strip of silicon 5850, spaced apart from the trapped electrons, the electron density is about $10E15 \text{ cm}^{-3}$. The remainder of the strip of silicon 5850 has an electron density at intermediate values.

Inversion electrons tend to be started near the sidewall at the PGM state due to the fringe electric field effect. Subthreshold current moves toward the sidewall at the programmed state. This leads to less sensitivity of interface state trap (Dit) at the Si/O1 interface and a smaller threshold voltage shift of the programmed state after an increased numbers of P/E cycling.

Thus the endurance degradation is not caused by the double-trapping layer, but from the O1/Si interface state generation. Endurance is improved by strengthening the O1 post-stress immunity.

Figure 59:
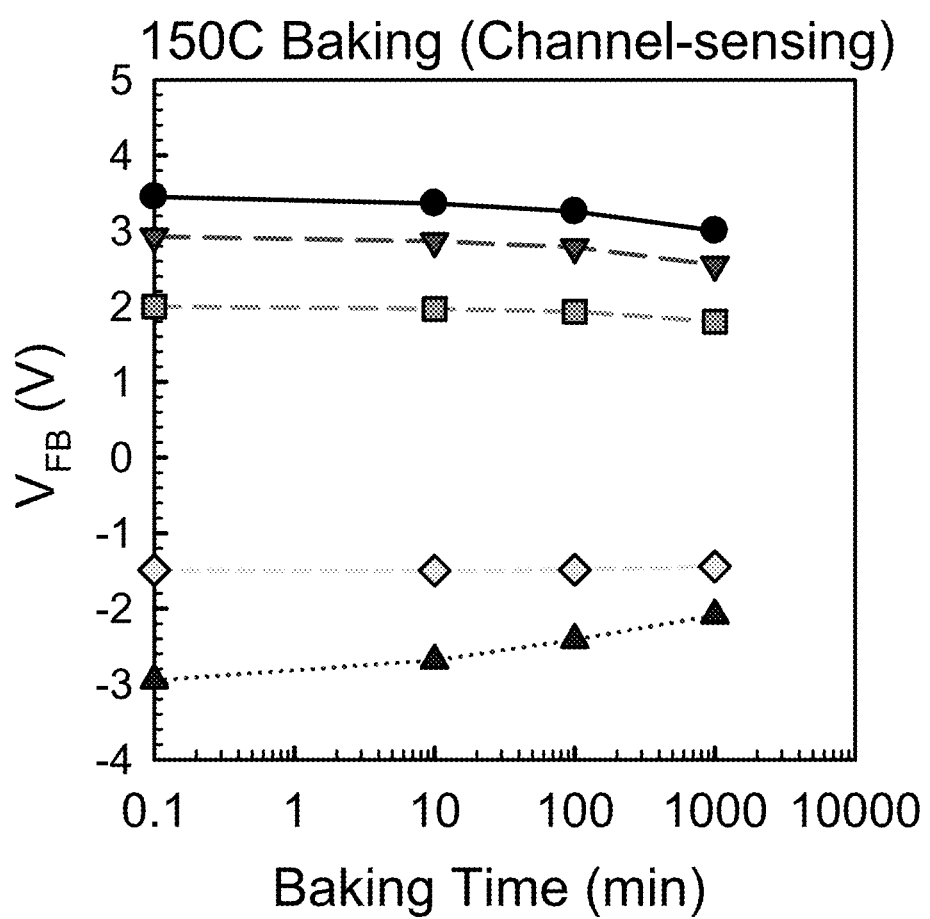
FIG. 59 shows flat band voltage retention results of the memory cells after thermal stress.

FIG. 59 shows flat band voltage retention results of the memory cells after thermal stress.

High-temperature 150 C baking is performed. The higher-programmed and deep-erased states have apparent charge loss after long-term baking Retention remains excellent for medium-level states.

Figure 60:
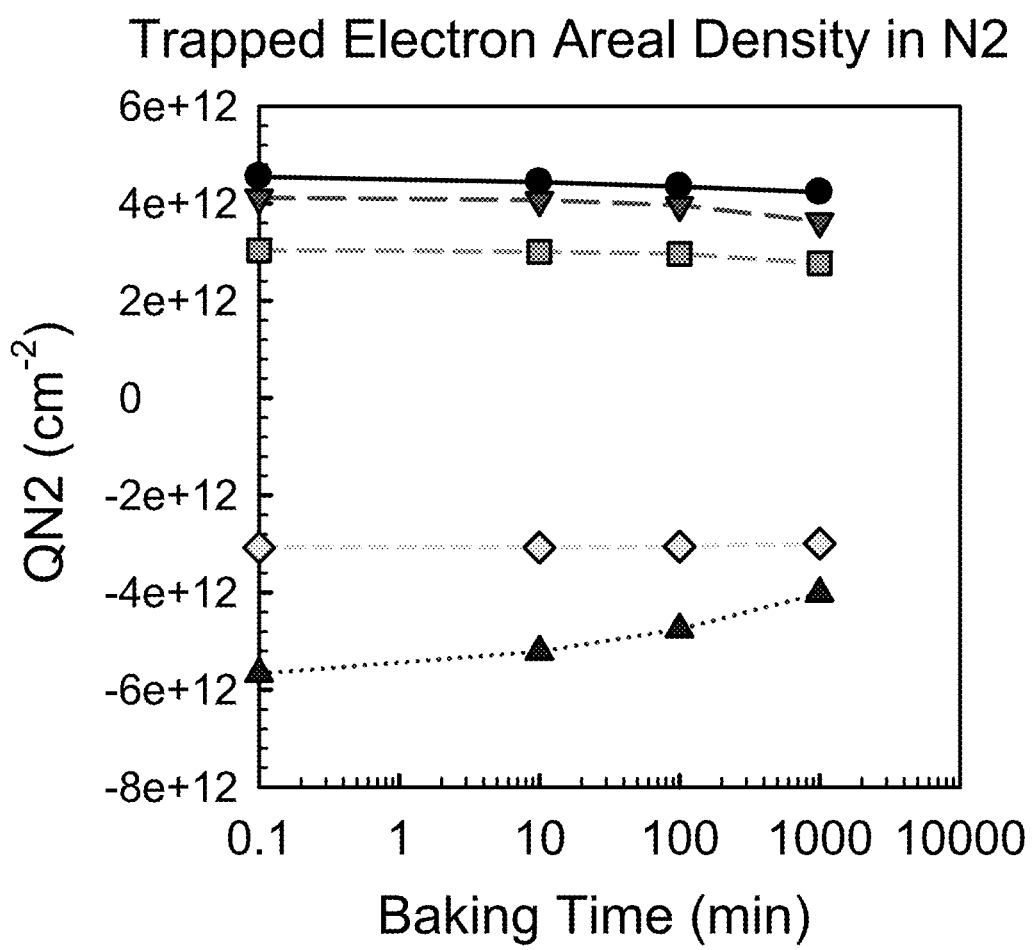
FIGS. 60-61 show charge density retention results of the memory cells after thermal stress.
Figure 61:
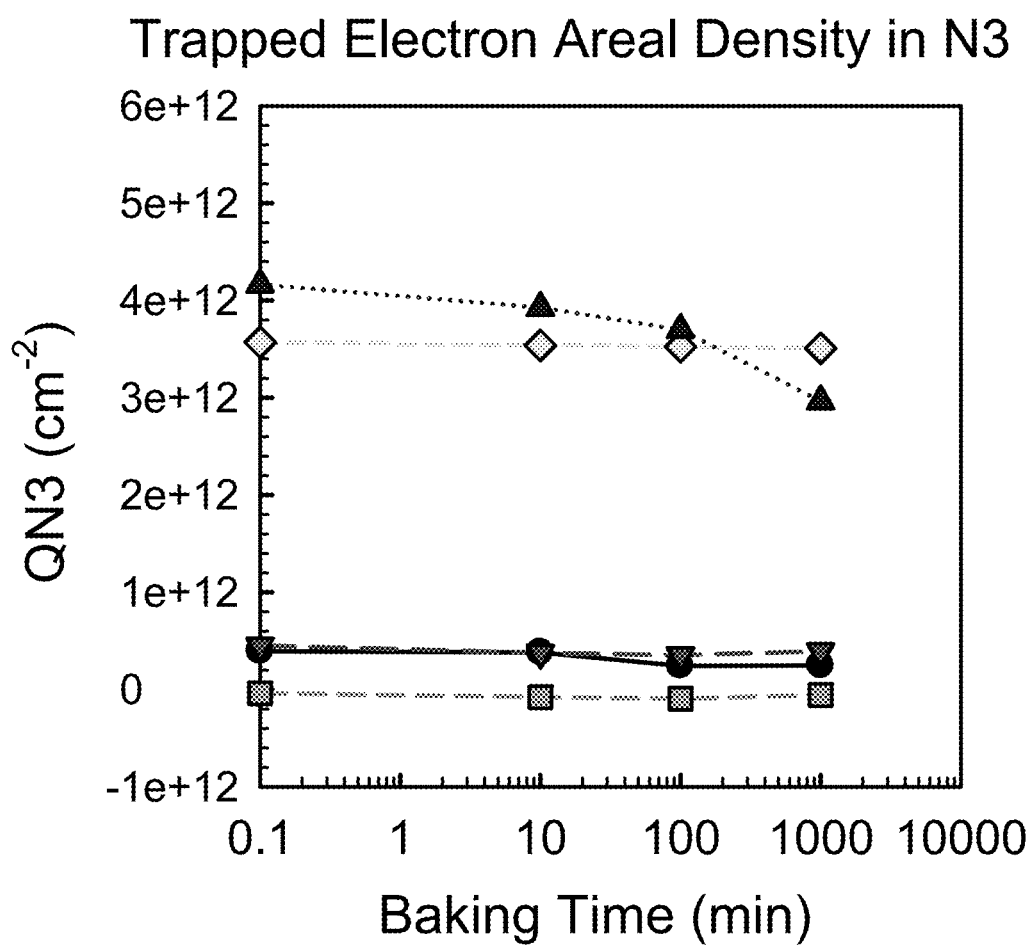

FIGS. 60-61 show charge density retention results of the memory cells after thermal stress. FIG. 60 shows the trapped electron area density in N2. FIG. 61 shows the trapped electron area density in N3. The gate-sensing and channel sensing (GSCS) analyses indicate that the charge in N3 is stable. The blocking oxide O3 and O4 can keep maintain charge retention and prevent mixing of charge between N2 and N3.

Figure 62:
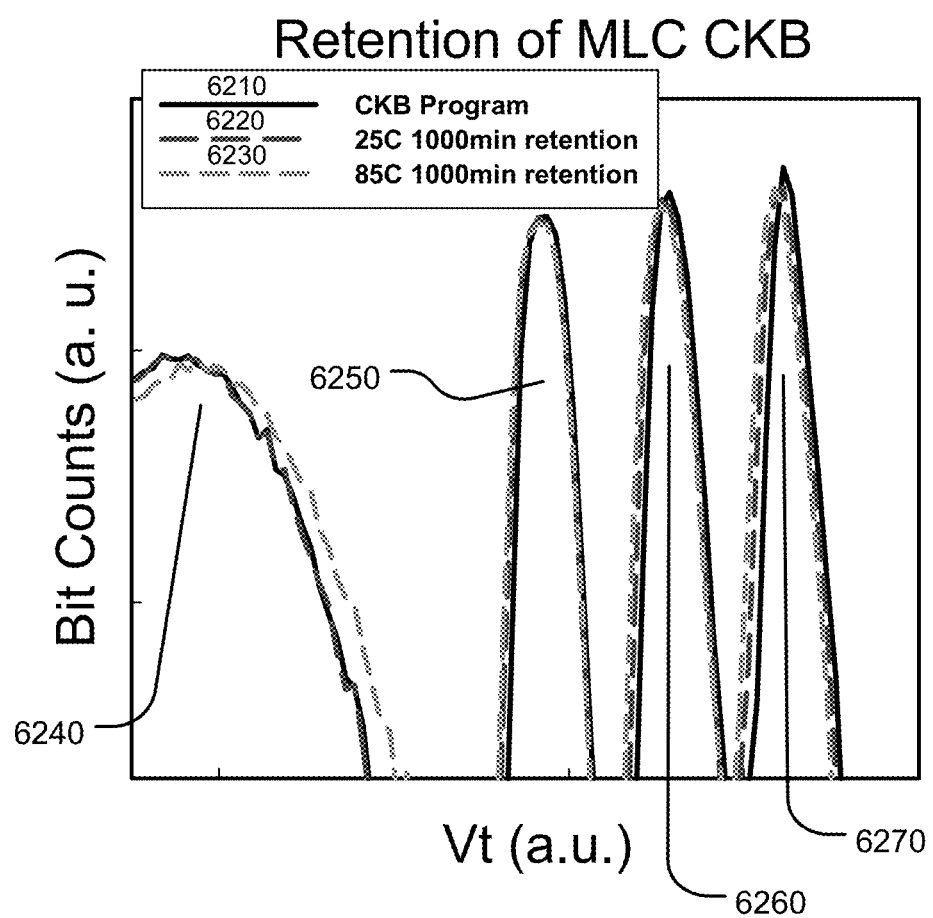
FIG. 62 shows memory window retention results of the memory cells after thermal stress.

FIG. 62 shows memory window retention results of the memory cells after thermal stress.

The retention results of a test chip are shown for CKB program 6210, 25 C 1000 minute baking retention 6220, and 85 C 1000 minute baking retention 6230. The charge loss is generally a group-behavior such that the curves overlap and all separate into multiple distributions 6240, 6250, 6260, and 6270, without tail distributions.

Figure 63:
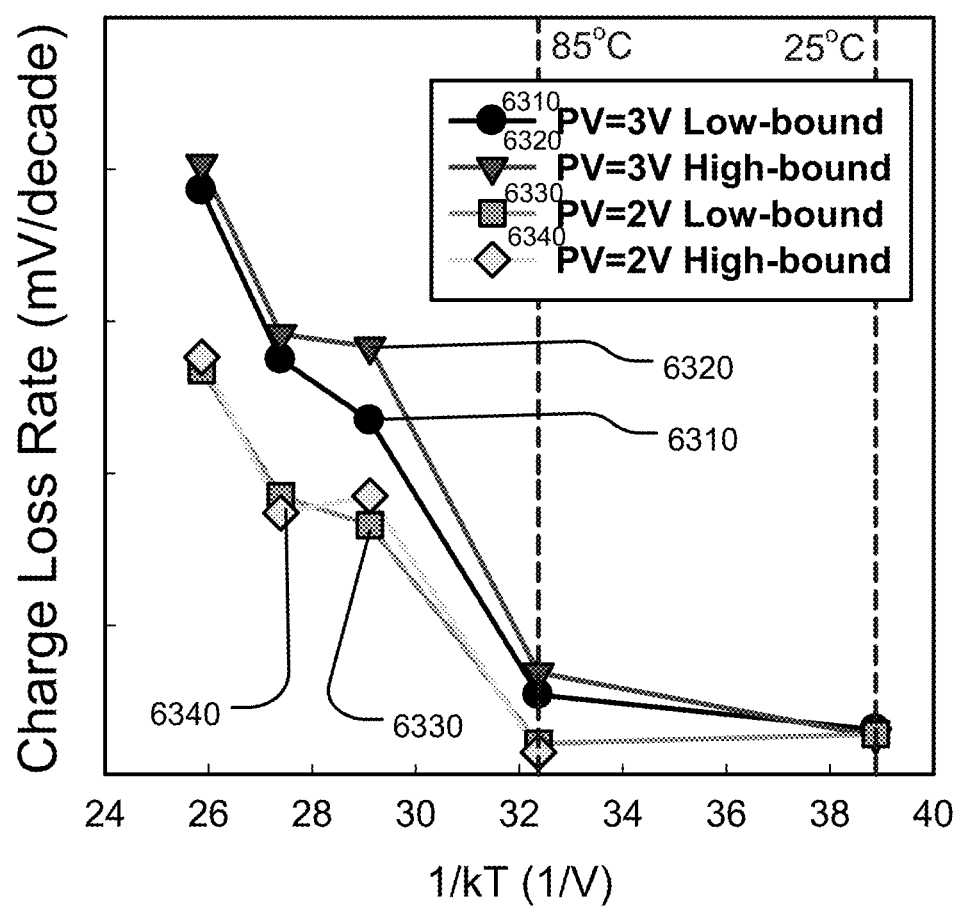
FIG. 63 shows the charge loss rate of memory cells at various temperatures.

FIG. 63 shows the charge loss rate of memory cells at various temperatures, 85 degrees Celsius and 25 degrees Celsius.

Curve 6310 is for a 3V lower bound program verify level. Curve 6320 is for a 3V upper bound program verify level. Curve 6330 is for a 2V lower bound program verify level. Curve 6340 is for a 2V upper bound program verify level.

The charge loss rate below 85 degrees Celsius is below 30 mV/decade, providing enough sensing window after long-term storage but increases significantly at higher baking temperatures. At higher temperatures, the charge loss rate significantly increases and does not follow a simple Arrhenius model.

Figure 64:
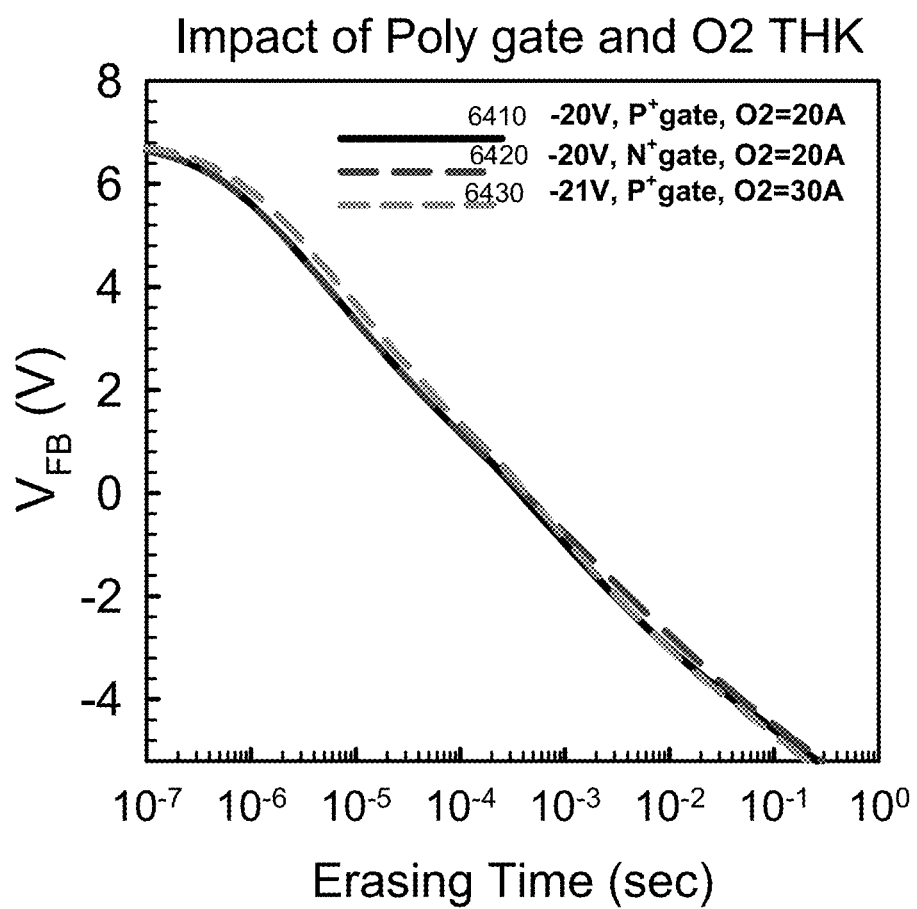
FIG. 64 shows an erase comparison of different gate doping or work functions and O2 thicknesses.

FIG. 64 shows an erase comparison of different gate doping or work functions and O2 thicknesses.

Curve 6410 is with a −20V erase, P+ gate, and O2 thickness of 20 angstroms. Curve 6420 is with a −20V erase, N+ gate, and O2 thickness of 20 angstroms. Curve 6430 is with a −21V erase, P+ gate, and O2 thickness of 30 angstroms.

Changing the poly gate from P+ gate to N+ gate does not affect the erase saturation. Gate injection is suppressed by trapped electrons in N3, rather than a high work function gate. So poly gate doping variation or even an irregular sharp corner of gate (that results in higher gate injection) is tolerable in the erase window.

To improve retention of BE-SONOS, the thicker O2 (>30 A) is effective in suppressing charge loss at lower baking temperatures. Thicker O2 further minimizes the low-field leakage current and prevents de-trapping from N2. On the other hand, thicker O2 does not degrade the erase window, because at high erase fields, the band offset effect screens out most of the O2 tunneling barrier. Various embodiments resolves the trade-off between erase and retention. Thin O1 and N1 facilitate hole injection during erase, while a thick O2 maintains charge retention in N2.

Figure 65:
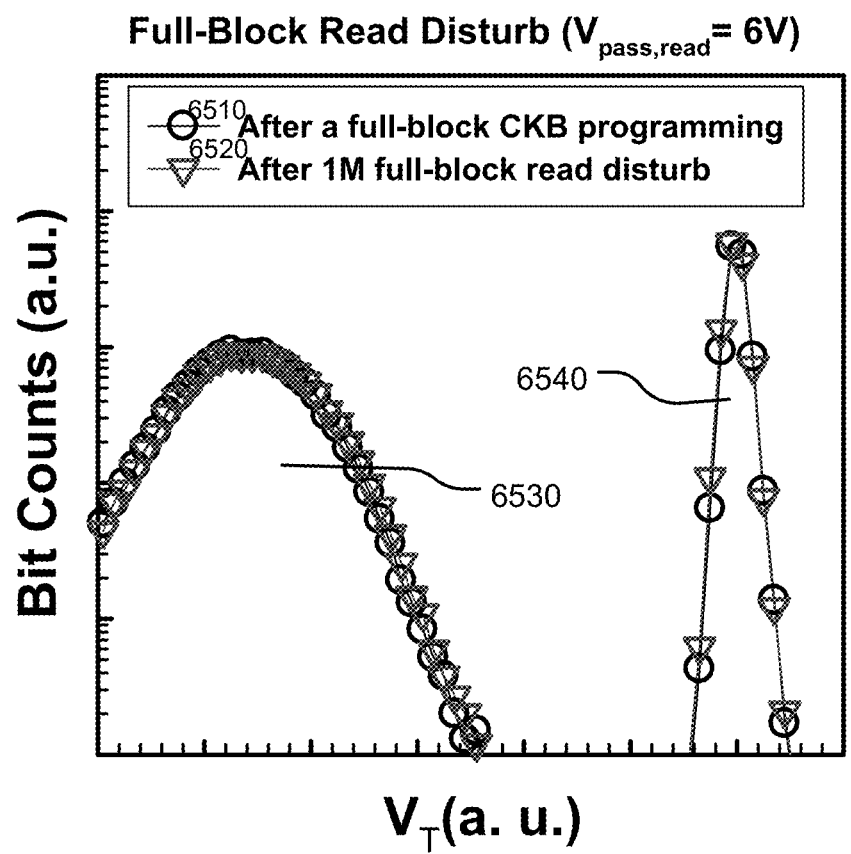
FIG. 65 shows a read disturb test.

FIG. 65 shows a read disturb test.

Curve 6510 is after a full block undergoes CKB programming. Curve 6520 is after a full-block undergoes 1M read disturbs. Both curves show similar behavior, and have distributions 6530 and 6540. An optimized read waveform avoids hot-carrier injection. A small read disturb is evident after 1M full-block read stress. Due to the flat topology without a field enhancement effect from curves, a high read endurance immunity is obtained, enduring over 1M read stresses. The device is very robust against gate stressing.

Figure 66:
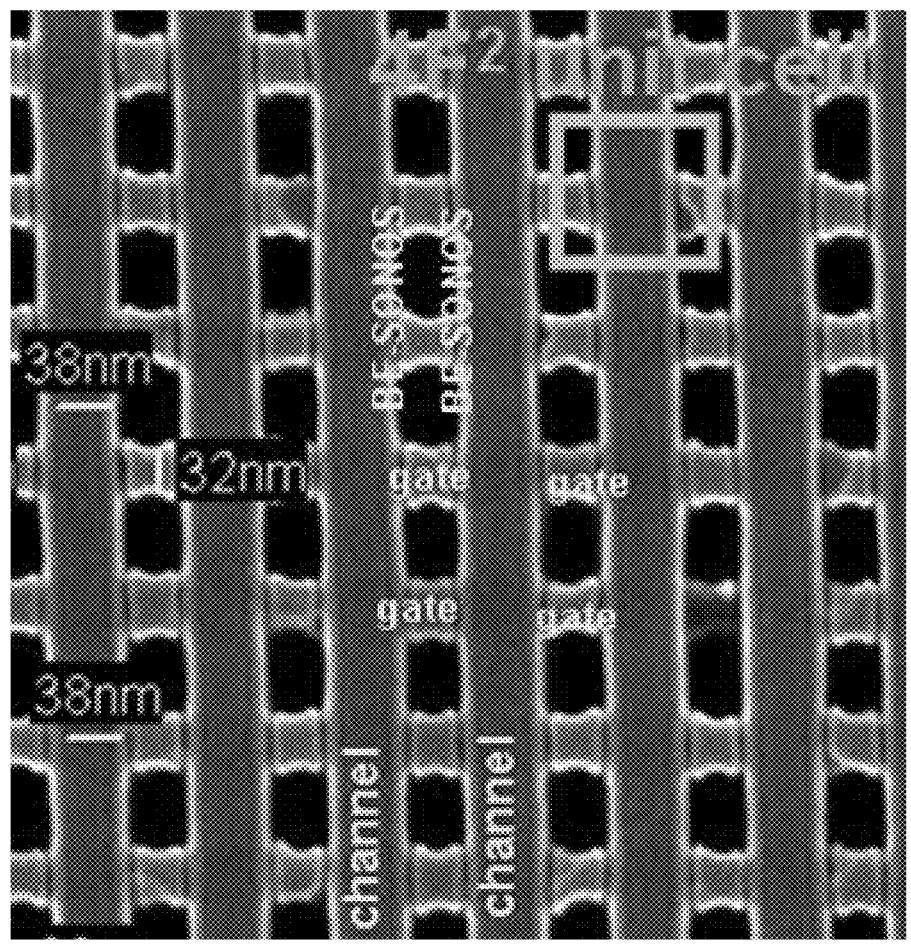
FIG. 66 shows a schematic of a vertical channel embodiment.

FIG. 66 shows a schematic of a vertical channel embodiment. The flat and planar topology can be implemented in a minimal design rule 4F2 cell size to maximize the memory density of 3D NAND Flash.

While the present technology is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the scope of the following claims.

What is claimed is:

1. A memory comprising an array of memory cells, respective memory cells in the array including:
    a gate;
    a channel material having a channel surface;
    a dielectric stack between the gate and the channel surface, the dielectric stack comprising:
        a multi-layer tunneling structure on the channel surface, the multi-layer tunneling structure including at least a first tunneling dielectric layer having a tunneling valence band edge;
        a first charge storage dielectric layer on the multi-layer tunneling structure;
        a first blocking dielectric layer on the first charge storage dielectric layer;
        a second charge storage dielectric layer on the first blocking dielectric layer;
        a second blocking dielectric layer on the second charge storage dielectric layer; and
    a control circuit applying a selected one of a plurality of bias arrangements including:
        a program bias arrangement that programs data by moving electrons from the channel surface, through the multi-layer tunneling structure including the first tunneling dielectric layer, to the first charge storage dielectric layer; and
        an erase bias arrangement that erases data by moving holes from the channel surface to the first charge storage dielectric layer.

2. The memory of claim 1,
wherein the memory does not undergo erase saturation in response to the control circuit applying the erase bias arrangement with a gate voltage in a range between 20 to 24 volts in magnitude to the memory with programmed data.

3. The memory of claim 1,
wherein the first charge storage dielectric layer has a thickness greater than the second charge storage dielectric layer.

4. The memory of claim 1,
wherein the gate includes polysilicon.

5. The memory of claim 1,
wherein the gate includes polysilicon doped n-type.

6. The memory of claim 1,
wherein the gate includes polysilicon doped p-type.

7. The memory of claim 1,
wherein the multi-layer tunneling structure on the channel surface includes:
    a first tunneling oxide layer;
    the first tunneling dielectric including a first tunneling nitride layer on the first tunneling oxide layer; and
    a second tunneling oxide layer on the first tunneling nitride layer;
and wherein:
    the first charge storage dielectric layer includes a first charge storage nitride layer on the multi-layer tunneling structure;
    the first blocking dielectric layer includes a first blocking oxide layer on the first charge storage nitride layer;
    the second charge storage dielectric layer includes a second charge storage nitride layer on the first blocking dielectric layer; and
    the second blocking dielectric layer includes a second blocking oxide layer on the second charge storage nitride layer.

8. The memory of claim 7,
wherein the erase bias arrangement applied by the control circuit increases electron density in the second charge storage nitride layer.

9. The memory of claim 7,
wherein the first tunneling nitride layer has a thickness of 20 angstroms or less.

10. The memory of claim 7,
wherein the second charge storage nitride layer has a thickness of at least 35 angstroms.

11. The memory of claim 7,
wherein the first charge storage nitride layer has a thickness in a first range of at least 50 angstroms, and the second charge storage nitride layer has a thickness in a second range of 35-50 angstroms.

12. The memory of claim 7,
wherein the memory includes no nitride layers in addition to the first tunneling nitride layer, the first charge storage nitride layer, and the second charge storage nitride layer.

13. A memory comprising an array of memory cells, respective memory cells in the array including:
a gate;
a channel material having a channel surface and a channel valence band edge;
a dielectric stack between the gate and the channel surface, the dielectric stack comprising:
a multi-layer tunneling structure on the channel surface, the multi-layer tunneling structure including at least a first tunneling dielectric layer having a tunneling valence band edge;
a first charge storage dielectric layer on the multi-layer tunneling structure;
a first blocking dielectric layer on the first charge storage dielectric layer;
a second charge storage dielectric layer on the first blocking dielectric layer;
a second blocking dielectric layer on the second charge storage dielectric layer; and
a control circuit applying a selected one of a plurality of bias arrangements including:
an erase bias arrangement in which at least part of the tunneling valence band edge of the first tunneling dielectric layer has a larger band energy than the channel valence band edge at the channel surface,
wherein, without bias applied to the memory, the tunneling valence band edge of the first tunneling dielectric layer has a lower band energy than the channel valence band edge at the channel surface.

14. The memory of claim 13,
wherein the control circuit applying the erase bias arrangement results in increasing electron density in the second charge storage dielectric layer.

15. The memory of claim 13,
wherein the memory does not undergo erase saturation in response to the control circuit applying an erase bias arrangement with a gate voltage in a range between 20 to 24 volts in magnitude to the memory with programmed data.

16. The memory of claim 13,
wherein the first charge storage dielectric layer has a thickness greater than the second charge storage dielectric layer.

17. The memory of claim 13,
wherein the gate includes polysilicon.

18. The memory of claim 13,
wherein the gate includes polysilicon doped n-type.

19. The memory of claim 13,
wherein the gate includes polysilicon doped p-type.

20. A memory comprising an array of memory cells, respective memory cells in the array including:
a gate;
a channel material having a channel surface;
a dielectric stack between the gate and the channel surface, the dielectric stack comprising:
a multi-layer tunneling structure on the channel surface, the multi-layer tunneling structure including at least a first tunneling dielectric layer having a tunneling valence band edge;
a first charge storage dielectric layer on the multi-layer tunneling structure;
a first blocking dielectric layer on the first charge storage dielectric layer;
a second charge storage dielectric layer on the first blocking dielectric layer; and
a second blocking dielectric layer on the second charge storage dielectric layer.

* * * * *